(12) United States Patent
Kuroda

(10) Patent No.: US 6,255,685 B1
(45) Date of Patent: Jul. 3, 2001

(54) SEMICONDUCTOR DEVICE AND METHOD OF MANUFACTURING THE SAME

(75) Inventor: Hideaki Kuroda, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 08/968,456

(22) Filed: Nov. 12, 1997

(30) Foreign Application Priority Data

Nov. 22, 1996 (JP) .................................................... 8-311607
Dec. 29, 1996 (JP) .................................................... 8-358126

(51) Int. Cl.$^7$ .................................................. H01L 23/48
(52) U.S. Cl. ........................................ 257/306; 257/758
(58) Field of Search ..................................... 257/306, 758

(56) References Cited

U.S. PATENT DOCUMENTS 5,539,231 * 7/1996 Suganaga et al. .................... 257/306
5,838,036 * 11/1998 Mori ...................................... 257/306

* cited by examiner

Primary Examiner—Mark V. Prenty
(74) Attorney, Agent, or Firm—Rader, Fishman & Grauer

(57) ABSTRACT

A semiconductor device wherein in formation of the wiring connection, an opening is made up to the middle of the insulating film, a side wall is formed, a burying wiring with the lower portion is arranged, a pad is formed, and a pad is formed in a polyplug contact without a masking step. Further, a conductive material is filled in the hole in the insulating film, a hole is opened in this material, a side wall is formed on the inner wall, a shrunken contact is opened by using this as a mask, and the conductive material is filled.

3 Claims, 51 Drawing Sheets

PRIOR ART

PRIOR ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and, more particularly, to a structure of a contact portion for taking out a conductive layer pattern of a diffusion layer, a wiring layer, etc. located at a deep position of the semiconductor device and a method of manufacturing the same.

2. Description of the Related Arts

A conventional method of manufacturing a so-called capacitor-over-bit-line (COB) type dynamic random access memory (hereinafter referred to as a "DRAM") will be explained with reference to FIG. 1.

As shown in (1) of FIG. 1, a lower layer of the inter-layer insulating film 21 is formed on a semiconductor substrate 10 on which a diffusion layer 12 of a transistor 11 of a DRAM cell is formed. Then, a doped polysilicon film 31 is deposited on this lower layer of the inter-layer insulating film 21 to a thickness of a few hundreds nanometers, then an aperture 32 is formed in the doped polysilicon film 31 above the diffusion layer 12 by lithography and etching using the mask pattern of the connection hole. Then, a polysilicon side wall 33 is formed on the side wall of the opening 32 by an ordinary side wall forming technique. Subsequently, a first connection hole 22 is formed in the lower layer of the inter-layer insulating film 21 by anisotropic etching using the doped polysilicon film 31 and the polysilicon side wall 32 as a mask.

Next, the doped polysilicon film 31 and the polysilicon side wall 32 are removed, then, as shown in (2) of FIG. 1, polysilicon is filled in the first connection hole 22 to form a plug 23 acting as the contact with the diffusion layer 12.

Next, a conductive layer is formed on the lower layer inter-layer insulating film 21 and the conductive layer is patterned by lithography and etching, thereby to form a pad 24 connected to the first plug 23 and having a larger diameter than that of the first connection hole 22.

Subsequently, as shown in (3) of FIG. 1, an upper layer inter-layer insulating film 25 covering the pad 24 is formed on the lower layer of the inter-layer insulating film 21. Then, the same method as that for forming the first connection hole 22 is used to form a second connection hole 26 in the upper layer of the inter-layer insulating film on the pad 24. Next, this second connection hole 26 is filled and, at the same time, a conductive portion 27 is formed on the upper layer of the inter-layer insulating film 25. Next, the conductive portion 27 is patterned by lithography and etching. Then, a storage node contact 28 is formed by the conductive portion 27 inside the second connection hole 26. Part of the storage node 29 is formed by the conductive portion on the upper layer of the inter-layer insulating film 25.

Note that, though not illustrated, it is also possible to form the upper layer of the inter-layer insulating film 25 after forming the pad 24 so as to eliminate the step difference due to the thickness of the pad 24 and then perform the step of forming the insulating film and the step for flattening the insulating film.

Next, a plan view of the COP type DRAM cell will be shown in FIG. 2. Gate electrodes 51a to 51d of selection transistors 56a to 56g are arranged in parallel. Bit lines 53a to 53c connected to the diffusion layers of these selection transistors 56a to 56g by bit contacts 52 are arranged orthogonal to the gate electrodes 51a to 51d. The diffusion layers of the selection transistors 56a to 56g are provided with node contacts 54a to 54d connected to (not illustrated) capacitors. A sectional view taken along a line A–A' of the figure is given in FIG. 3. and a sectional view taken along a line B–B' of the figure is given in FIG. 17. As seen from these sectional views, the node contacts 54a to 54d are "middle takeout contacts" using "pad-equipped" plugs. This DRAM is a COB type in which a bit line is a buried in the inter-layer insulating film between a selection transistor STr and a capacitor CAP. Further, the sectional view of FIG. 17 shows also a DRAM cell portion and a partial peripheral circuit.

Next, a simple explanation will be made of the method of manufacture of the COB type DRAM cell shown in FIG. 17 of a second related art by referring to FIG. 4 to FIG. 17. First, as shown in FIG. 4, an element isolation oxide film 120 is formed on a P type silicon substrate in which an N well and a P well are formed so to perform element isolation, then a (not illustrated) gate insulating film is formed by a thermal oxidation method, polysilicon 131a and tungsten silicide 131b are laminated, then patterning is carried out to form a gate electrode 131. Ion implantation is carried out by using this gate electrode 131 as a mask to form a lightly doped drain (LDD) 101.

Next, as shown in FIG. 5, a thin silicon oxide film 152 is formed for an etching stopper on the entire surface. Then, polysilicon is deposited, then etched back to form a side wall 132 constituted by polysilicon on a side wall of the gate electrode. Then, ion implantation is carried out by using this side wall 132 as a mask to form a source and drain region 112.

The side wall 132 is removed, then, as shown in FIG. 6, a silicon nitride film 153 is formed for an etching stopper on the entire surface by low pressure chemical vapor deposition (CVD). After this, a natural silicate glass (NSG) film 204 is formed by $O_3$-tetraethoxysilane (TEOS), then a boro-phospho-silicate-glass (BPSG) film 152 is formed by $O_3$-TEOS.

Next, as shown in FIG. 7, the BPSG 155 is made to flow to flatten it. Next, polysilicon 133 is deposited, then resist patterning R11 for making apertures for the bit contacts and node contacts.

Next, as shown in FIG. 8, the polysilicon film 133, the BPSG film 155, and the NSG film 154 are etched and the etching is stopped midway to form a preparatory contact hole, then polysilicon is deposited, then etched back so as to form a side wall 134 constituted by polysilicon on the side wall of this preparatory contact hole. Next, etching is performed by using this side wall 134 and the polysilicon film 133 as a mask so as to open a contact hole reaching the substrate and open a shrunken bit line contact hole BCH and a node contact hole NCH.

After opening the contact holes, as shown in FIG. 9, a polysilicon film 135 is deposited to fill the contact holes BCH and NCH.

Next, as shown in FIG. 10, the polysilicon films 135 and 133 and the side wall 134 are etched back to make the surface of the polysilicon film 135 (including also the side wall 134) lower than the preparatory contact hole. By this, in each contact, a so-called pad-equipped polyplug 136 for middle takeout is formed.

Next, as shown in FIG. 11, the BPSG film 155 is etched to level its surface with that of the polyplug 136, then a silicon oxide film 157 is formed by LP-TEOS and a silicon nitride film 158 by a low pressure CVD process on the entire surface. A resist R12 is formed and patterned for the contact openings for forming bit lines.

Next, as shown in FIG. 12, the silicon nitride film 158 and the silicon oxide film 159 are etched by using the resist film R12 as a mask to expose the plug surface of the bit line contact. The resist film R12 is then removed, then a polysilicon film 138 for forming the bit lines and a tungsten suicide 139 are deposited, the resist pattern for the bit lines is formed, and the etching is carried out using this as a mask to pattern the bit lines BL. Next, a silicon oxide film 160 is thinly formed by LP-TEOS and a silicon nitride film 161 by the low pressure CVD process, then an NSG film 162 and BPSG 163 are deposited and the BPSG 163 is made to flow to flatten it.

Next, as shown in FIG. 13, the surface is shaved by etching etc. to flatten it, then a silicon nitride film 164 is deposited acting as an etching stopper at the time of formation of the capacitor. A polysilicon film 140 is deposited on this, then the resist R13 is formed and patterned for opening contacts for the node contact plugs.

Next, as shown in FIG. 14, this is etched using the resist R13 as a mark to form a preparatory contact hole in the polysilicon film 140. Next, polysilicon is deposited, then is etched back to form a side wall 141 constituted by polysilicon on the side wall of the preparatory contact hole, then the silicon nitride film 164, BPSG film 163, NSG film 162, silicon nitride film 158, and silicon oxide film 157 are successively etched by using the side wall 141 and the polysilicon film 140 as the mask to open a shrunken node contact hole reaching the pad, then a polysilicon 312 is deposited to fill the contact hole.

Next, as shown in FIG. 15, the polysilicon film 142, the polysilicon film 140, and the side wall 141 are etched back to remove the polysilicon film while leaving the polyplug 144, then a polysilicon film 145 is deposited for the node electrode. On this, the silicon oxide film 165 for forming the cylinder type capacitor is deposited thickly and a resist film R14 formed with a pattern for the bottom wall electrode of the capacitor.

Next, as shown in FIG. 16, anisotropic etching is carried out by using the resist film R14 as a mask to pattern the silicon oxide film 165 and the polysilicon film 145, then the resist film R14 is removed. Next, a polysilicon film is deposited, then etched back to form a side wall 146 constituted by polysilicon at the side portion of the silicon oxide film. A cylinder type node electrode is formed by removing the silicon oxide 165 by wet etching. Next, an ONO film (structure in which silicon oxide is sandwiched by silicon nitride films) 106 is formed on the node electrode, then a polysilicon film 147 acting as a plate electrode is deposited, then the plate electrode 147 and the silicon nitride film 164 are patterned to form the plate electrode and form a capacitor CAP is formed. By this, a DRAM is completed.

Next, as shown in FIG. 17, an inter-layer insulating film 167 is deposited to bury the capacitor and is flattened, then a contact hole is opened for connecting the plate electrode, the peripheral circuit, and the wiring circuit. Then, a Ti/TiN film 148 is formed as a closely adhered layer covering the inner wall of the contact hole, then tungsten is deposited and then etched back to form a blanket tungsten 149. After this, a wiring layer 140 is patterned to obtain a COB type DRAM having a cross-sectional structure shown in FIG. 17.

In a COB type DRAM cell manufactured by the process of the related art, there are three wiring layers for the gate electrodes, bit lines, and capacitors and three inter-layer insulating films, therefore the height of the memory cell portion becomes about 1 $\mu$m, the inter-layer insulating film of the peripheral circuit becomes thick, and the aspect ratio of the contacts of the peripheral circuit becomes large, therefore there is a problem in that the diameter of the contacts of the peripheral circuits cannot be made small and the degree of integration cannot be raised.

SUMMARY OF THE INVENTION

A first object of the present invention is to form a plug having a pad without greatly increasing the number of steps in a process for forming a wiring layer of a semiconductor device.

A second object of the present invention is to provide a semiconductor device such as a COB type DRAM capable of making the inter-layer insulating film in the peripheral circuit portion of the semiconductor thin and making the contact holes small and a method of manufacturing the same.

To achieve the first object, in the semiconductor device, a conductive layer pattern is formed on a substrate and an inter-layer insulating film covering this conductive layer pattern is formed on the substrate. A first connection hole is formed in an upper layer of the inter-layer insulating film above the conductive layer pattern. Further, in this inter-layer insulating film, a second connection hole which reaches the conductive layer pattern from the bottom portion of the first connection hole and has a smaller diameter than that of the first connection hole is formed. Further, a conductive plug is formed with the interior of the first connection hole and the second connection hole filled.

More preferably, the upper surface of the conductive plug is formed to almost the same height as the surface height of the inter-layer insulating film.

In the semiconductor device, the diameter of the connection hole formed in the upper portion is made larger than the second connection hole, and the conductive plug is formed in the first and second connection holes so as to fill them. Therefore the diameter of the upper portion of this plug becomes larger than the diameter of the second connection hole.

Accordingly, the part having a large diameter of the plug, that is, the part of the plug formed in the second connection hole plays the role of a pad.

Further, since the conductive plug is formed so as to fill the first and second connection holes, if the upper surface of this plug is formed to almost the same height as the surface height of the inter-layer insulating film, the surface of the inter-layer insulating film on which the plug is formed is made almost flat.

The method of manufacture of the semiconductor device comprises forming the inter-layer insulating film on the substrate in a state where the conductive layer pattern formed on the substrate is covered. Then, the first connection hole is formed in the upper layer of the inter-layer insulating film above the conductive layer pattern, and then the side wall is formed on the side wall of the first connection hole. Then, a second connection hole which reaches the conductive layer pattern from the bottom portion of the first connection hole and has a smaller diameter than that of the first connection hole is formed on the inter-layer insulating film by self-alignment utilizing the side wall as the mask. Next, the conductive plug is filled in the first connection hole and the second connection hole.

In the method of manufacture of the semiconductor device, after the first connection hole is formed in the upper layer of the inter-layer insulating film above the conductive layer pattern, the side wall is formed on the side wall of this first connection hole, and further the second connection hole is formed in the inter-layer insulating film by self-alignment in a state where it is communicated with the conductive layer pattern from the bottom portion of the first connection hole and where the diameter is smaller than that of the first connection hole by utilizing the side wall as a mask. Therefore the second connection hole having a smaller diameter than that of the first connection hole is formed by only one masking step. The conductive plug is filled in the first connection hole and the second connection hole. Therefore the diameter of the upper portion of the plug becomes larger than the diameter of the second connection hole.

Accordingly, the part playing the role of a pad is formed in the part of the plug having a large diameter, that is, the part formed in the second connection hole.

In order to achieve the second object, the semiconductor device of the present invention has a burying wiring layer filling wiring use grooves dug in the inter-layer insulating film, a conductive plug which penetrates through the inter-layer insulating film and connects the burying wiring layer and the connection region beneath the same, and an inter-layer insulating film covering the wiring layer.

Further, the method of manufacture of the semiconductor device of the present invention comprises a step of forming a wiring use groove in an inter-layer insulating film; a step of filling the wiring use groove by a conductive material; a step of forming a preparatory contact hole in the conductive material filled the wiring use groove; a step of forming a side wall constituted by a conductive material on an inner wall of the preparatory contact hole; a step of opening a contact hole in the inter-layer insulating film by using the side wall as a mask; a step of filling the contact hole by the conductive material; a step of flattening the inter-layer insulating film and the conductive material for filling the wiring use groove and forming the burying wiring layer; and a step of forming an inter-layer insulating film for covering the burying wiring layer.

The semiconductor device of the present invention has a burying wiring layer constituted by filling the wiring use grooves dug in the inter-layer insulating film by a conductive material. For this reason, in comparison with the structure of the related art in which the wiring layer is formed on the inter-layer insulating film and further the wiring layer thereof is covered by the inter-layer insulating film, the layer structure can be omitted by an amount of the thickness of the wiring layer and the thickness of the insulating film covering the wiring layer, thus the thickness of the semiconductor device can be reduced. If this burying wiring layer is applied to the bit lines of a COB type DRAM, a structure like that of the related art where the thickness of the bit lines disappears is exhibited. As a result, it is possible to reduce the height of the memory cell portion, which had been about 1 μm in the related art, by an amount of for example about 300 to 400 nm. The thickness of the inter-layer insulating film of the peripheral circuit portion can be made thinner by that amount, the aspect ratio of the peripheral circuit portion becomes small, the contact diameter can be made smaller, and the degree of integration can be improved.

Further, the method of manufacture of the semiconductor device of the present invention comprises forming a plug connecting the burying wiring layer and the connection region beneath the same, in which a wiring use groove is formed in an inter-layer insulating film, this is filled by a conductive material, a preparatory contact hole is formed in the conductive material, a conductive side wall is formed in the preparatory contact hole, and a shrunken contact hole is formed by using the side wall as a mask. Accordingly, the contact can be reliably formed and, at the same time, the height of the semiconductor can be reduced by the burying wiring layer and the diameter of the contact can be made smaller.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Figure 1:
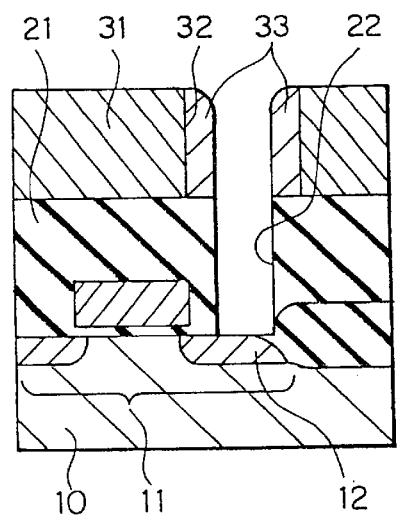
FIGS. 1(1)–(3) are process diagrams of the manufacture of a COB type DRAM cell.
Figure 1:
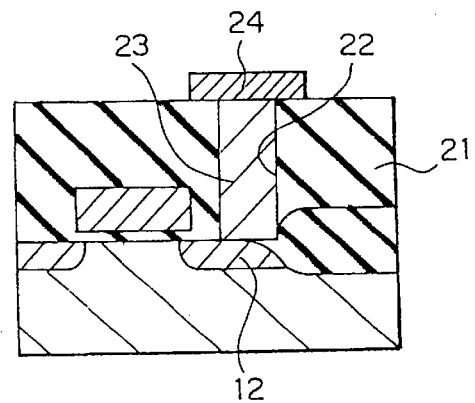
Figure 1:
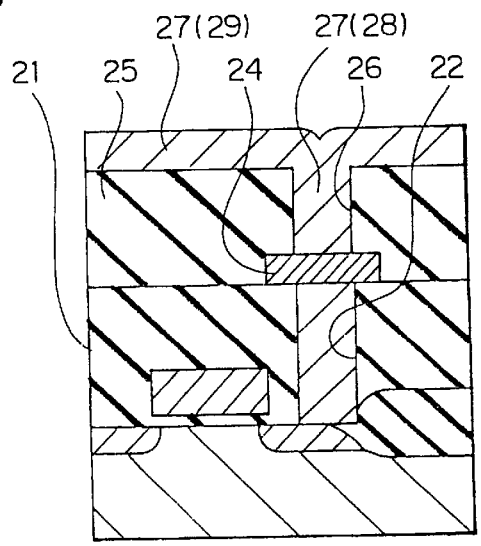

Below, a detailed explanation will be made of embodiments of the present invention by referring to the drawings.

Figure 18:
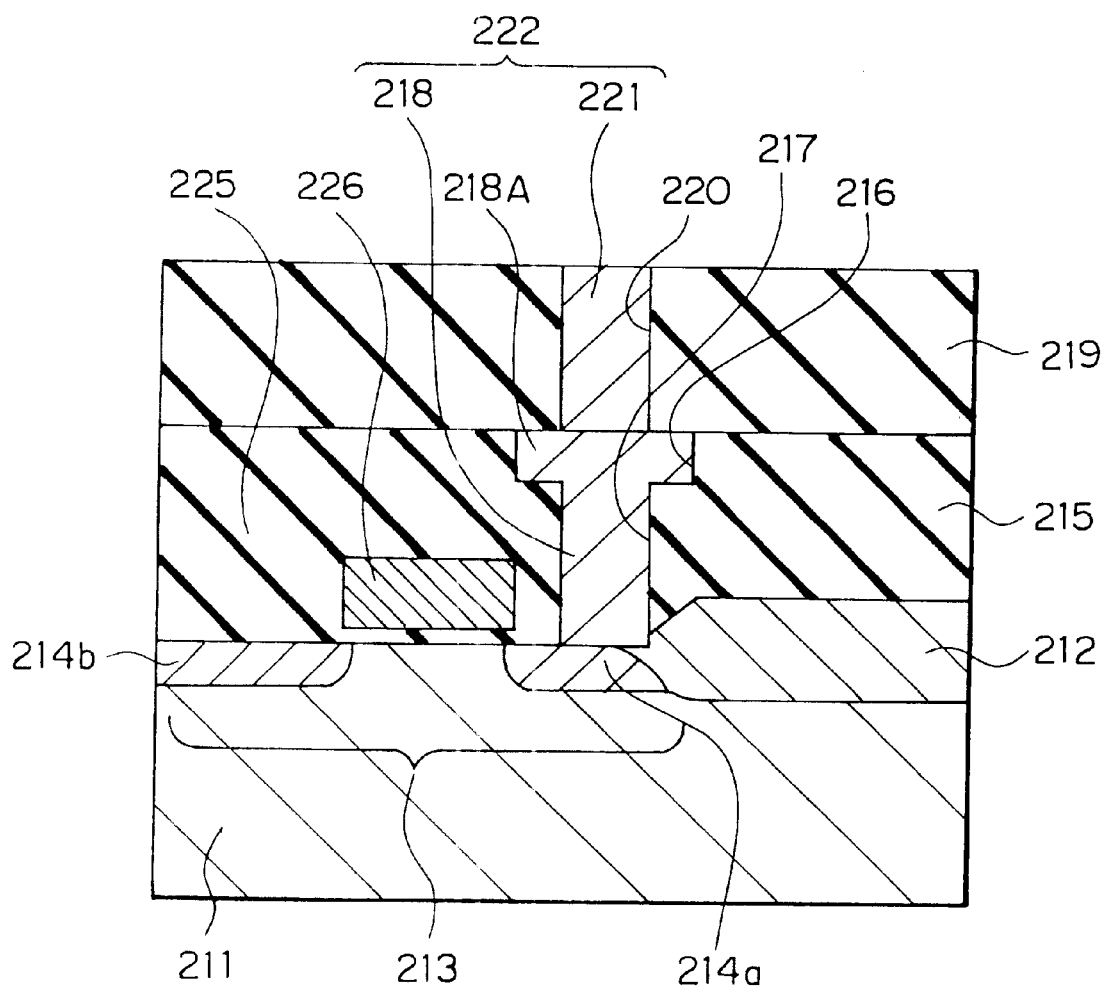
FIG. 18 is a schematic sectional view of the configuration of a semiconductor device according to a first embodiment of the present invention.

A first embodiment of the present invention will be explained with reference to FIG. 18 showing a schematic sectional view of the configuration.

As shown in FIG. 18, an MIS type transistor 213 electrically isolated from other elements (not shown) by an element separation film 212 is formed on a substrate 211 made of a semiconductor. Conductive layer patterns 214a and 214b made of a diffusion layer constituting the source and drain region of this MIS type transistor 213 are formed on one part of the surface layer of the substrate 211. Explaining this in further detail, a gate electrode 226 is formed on the substrate 211 via a gate insulating film 225, the conductive layer pattern 214a is formed on the substrate 211 on one side of this gate electrode 226 (left side in the figure), and the conductive layer pattern 214b is formed on the substrate 211 on the other side of the gate electrode 226 (right side in the figure).

The inter-layer insulating film (first inter-layer insulating film) 215 is formed on the substrate 211 in a state covering the transistor 213.

A first connection hole 216 is formed in the upper layer of the first inter-layer insulating film 215 above the conductive layer pattern 214a. Further, in the first inter-layer insulating film 215, a second connection hole 217 having a smaller diameter than that of the first connection hole 216 is formed in a state communicated with the conductive layer pattern 214a from substantially the center of the bottom portion of this first connection hole 216.

A plug 218 having conductivity is formed inside the first connection hole 216 and the second connection hole 217 in a filled state.

Accordingly, the diameter of the upper portion of the plug 218, that is, the part of the plug formed in the first connection hole 216 becomes larger than the diameter of the part of the plug formed in the second connection hole 217. The part of the plug 218 given a large diameter forms a pad 218A.

Then, preferably, the upper surface of this plug 218 is formed to substantially the same height as that of the surface of the first inter-layer insulating film 215.

On the first inter-layer insulating film 215, a second inter-layer insulating film 219 is formed in a state covering the plug 218. On this second inter-layer insulating film 219, a third connection hole 220 reaching the upper surface side of the plug 218 is formed. This third connection hole 220 has substantially the same diameter as that of for example the second connection hole 217. Then, the conductive portion 221 to be connected to the plug 218 is formed inside the third connection hole 220.

Namely, an electrode 222 serving as the takeout portion of the conductive layer pattern 214a is formed by the plug 218 filled in the first and second connection holes 216 and 217 and the conductive portion 221 filled in the third connection hole 220.

In the semiconductor device, the diameter of the first connection hole 216 formed at the upper portion is formed larger than that of the second connection hole 217, then the conductive plug 218 is formed in the first and second connection holes 216 and 217 in a state filling them. Therefore the diameter of the upper portion of this plug 218 becomes larger than the diameter of the part of the plug 218 filled in the second connection hole 217.

Accordingly, in the structure wherein the second inter-layer insulating film 219 is formed on the first inter-layer insulating film 215 and the third connection hole 220 having an equivalent diameter to that of the second connection hole 217 is formed in the second inter-layer insulating film 219 by a multiple layer wiring structure, even if this third connection hole 220 is formed at a position deviated by about the diameter of the second connection hole 217 due to deviation of mask alignment in the lithography step, the conductive portion 221 formed inside the third connection hole 220 is connected to the pad 218A of the plug 218. For this reason, the conductive portion 221 will be connected to the conductive layer pattern 214a via the plug 218.

Further, in a configuration wherein the conductive plug 218 is formed in a state filling the first and second connection holes 216 and 217 and the upper surface of this plug 218 is formed to almost the same height as the surface of the first inter-layer insulating film 215 where the film is formed on the surface of the first inter-layer insulating film 215, the coverage of that film becomes good and, at the same time, no step difference is not formed in the lithography step after this, therefore the patterning precision is enhanced.

Further, in the configuration shown by FIG. 18, it is possible to form the conductive layer pattern 212 as the storage node diffusion layer of a DRAM, form the plug 218 as the storage node contact portion, and form the conductive portion 221 as the storage node.

Also, by this configuration, it is possible to obtain a margin for matching the storage node with the storage node contact portion in the same way as that explained above.

Next, a method of manufacture of the semiconductor device according to an embodiment of the present invention will be explained with reference to the process diagrams of FIG. 19 to FIG. 23. In FIG. 19 to FIG. 23, the same symbols are given to same constituent parts as those explained referring to FIG. 18.

Figure 19:
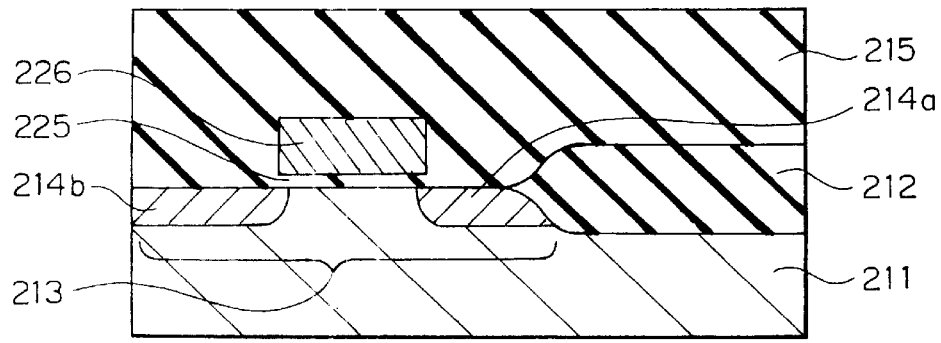
FIG. 19 to FIG. 27 are process diagrams of a method of manufacture of an embodiment according to the present invention.

As shown in FIG. 19, an MIS type transistor 213 electrically isolated by the element separation film 212 from other elements (not shown) is formed on a substrate 211 made of a semiconductor. Conductive layer patterns 214a and 214b made of a diffusion layer constituting the source and drain region of this MIS type transistor 213 are formed on part of the surface layer of the substrate 211. Explaining this in further detail, the gate electrode 226 of the MIS type transistor 213 is formed on the substrate 211 via the gate insulating film 225, the conductive layer pattern 214a is formed on the substrate 211 on one side of this gate electrode 226 (left side in the figure), and the conductive layer pattern 214b is formed on the substrate 211 on the other side of the gate electrode 226 (right side in the figure).

A first inter-layer insulating film 215 covering the transistor 213 is formed on such a semiconductor device 211. This first inter-layer insulating film 215 is formed by a silicon oxide-based material by for example CVD.

Figure 20:
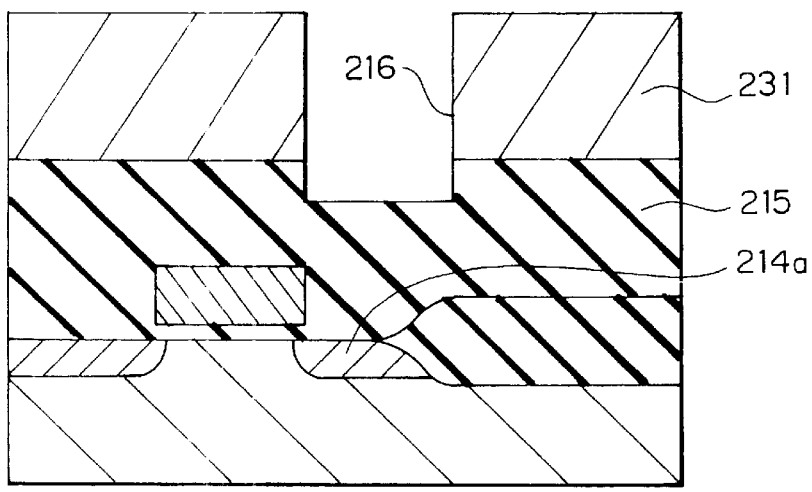

Next, as shown in FIG. 20, a first film 231 is formed on the first inter-layer insulating film 215. The first film 231 is formed by doped polysilicon by for example the CVD process.

Then, after forming a resist pattern (not shown) in which a window is provided above the conductive layer pattern 214 on the first film 231 by lithography, etching is performed using this resist pattern as a mask to form a first connection hole 216 communicated with the first film 231 and the upper layer of the first inter-layer insulating film 215.

Figure 21:
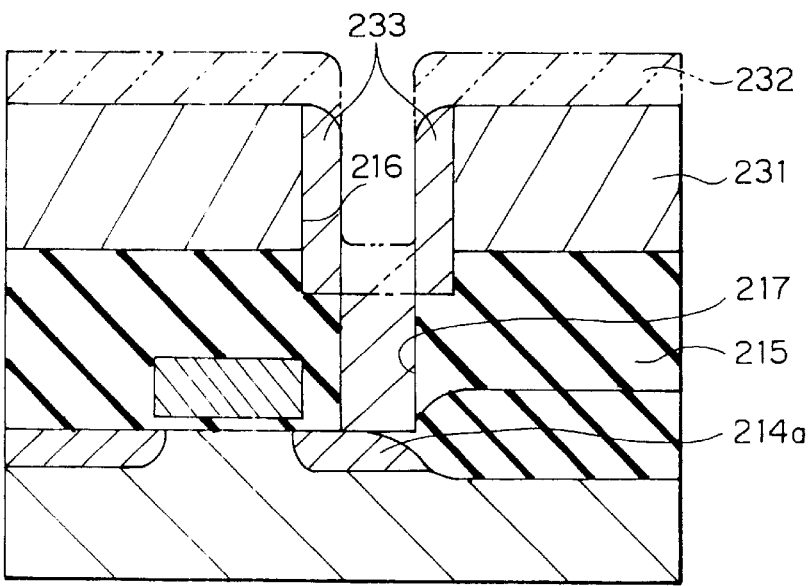

Then, as shown in FIG. 21, a side wall forming film 232 is formed on the inner wall of the first connection hole 216 and the first film 231. This side wall forming film 232 is formed by, for example, a doped polysilicon. Subsequently, the part of the side wall forming film 232 indicated by a two dotted chain line is etched back to form the side wall 233 on the side wall of the first connection hole 216 by the side wall forming film 232.

Next, etching is performed using the first film 231 and the side wall 233 as a mask to form the second connection hole 217 reaching the conductive layer pattern 214a from the bottom portion of the first connection hole 216 and having a smaller diameter than that of the first connection hole 216 in the first inter-layer insulating film 215.

Figure 22:
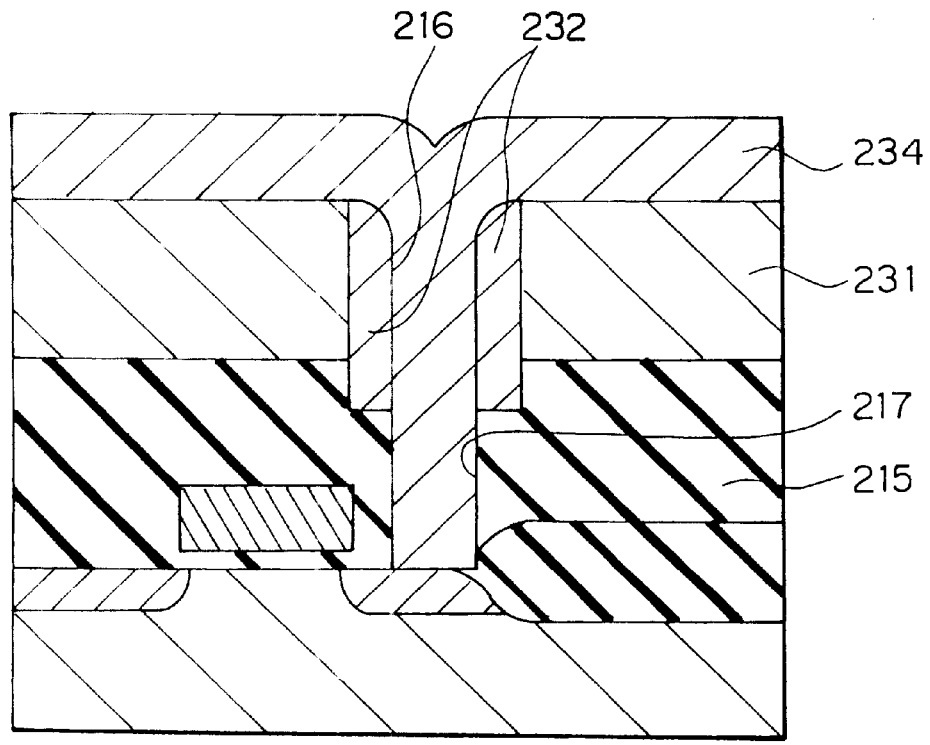

Next, as shown in FIG. 22, a plug forming film 234 is formed by a doped polysilicon by for example the CVD process in a state filling the internal portions of the first connection hole 216 and the second connection hole 217.

Figure 23:
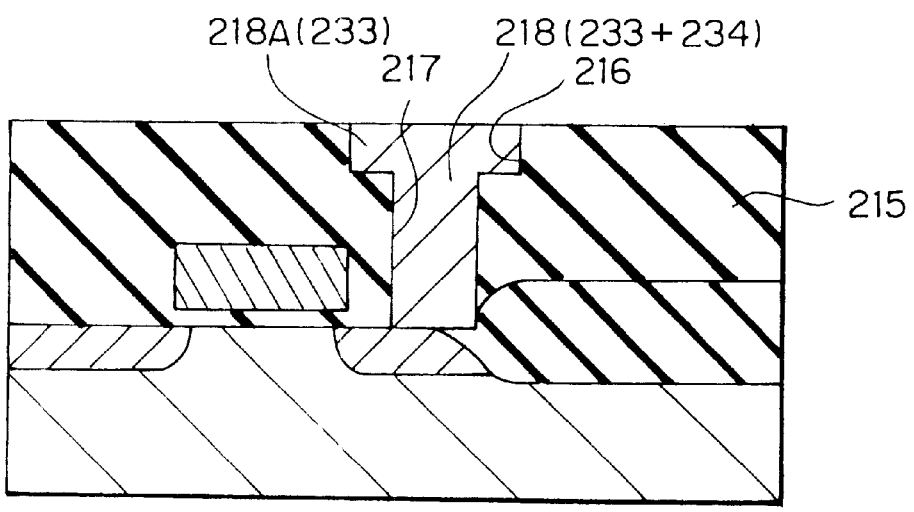

Next, by etch back or chemical mechanical polishing (CMP), the first film 231, the side wall 233, and the plug forming film 234 located at a higher position than the height of the surface of the first inter-layer insulating film 215 are removed. As a result, as shown in FIG. 23, the conductive plug 218 is formed by the side wall 233 of the part filled in the first connection hole 216 and the second connection hole 217 and the plug forming film 34. The side wall 233 becomes the pad 218A of the plug 218.

Note that, in the etch back or CMP, the surface layer of the first inter-layer insulating film 215 is sometimes also removed.

As a result, the upper surface of the plug 218 is formed to substantially the same height to that of the surface of the first inter-layer insulating film 215.

Next, an explanation will be made of a third embodiment of the present invention.

Further, in the method of manufacture explained by FIG. 18 to FIG. 23, after the first film 231 is formed on the first inter-layer insulating film 215, a second film (not shown) that becomes the etching mask when forming the side wall 233 is formed on this first film 231. For example, the second film is formed by a silicon oxide-based film. Then, when forming the first connection hole 216 in the first film 231 and the upper layer of the inter-layer insulating film 216 above the conductive layer pattern 214a, it is also possible to form the first connection hole 216 in a state penetrating through also the second film.

By forming the second film in this way, it becomes possible to form the first film 231 thin and to shorten the time taken for etching back the first film 231.

Figure 24:
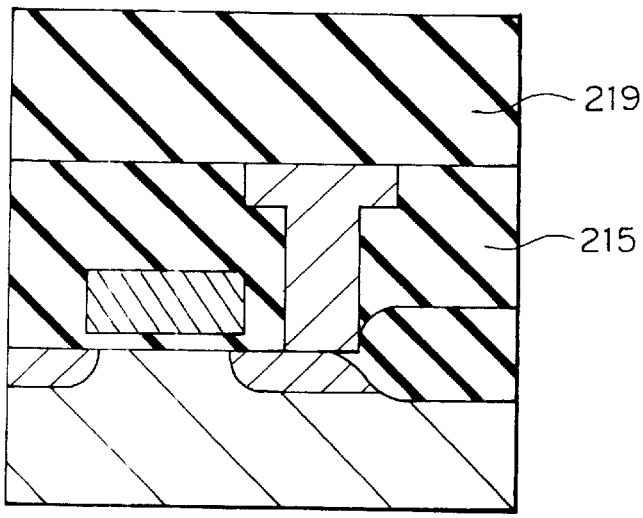

Further, as shown in FIG. 24, as the upper layer insulating film, a second inter-layer insulating film 219 is formed on the first inter-layer insulating film 215. This second inter-layer insulating film 219 is formed by a silicon oxide-based film by for example the CVD process.

Figure 25:
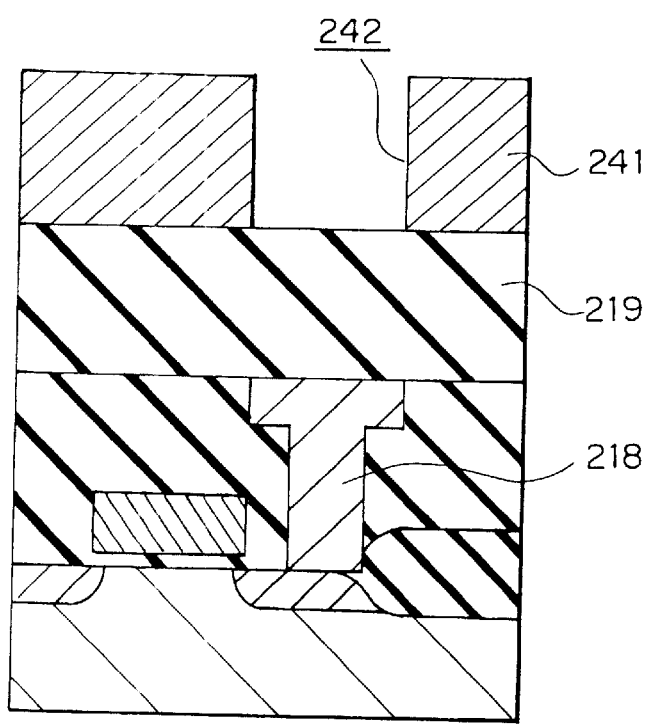

Then, as shown in FIG. 25, a third film 24i is formed on the second inter-layer insulating film 219. The third film 241 is formed by a doped polysilicon by for example the CVD process.

Then, a resist pattern (not shown) in which a window is provided above the plug 218 is formed on the third film 241 by lithography and etching performed using this resist pattern as a mask to form an aperture 242 in a state penetrating through the third film 241.

Figure 26:
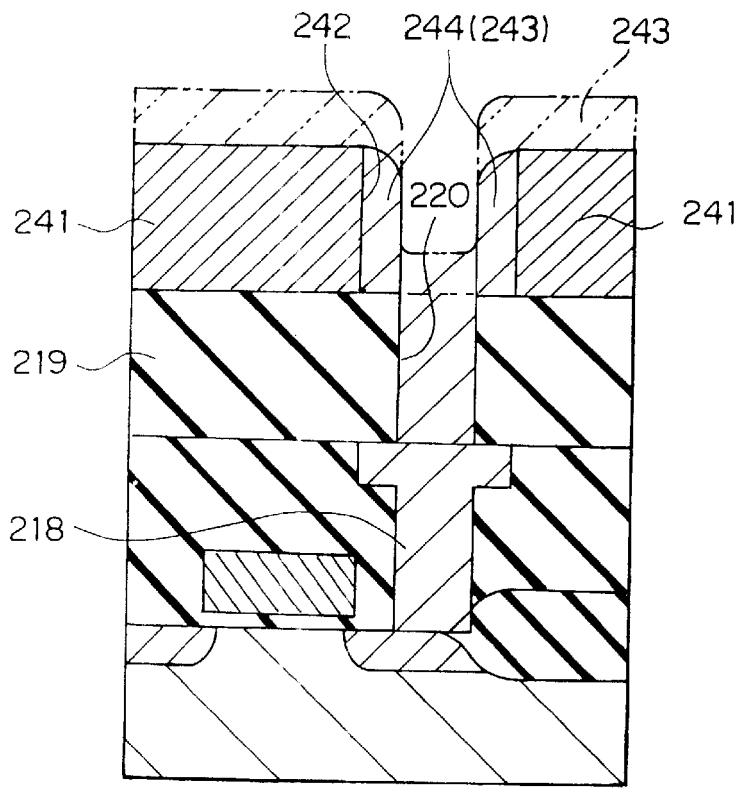

Next, as shown in FIG. 26, a side wall forming film 243 is formed on the inner wall of the aperture 242 and the third film 241. This side wall forming film 243 is formed by, for example, a doped polysilicon. Subsequently, by etch back the part of the side wall forming film 243 indicated by the two dotted chain line, a side wall 244 is formed on the side wall of the aperture 242 by this side wall forming film 243.

Next, by etching using the third film 241 and the side wall 244 as a mask, a third connection hole 220 communicated with the plug 218 from the bottom portion of the aperture 242 is formed in the second inter-layer insulating film 19.

Then, by etch back or CMP, the third film 241 and the side wall 244 in the upper portion are removed from the surface of the second inter-layer insulating film 219. At this time, the surface layer of the second inter-layer insulating film 219 is also removed.

Figure 27:
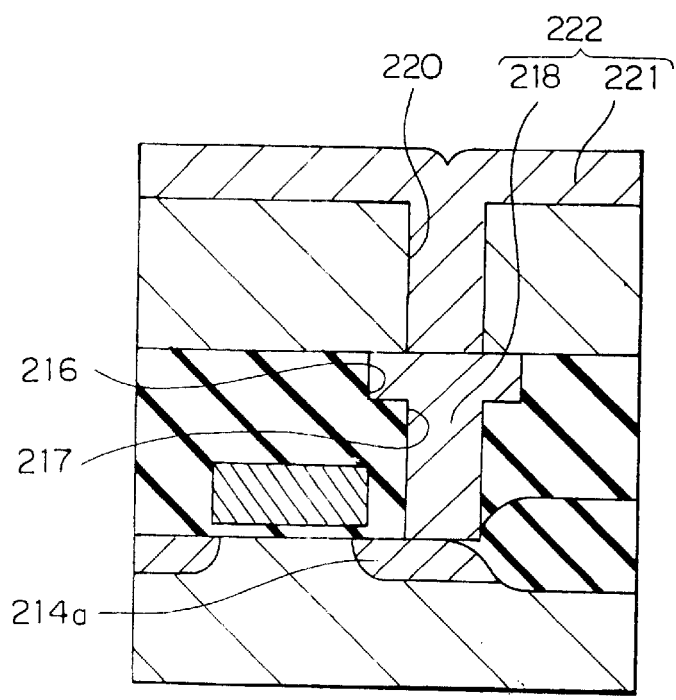

Next, the resist pattern is removed. Then, as shown in FIG. 27, a conductive film is formed by a doped polysilicon by for example the CVD process in a state filling the internal portion of the third connection hole 220. Then, the conductive film is patterned by the usual lithography and etch back to form the conductive portion 221.

Accordingly, the electrode 222 acting as the takeout portion of the conductive layer pattern 214a is formed by the plug 218 filled in the first and second connection holes 216 and 217 and the conductive portion 221 filled in the third connection hole 220.

In the method of manufacture, the plug forming film constituting the plug 218 may be also polysilicon or a metal, metal silicide, or the like.

In the method of manufacture of the semiconductor device, the first connection hole 216 is formed in the upper layer of the first inter-layer insulating film 215 above the conductive layer pattern 214a, and further the second connection hole 217 is formed in the first inter-layer insulating film 215 in a state where it is communicated with the conductive layer pattern 214a from the bottom portion of the first connection hole 216 and has a smaller diameter than that of the first connection hole 216. Therefore the first connection hole 216 formed in the upper portion is formed to have a larger diameter than that of the second connection hole 217. Then, since the conductive plug 218 is formed so as to be filled in the first and second connection holes 216 and 217, the diameter of the upper portion of the plug 218 becomes larger than the diameter of the second connection hole 217. The part having a diameter larger than the diameter of the second connection hole 217 becomes the pad 218A.

Accordingly, where the second inter-layer insulating film 219 is formed on the first inter-layer insulating film 215 and the third connection hole 220 having an equivalent diameter to that of the second connection hole 217 is formed in the second inter-layer insulating film 219, even if the third connection hole 220 forming position is deviated by an amount of about the diameter of the second connection hole 217 due to deviation of mask alignment, it is connected to the pad 218A of the plug 218.

Further, the first film 231, the side wall 233, and the plug forming film 234 in the upper portion are removed from the surface of the first inter-layer insulating film 215 by etch back or CMP, and the plug 218 is formed in the first and second connection holes 216 and 217. Therefore the upper surface of this plug 218 is formed to almost the same height as that of the surface of the first inter-layer insulating film 215. For this reason, the coverage of the second inter-layer insulating film 219 after this becomes good and, at the same time, although not illustrated, when forming the pattern on the second inter-layer insulating film 219, the lithography step can be carried out on the flat surface, therefore the patterning precision is enhanced.

In this way, to form the pad 218A, it is not necessary to additionally perform the film forming step, lithography step, etching step, etc. Further, the upper surface side of the plug 218 including the pad 218A is flattened without adding the film forming step of the of insulating film and the flattening step of the insulating film. For this reason, there is no great increase of the number of steps and the process load is small, therefore the increase of the manufacturing cost is small.

Further, even in a configuration where the aspect ratio of the first, second, and third connection holes 216, 217, and 220 becomes about 10, the first, second, and third connection holes 216, 217, and 220 are formed by holes having an aspect ratio of about 3 to 4. For this reason, in the etching when forming the connection holes, the microloading effect is no longer felt much at all. Further, voids are no longer generated when filling the connection holes.

Next, an example of the method of manufacture of a DRAM cell according to a second embodiment of the present invention will be explained with reference to the process diagrams of FIG. 28 to FIG. 34.

Specifically, a method of forming a storage node contact portion of a dynamic random access memory by the plug and conductive portion will be mainly shown.

Figure 28:
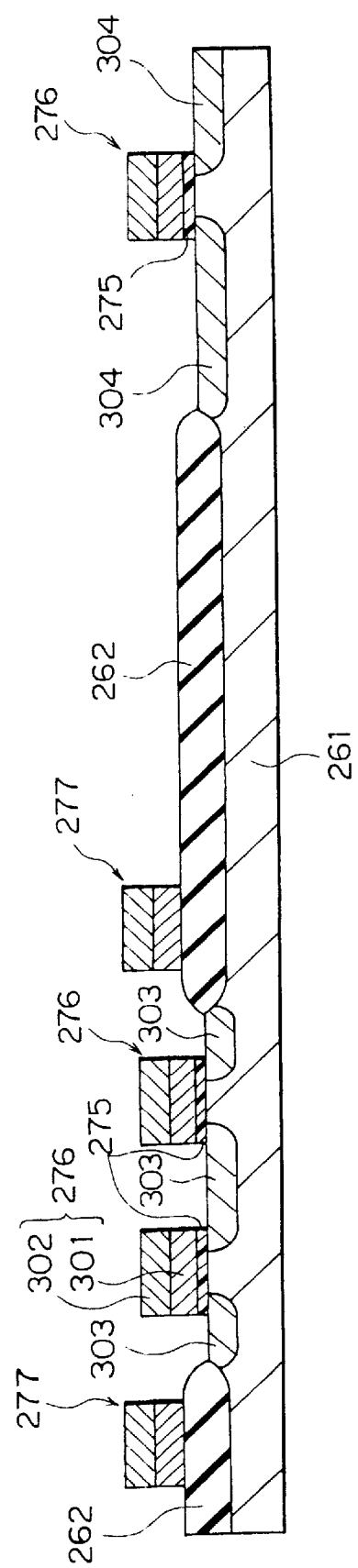
FIG. 28 to FIG. 34 are process diagrams of the method of manufacture of a DRAM cell according to a second embodiment of the present invention.

As shown in FIG. 28, an element isolation region 262 is formed in the upper layer of the substrate 261 made of a semiconductor. This element isolation region 262 is formed by for example a local oxidation process, for example the local oxidation of silicone (LOCOS) process. Further, a gate insulating film 25 is formed in an active region. This gate insulating film 275 is made of silicon oxide and is formed by for example an ordinary thermal oxidation method.

Then, a doped polysilicon film 301 and a tungsten silicide (WSi$_2$) film 302 are formed on the substrate 261 to a thickness of a few hundreds nanometers by for example the CVD process. Then, a resist pattern (not shown) acting as the mask for forming the gate electrode by lithography is formed on the tungsten silicide film 302, then is etched by using the resist pattern as a mask to perform the patterning for the doped polysilicon film 301 and the tungsten silicide film 302 and form the gate electrode 276. Note that, a word line 277 to be connected to the gate electrode 276 is formed on the element isolation film 262 at the same time as the process of forming the gate electrode 276. Next, the resist pattern is removed.

Then, a resist pattern (not shown) in which a window is opened in an N channel region by lithography is formed on the tungsten silicide film 302 and an N type impurity is ion-implanted into the upper layer of the substrate 261 by using the resist pattern, the gate electrode 276, and the element isolation film 262 as a mask to form a LDD 303 of the N channel transistor. As the ion implantation conditions, for example, arsenic (As) or phosphorus (P) was used for the N type impurity, the implantation energy was set to several tens of keV, and the dosage was set to $1 \times 10^{12}/cm^2$ to $1 \times 10^{14}/cm^2$. Next, the resist pattern is removed.

Then, a resist pattern (not illustrated) in which a window is opened in a P channel region by lithography is formed, then an N type impurity is ion-implanted into the substrate 261 by using the resist pattern (not illustrated), the gate electrode 276, and the element isolation film 262 as a mask to form an LDD 304 of a P channel transistor. As the ion implantation conditions, for example, boron difluoride ($BF_2$) was used for the P type impurity, the implantation energy was set to several tens of keV, and dosage was set to $1 \times 10^{12}/cm^2$ to $1 \times 10^{14}/cm^2$. Next, the resist pattern is removed.

Figure 29:
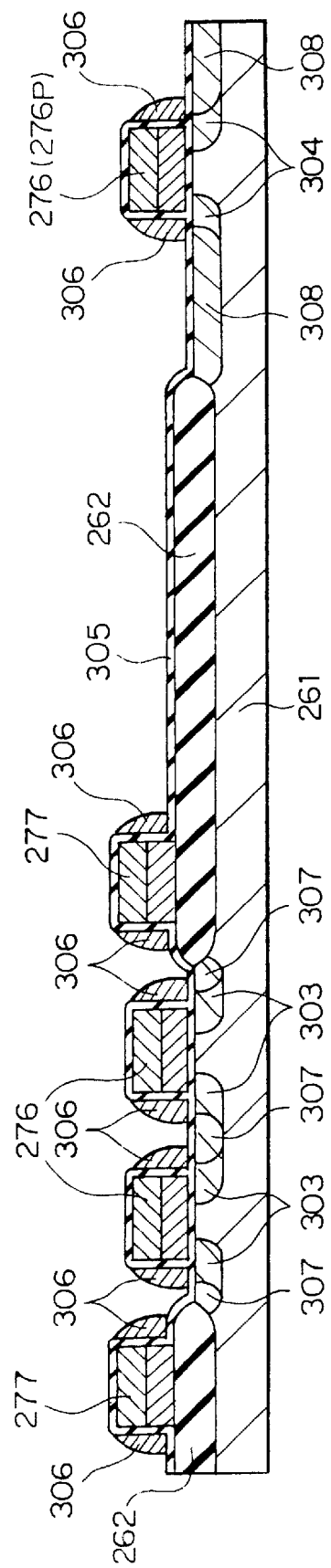

Then, as shown in FIG. 29, a silicon oxide film 305 is formed on the entire surface on the substrate 261 on the side forming the gate electrode 276 to a thickness of several tens of nanometers by for example the CVD process. Further, a polysilicon film is formed to a thickness of a hundred odd nanometers by for example the CVD process. Note that it is also possible to form the silicon oxide film 305 by the thermal oxidation method.

Then, the polysilicon film is anisotropically etched to form the side wall 306 in the side portion of the gate electrode 276 via the silicon oxide film 305. At this time, the side wall 306 is formed on also the side wall of the word line 277.

Then, a resist pattern (not shown) in which a window is opened in the N channel region by lithography is formed, then an N type impurity is ion-implanted into the substrate 261 by using the resist pattern as a mask to form a source and drain region 307 of the N channel transistor. Accordingly, the source and drain region 307 will be formed sideward of the lower portion in the gate length direction of the gate electrode 276 via the LDD 303. As the ion implantation conditions, for example, arsenic (As) was used for the N type impurity, the implantation energy was set to several tens of keV, and dosage was set to $1 \times 10^{15}/cm^2$ to $1 \times 10^{16}/cm^2$. Next, the resist pattern is removed.

Then, a resist pattern (not shown) in which a window is opened in the P channel region by lithography is formed, then a P type impurity is ion-implanted into the substrate 261 by using the resist pattern as a mask to form a source and drain region 308 of the P channel transistor. Accordingly, the source and drain region 308 will be formed sideward of the lower portion in the gate length direction of the gate electrode 276 (276P) via the LDD 304. As the ion implantation conditions, for example, boron difluoride ($BF_2$) was used for the P type impurity, the implantation energy was set to several tens of keV, and dosage was set to $1 \times 10^{15}/cm^2$ to $1 \times 10^{16}/cm^2$. Next, the resist pattern is removed.

Note that, either of the above ion implantations can be carried out earlier, but preferably the source and drain region 307 of the N channel transistor is previously formed.

Next, the side wall 306 is removed by etching. In this etching, the silicon oxide film 305 acts as an etching stopper, therefore the underlaying layer thereof will not be etched.

Figure 30:
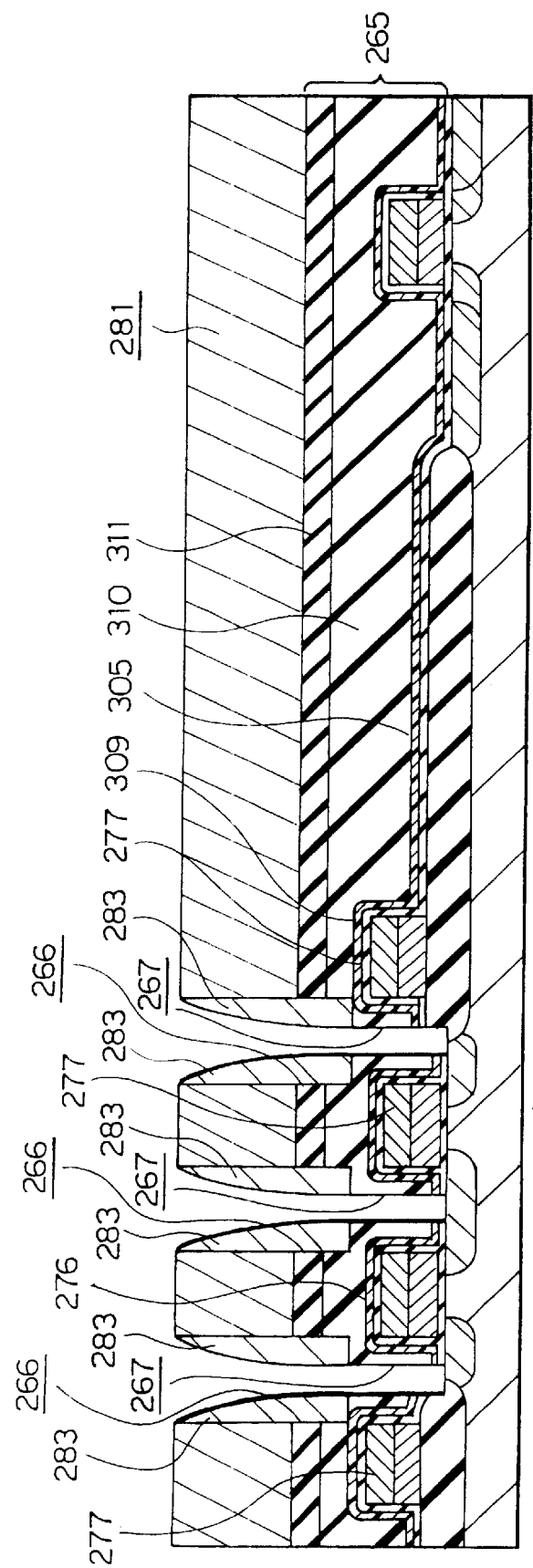

Then, as shown in FIG. 30, a silicon nitride film 309 having a thickness of several tens of nanometers and a BPSG film 310 having a thickness of several hundreds of nanometers are successively formed. Here, for example, the silicon nitride film 309 is formed by a low pressure CVD process, and the BPSG film 310 is formed by the CVD process. Next, reflowing is carried out to flatten the surface of the BPSG film 310. Subsequently, by the CVD process, a silicon oxide film 311 having a thickness of several hundreds of nanometers is formed. The silicon oxide film 311 is formed by the CVD process using for example TEOS as a material gas.

In this way, the first inter-layer insulating film 265 is formed by the silicon oxide film 305, the silicon nitride film 309, the BPSG film 310. and the silicon oxide film 311.

Further, a first film 281 is formed on the first inter-layer insulating film 265 by the CVD process. This first film 281 is formed by polysilicon having a thickness of for example several hundred nanometers. A polysilicon having an impurity concentration of $1 \times 10^{19}/cm^3$ or more is preferably used.

Subsequently, a resist pattern (not shown) in which a window is opened above the region for forming the drawing contact by lithography is formed, then the first film 281 is anisotropically etched by using the resist pattern as a mask, and further the silicon oxide film 311 acting as the upper layer of the first inter-layer insulating film 265 and the upper layer of the BPSG film 310 are subjected to anisotropic etching from the first connection hole 266. In this etching, the gate electrode 276 and the word line 277 are covered by the silicon nitride film 309, therefore it is possible to perform the etching controlled in time. Even if the etching time becomes longer than a predetermined time, since the silicon nitride film 309 becomes an etching stopper, the gate electrode 276 and the word line 277 will not be etched. Next, the resist pattern is removed.

Then, the CVD process is used to form a side wall forming film on the inner wall of the first connection hole 266 and the first film 281 to a thickness of for example several tens of nanometers to several hundreds of nanometers by a polysilicon film. Next, the side wall forming film is etched back by the anisotropic etching to form a side wall 283 on the side wall of the first connection hole 266.

Subsequently, by anisotropic etching using the first film 281 and the side wall 288 as the mask, a second connection hole 267 reaching the source and drain region 307 from the bottom portion of the first connection hole 266 is formed in the inter-layer insulating film 265.

Figure 31:
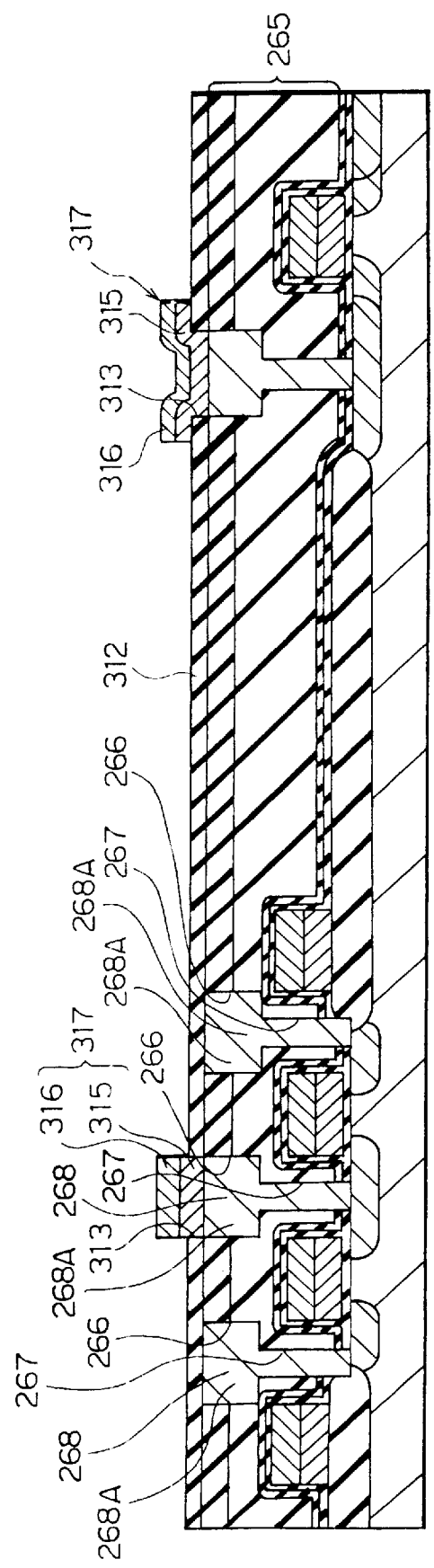

Next, as shown in FIG. 31, the internal portions of the first and second connection holes 266 and.267 are filled and, at the same time, the plug forming film is formed on the first film 281 [refer to FIG. 30] by for example the CVD process to the thickness of several tens of nanometers. As this polysilicon, preferably use is made of one having an impurity concentration of $1 \times 10^{19}/cm^3$ or less or nondoped polysilicon. Then, the anisotropic etching is carried out for the first film 281 and the upper portion of the side wall 288 (refer to FIG. 30) together with this plug forming film to form a conductive plug 268 inside the first and second connection holes 266 and 267 by the plug forming film and the lower portion of the side wall 288. Then, the part of the side wall 288 becomes the pad 268A of the plug 268.

Note that it is possible even if the side wall forming film, the first film 281, and the side wall 288 used for the burying for forming the plug 268 are nondoped polysilicon or doped polysilicon obtained by doping phosphorus (P) by incorporating phosphine ($PH_3$) in the film forming gas as explained above.

For example, if doped polysilicon is used for the first film 281 and the side wall 288 and nondoped polysilicon is used for the side wall forming film 282 used for burying and forming the plug 268, by utilizing the fact that the etching speed is faster in the doped polysilicon, the depression generated in the upper surface of the plug 268 at the time of formation of the plug 268 becomes smaller. Further, by the heating step after this, an impurity is diffused in the plug 268 by the diffusion of impurity from the side wall 283, so this plug 268 is given conductivity.

Next, a silicon oxide film 312 is formed on the first inter-layer insulating film 265 in a state covering the plug 268. This silicon oxide film 312 is formed by a CVD process using for example TEOS as the material gas.

Note that it is also possible to form a silicon nitride film or a laminated film comprised of a silicon nitride film and a silicon oxide film in place of the silicon oxide film 312.

Then, a resist pattern (not shown) acting as a mask for forming the bit contact on the silicon oxide film 312 by lithography is formed, then etching is performed using the resist pattern as a mask to form the bit contact 313 in the silicon oxide film 312. Next, the resist pattern is removed.

A polysilicon film 315 and a tungsten silicide film 316 are successively laminated on the silicon oxide film 312 together with the internal portion of the bit contact 313.

Next, a resist pattern (not shown) acting as a mask for forming the bit line on the tungsten silicide film 316 by lithography is formed, then etching is performed using the resist pattern as a mask to form a bit line 317 comprised of the tungsten silicide film 316 and the polysilicon film 315. Next, the resist pattern is removed.

Figure 32:
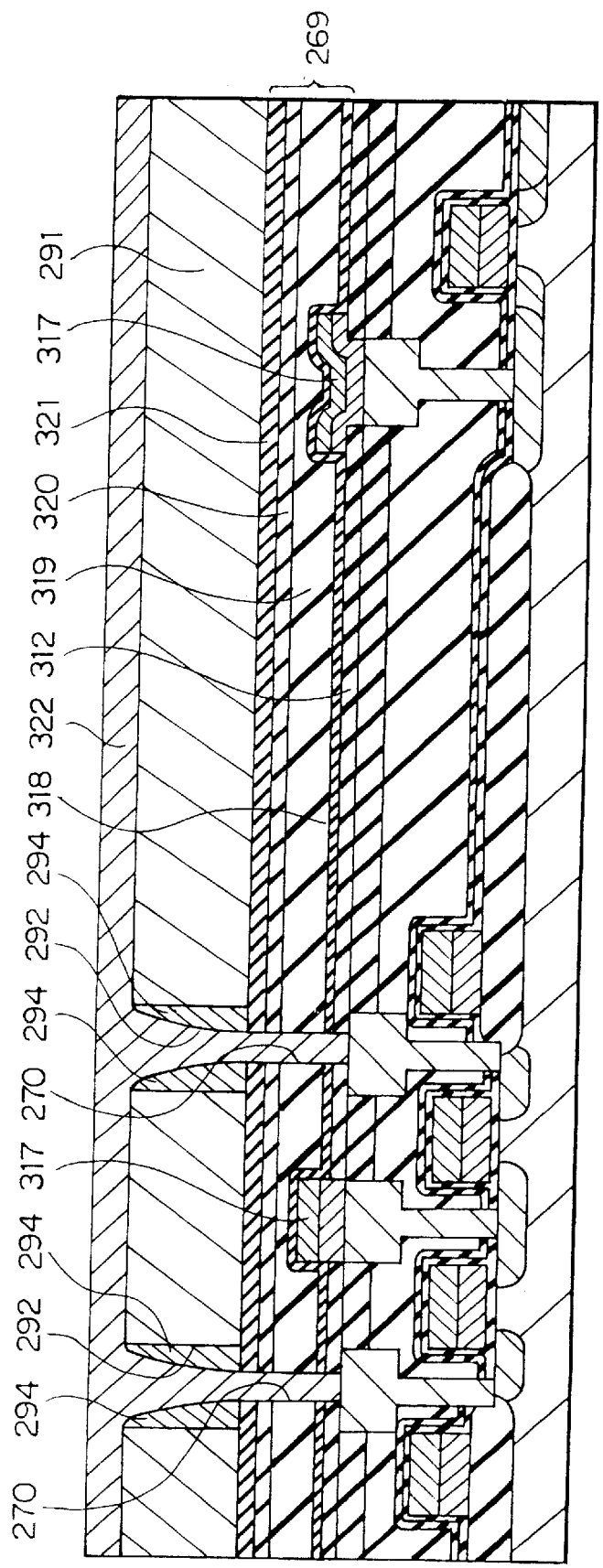

Next, as shown in FIG. 32, a silicon nitride film 318 is formed on the silicon oxide film 312 to a thickness of several tens of nanometers by for example a low pressure CVD process in a state covering the bit line 317. Further, a BPSG film 319 is formed to a thickness of several hundreds of nanometers by for example a CVD process. It is also possible to use a silicon oxide film or a laminated film of a silicon oxide film and a BPSG film in place of this BPSG film 319.

Next, the BPSG film 319 is reflowed or the surface of the BPSP film 319 is chemically and mechanically polished to flatten it. Next, a silicon oxide film 320 is formed on the BPSG film 319 by for example the CVD process, then further a silicon nitride film 321 is formed to a thickness of several tens of nanometers by for example the CVD process.

Accordingly, the second inter-layer insulating film 269 is constituted by the silicon oxide film 62, the silicon nitride film 318, the BPSG film 319, the silicon oxide film 320 and the silicon nitride film 321.

Subsequently, a polysilicon film acting as the third film 291 is formed on the second inter-layer insulating film 269 to a thickness of several hundreds of nanometers by the CVD process.

Next, a resist pattern (not shown) in which a window is opened above the region for forming the storage node contact by lithography is formed on the third film 291, the anisotropic etching is performed using the resist pattern as a mask to form an aperture 292 in the third film 291. Next, the resist pattern is removed.

Next, a side wall forming film is formed on the inner wall of the aperture 292 and the third film 291 by a polysilicon film having a thickness of for example several tens of nanometer by the CVD process. Next, the side wall forming film is etched back to form the side wall 294 on the side wall of the aperture 292.

Next, by anisotropic etching using the third film 291 and the side wall 294 as a mask, a third connection hole 270 acting as a storage node contact is formed in the second inter-layer insulating film 269. Next, the internal portion of the third connection hole 270 is filled and, at the same time, a polysilicon film 322 is formed on the second inter-layer insulating film 269 by for example the CVD process.

Figure 33:
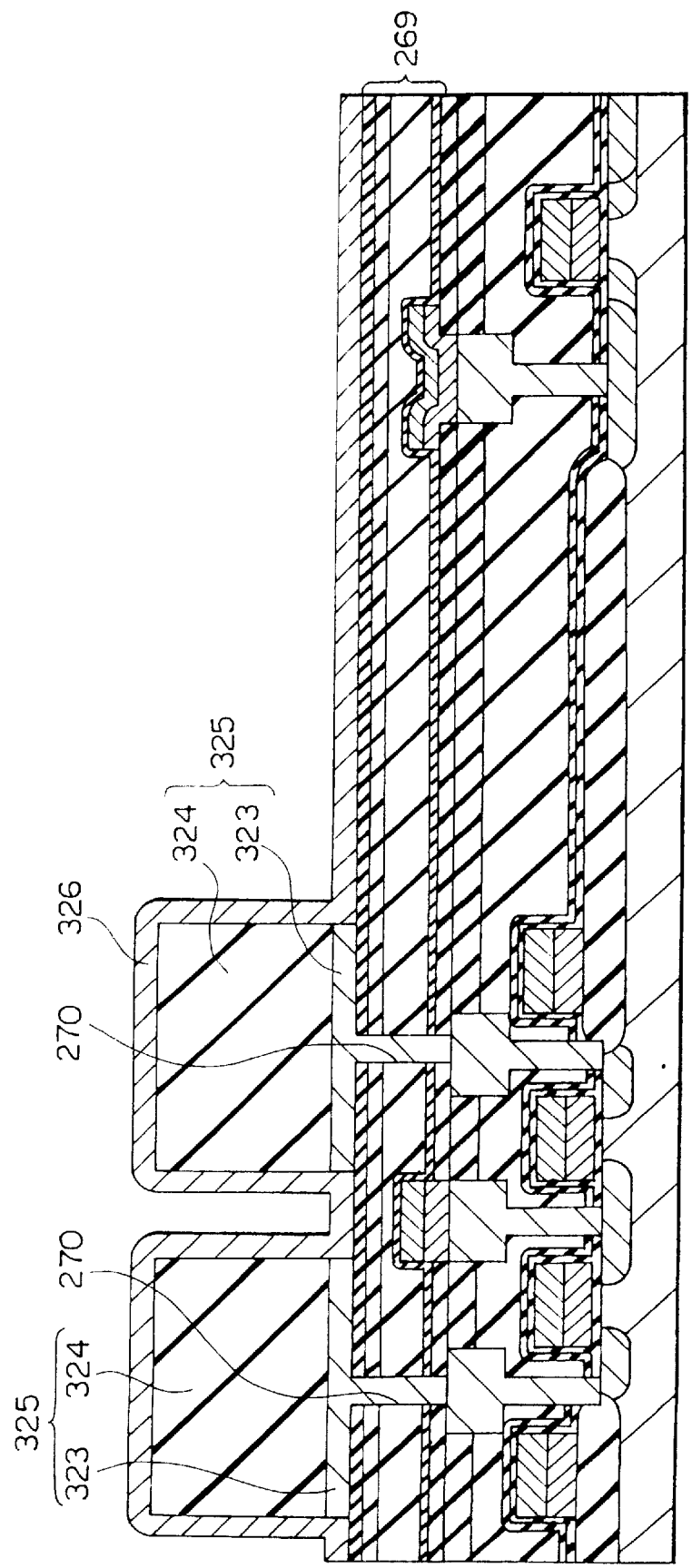

Next, the third film 291, the side wall 294, and the polysilicon film 322 are removed by etching back. Next, as shown in FIG. 33, the internal portion of the third connection hole 270 is filled again and, at the same time, the conductive film 323 made of the doped polysilicon is formed on the second inter-layer insulating film 269 by for example the CVD process to a thickness of several tens of nanometers. Further, a silicon oxide film 324 is formed by for example the CVD process to a thickness of several hundreds of nanometers. Then, a resist pattern (not shown) is formed on the silicon oxide film 324 above the region for forming the storage node by lithography, then anisotropic etching is performed using the resist pattern as a mask to pattern the silicon oxide film 324 and the conductive film 323 and thereby form a pattern 325 for forming the storage node. Next, the resist pattern is removed.

Subsequently, a doped polysilicon film 326 is formed by for example the CVD process to a thickness of several tens of nanometers in a state covering the pattern 325.

Figure 34:
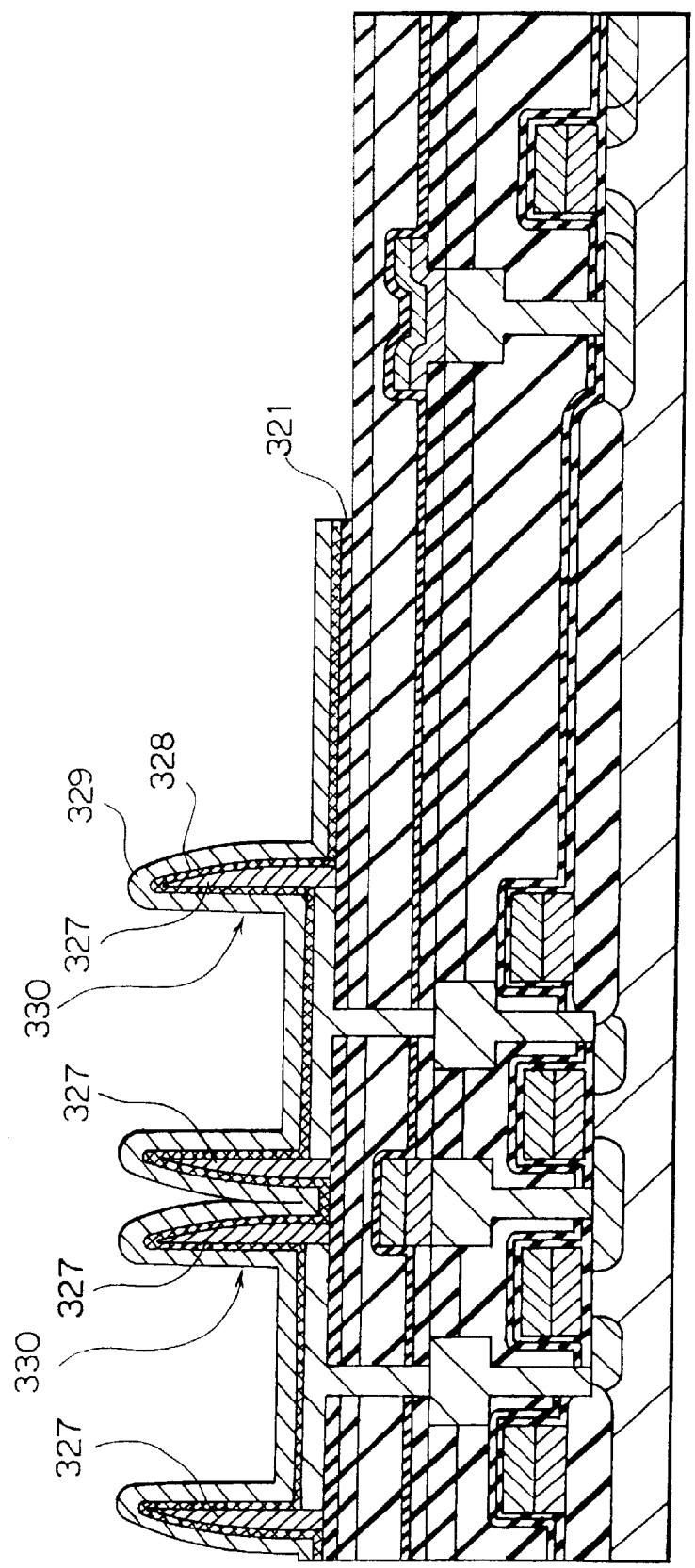

Next, the doped polysilicon film 326 is subjected to anisotropic etching to form a side wall 327 at the side portion of the pattern 325 as shown in FIG. 34.

Next, wet etching is performed using a diluted solution of fluoric acid to selectively etch a part of the silicon oxide film 324 of the pattern 325 (see FIG. 33).

Next, a dielectric film 328 is formed in a state covering the side wall 327. This dielectric film 328 is formed by a laminated film of for example a silicon oxide film, a silicon nitride film, and a silicon oxide film. Further, a doped polysilicon film 329 is formed on the dielectric film 328 to a thickness of several tens of nanometers by for example the CVD process.

Next, a resist pattern (not shown) is formed on the doped polysilicon film 329 of the region for forming the plate electrode by lithography, then the doped polysilicon film 329 and the dielectric film 328 are subjected to anisotropic etching by using the resist pattern as a mask to form a capacitor 330. In the anisotropic etching, the silicon nitride film 321 is also patterned. Next, the resist pattern is removed.

The COB type DRAM is completed by the process explained above.

Although not illustrated, next, the formation of an inter-layer insulating film, the formation of a wiring layer, etc. are further carried out.

In the method of manufacture of a DRAM cell, it becomes possible to form a pad-equipped plug 268 without increasing the number of masking steps. For this reason, consideration is given to a margin in the matching when forming the storage node contact, therefore a storage node contact having a high reliability can be formed.

As explained above, according to this embodiment of the present invention, the diameter of the first connection hole is made larger than that of the second connection hole, then a conductive plug is formed in a state filling them, therefore the diameter of the upper portion of the plug becomes larger than that of the second connection hole. For this reason, in a configuration forming a third connection hole having the diameter of substantially the second connection hole to be connected to the plug in the upper layer insulating film formed on the inter-layer insulating film, even if the third connection hole is formed at a position deviated by an amount of about the diameter of the second connection hole due to the deviation of mask alignment, the third connection hole can be connected to the plug.

Further, in a configuration in which the upper surface of the plug is formed to almost the same height as the surface height of the inter-layer insulating film, the surface of the inter-layer insulating film on which the plug is formed becomes almost flat. For this reason, the coverage of the film formed by the film forming step after this becomes good and, at the same time, an improvement of the patterning precision can be achieved since no step difference is formed in the lithography step after this.

In the method of manufacture of the semiconductor device of this embodiment of the present invention, after forming the first connection hole in the upper layer of the inter-layer insulating film, a side wall is formed on the side wall of this first connection hole and a second connection hole having a smaller diameter than that of the first connection hole is formed by self alignment in the inter-layer insulating film from the bottom portion of the first connection hole by using the side wall as a mask, therefore a second connection hole having a smaller diameter than that of the first connection hole can be formed by just one masking step. Then, since it is formed in a state where the conductive plug is buried in the first connection hole and the second connection hole, the upper portion of the plug can be given a larger diameter than that of the second connection hole.

Accordingly, where an upper layer insulating film is formed on the inter-layer insulating film and a third connection hole having an equivalent diameter to that of the second connection hole is formed on the upper layer insulating film, even if the position of formation of the third connection hole is off by an amount of the diameter of the second connection hole due to the deviation of the mask alignment, it can be connected to the plug.

Accordingly, it becomes possible to achieve an improvement of the reliability of the contact in the semiconductor device.

In addition, by filling the first and second connection holes, a plug with an upper portion having a larger diameter is formed, therefore it is not necessary to add a film forming step, lithography step, etching step, etc. to form a pad. Further, the pad part can be flattened without adding the film forming step of the insulating film and the flattening step of the insulating film. For this reason, there is no great increase in the number of steps and the process load is small, therefore the increase of the manufacturing cost is small.

Next, an explanation will be made of a third embodiment of the present invention.

The semiconductor device of the third embodiment is structured with a burying wiring layer filling a wiring use groove dug in the inter-layer insulating film and with a conductive plug which penetrates through the inter-layer insulating film and connects the burying wiring layer and the connection region beneath the same and has the burying wiring layer covered by the inter-layer insulating film and preferably can be applied to the bit lines of a COB type DRAM.

The plan view of the manner in which the semiconductor device of the present invention is applied to a COB type DRAM is similar to that of the related art. The plan view shown in FIG. 2 can therefore be applied as it is. Namely, the gate electrodes WL of the selection transistors STr are arranged in parallel. The bit lines BL connected to the diffusion layers of these selection transistors STr by the bit contacts BC are arranged orthogonal to the gate electrodes WL. Node contacts NC connected to not illustrated capacitors are provided in the diffusion layers of the selection transistors STr.

Figure 2:
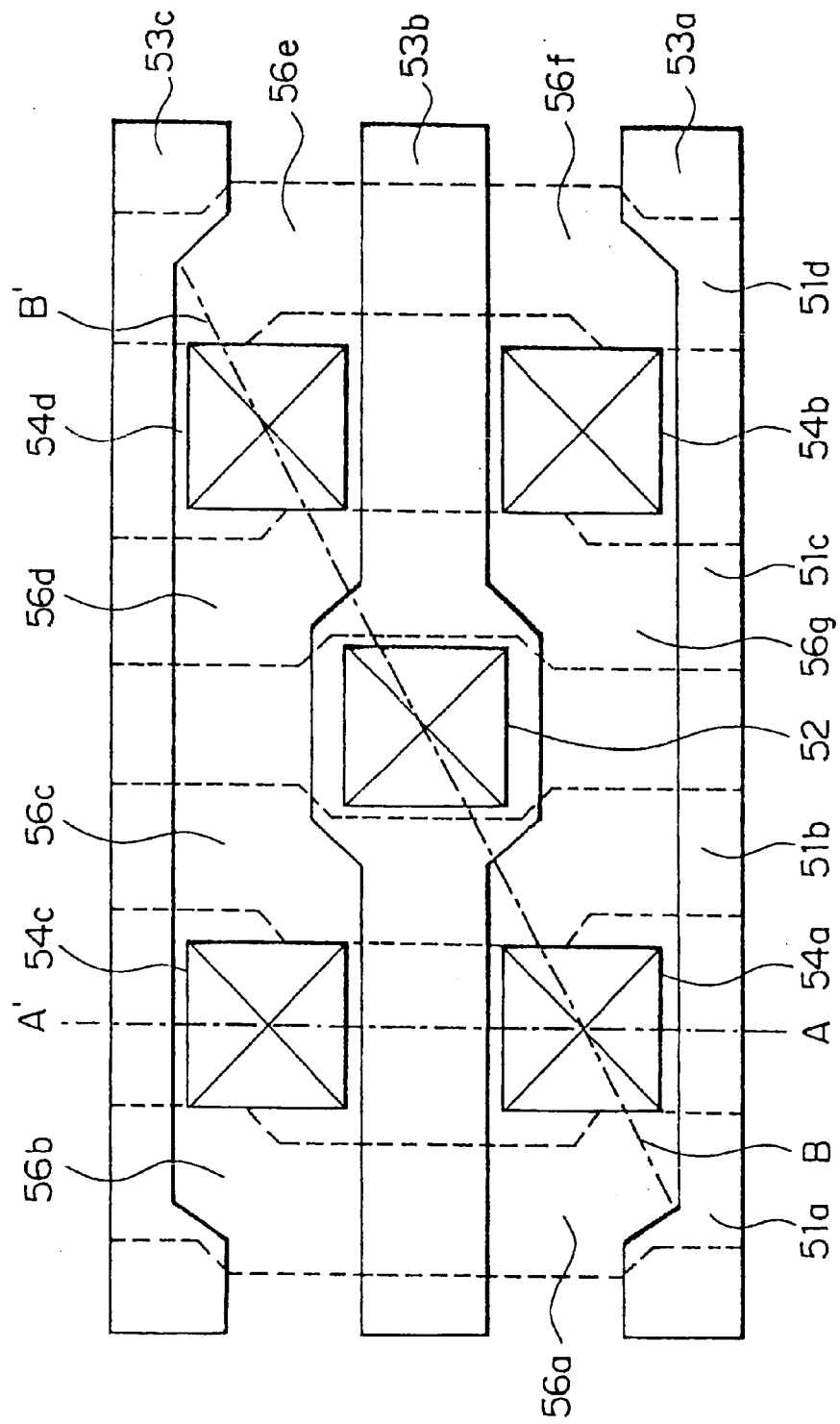
FIG. 2 is a plan view of the configuration of a COB type DRAM of the related art.
Figure 3:
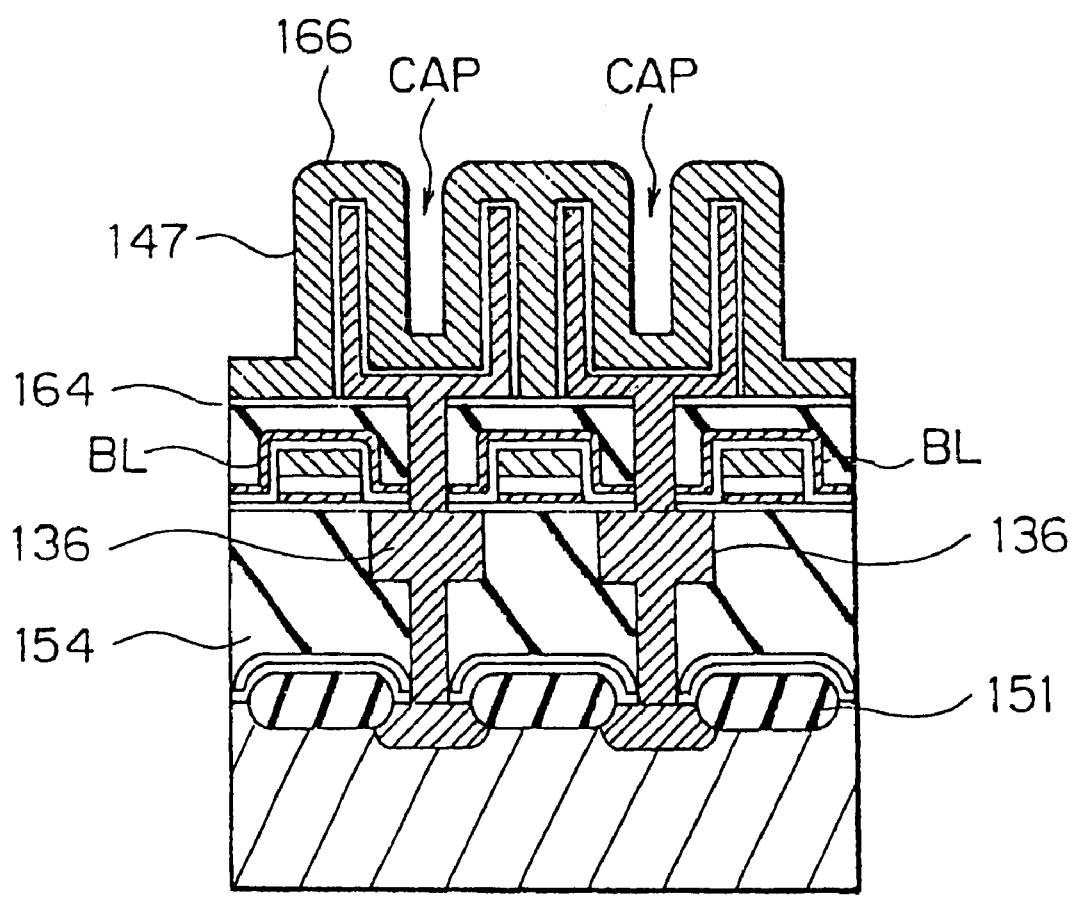
FIG. 3 is a sectional view taken along a line A–A' of FIG. 2.
Figure 4:
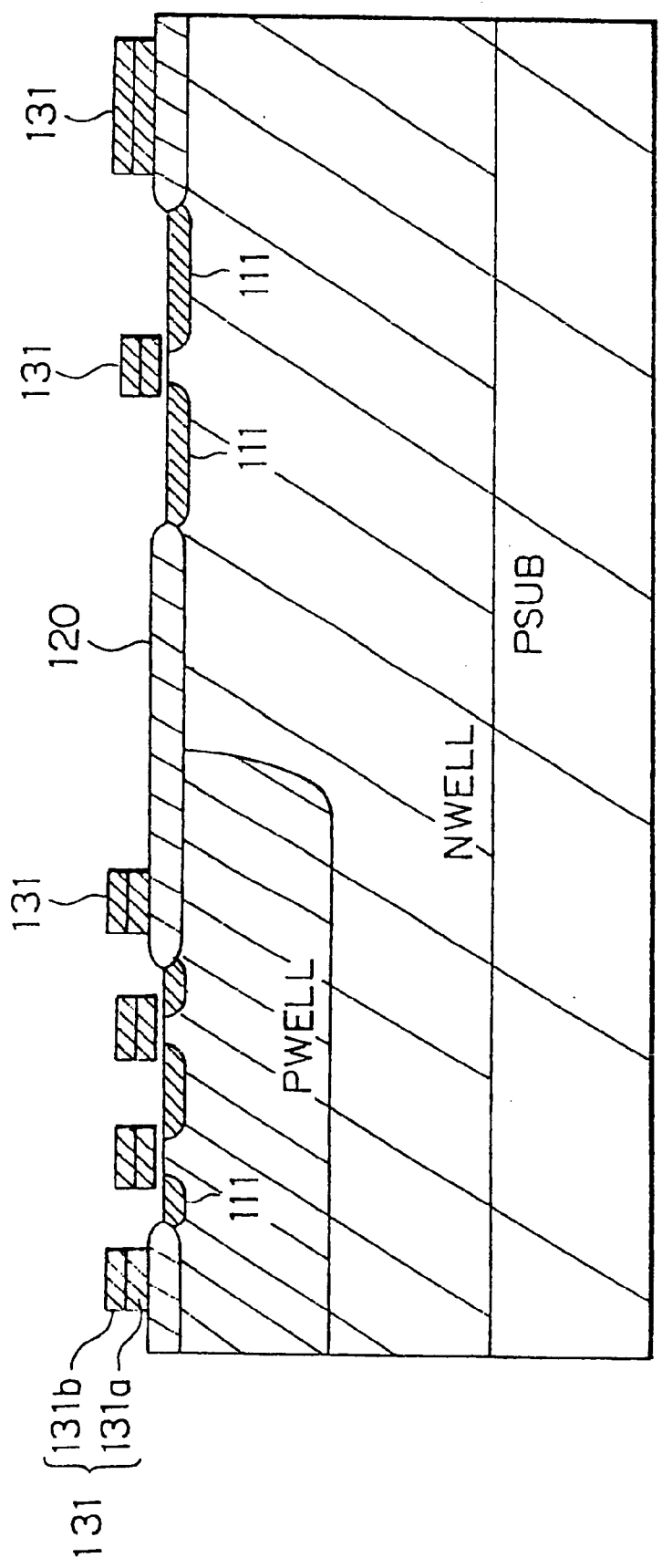
FIG. 4 to FIG. 17 are sectional views explaining steps of the manufacturing process of the COB type DRAM of the related art.
Figure 5:
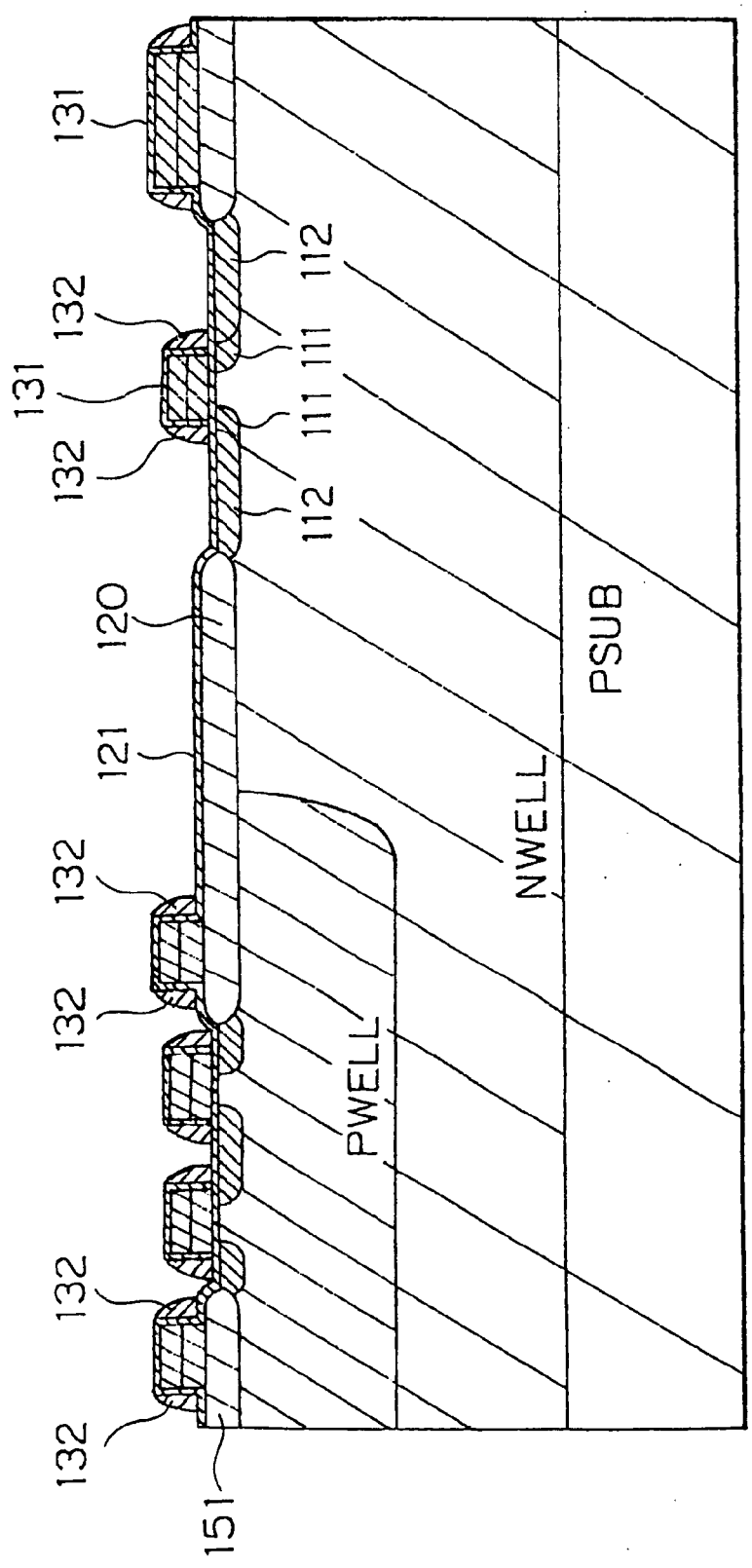
Figure 6:
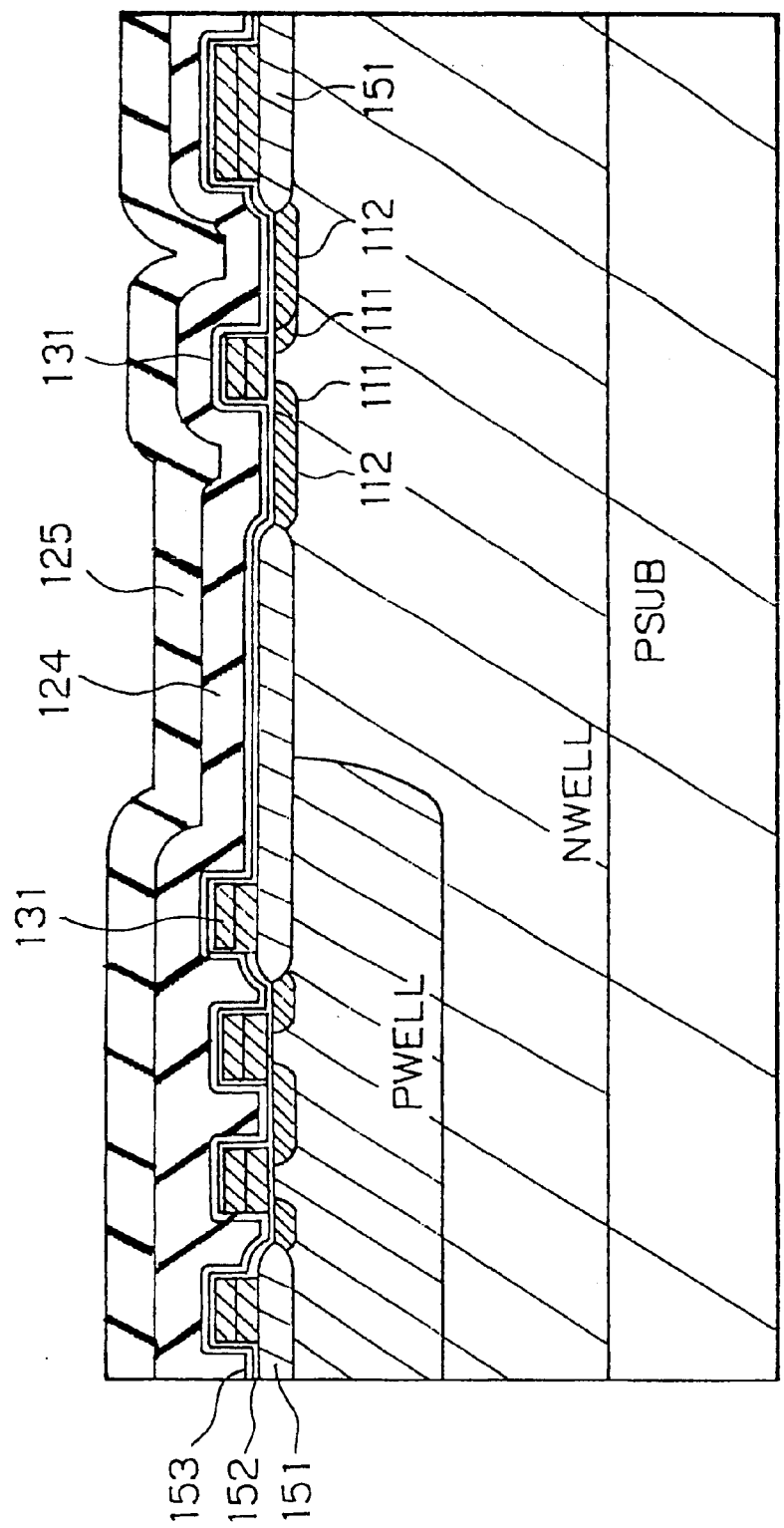
Figure 7:
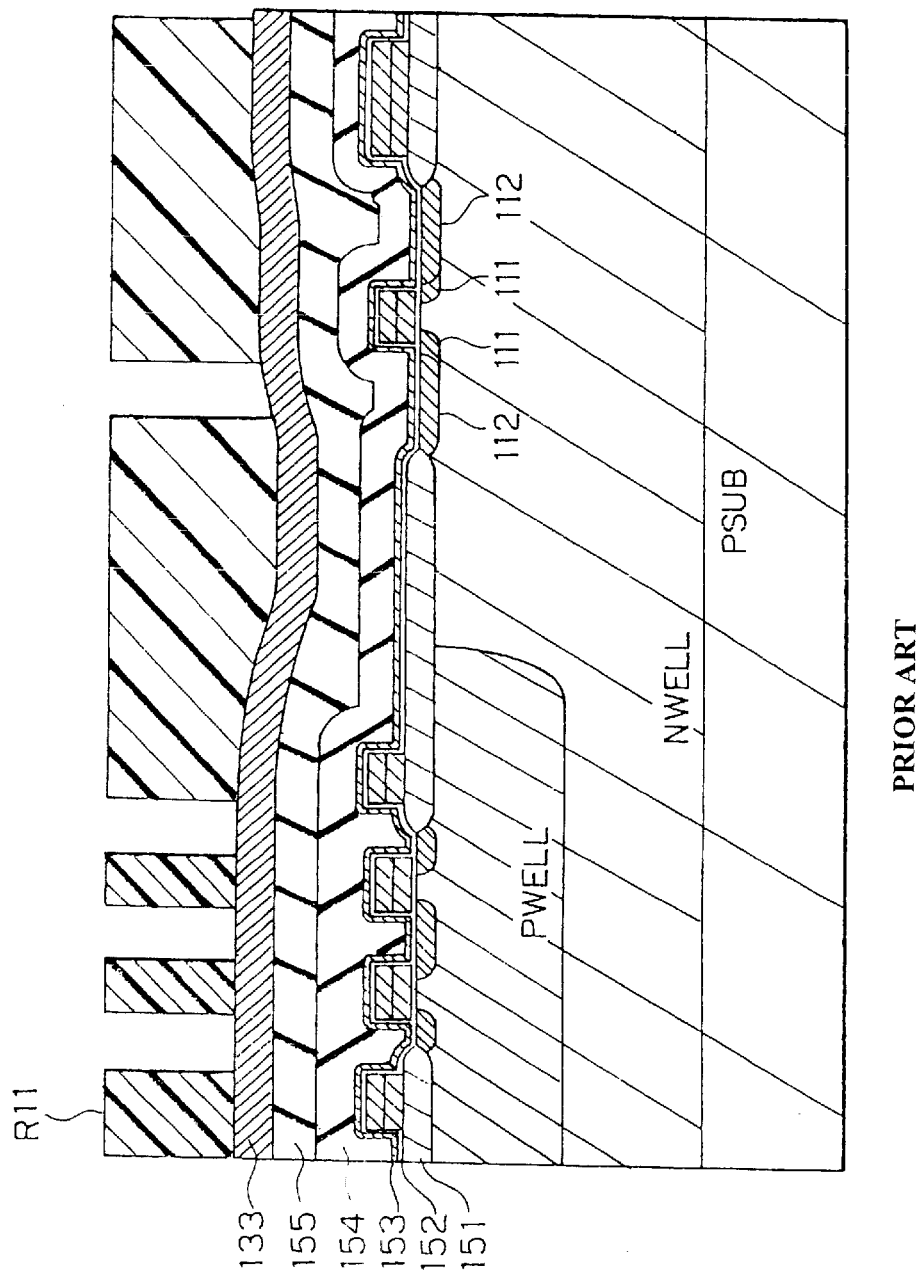
Figure 8:
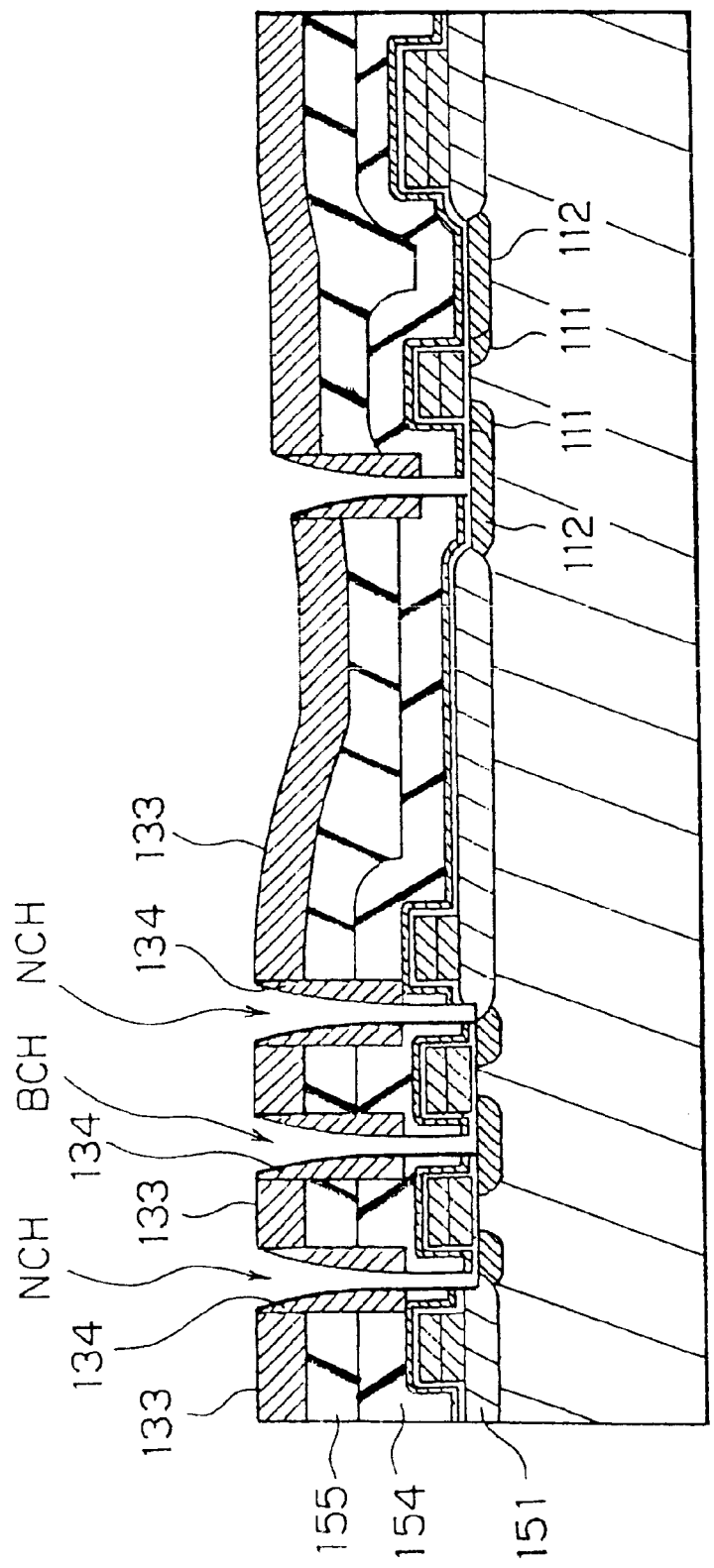
Figure 9:
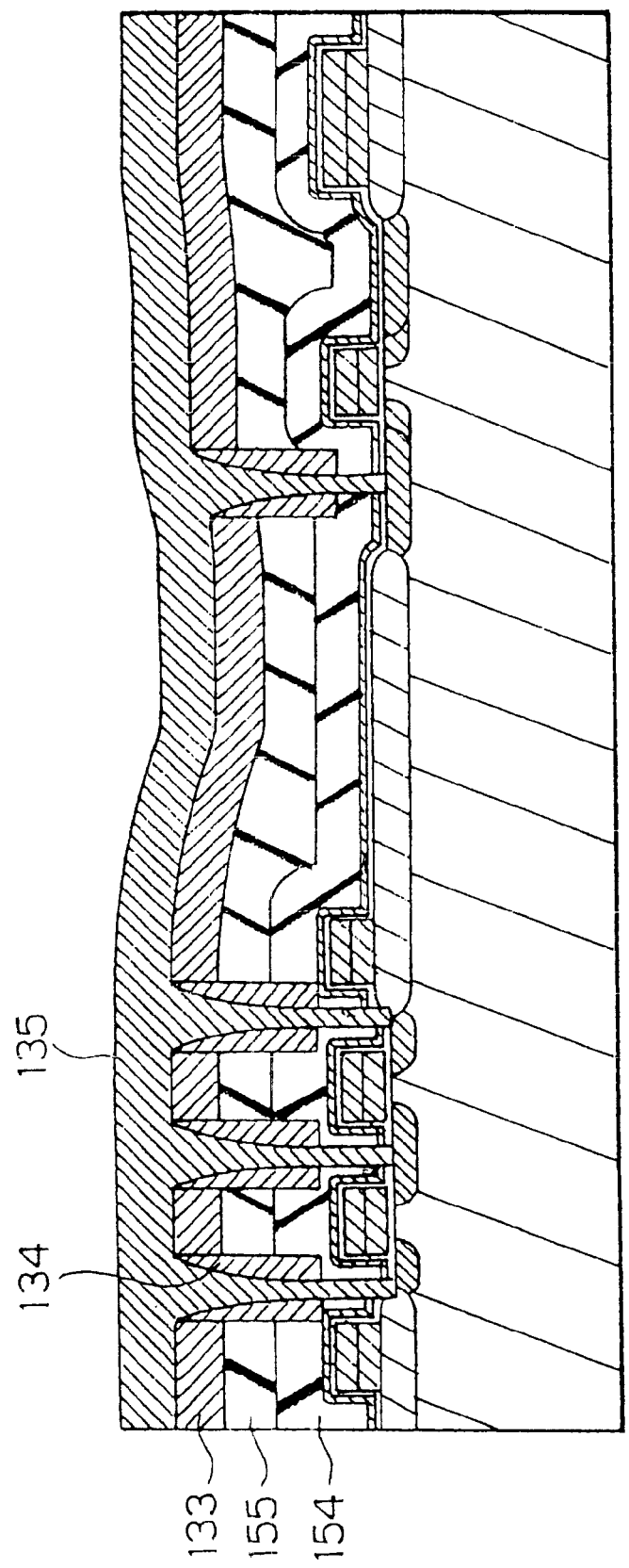
Figure 10:
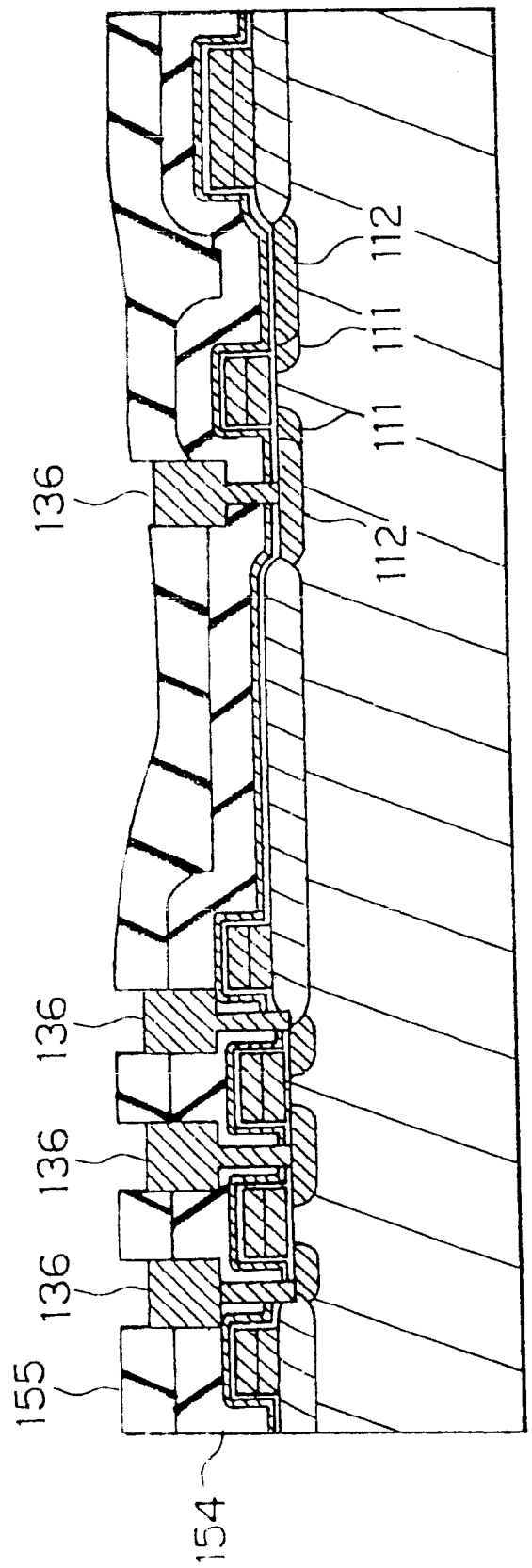
Figure 11:
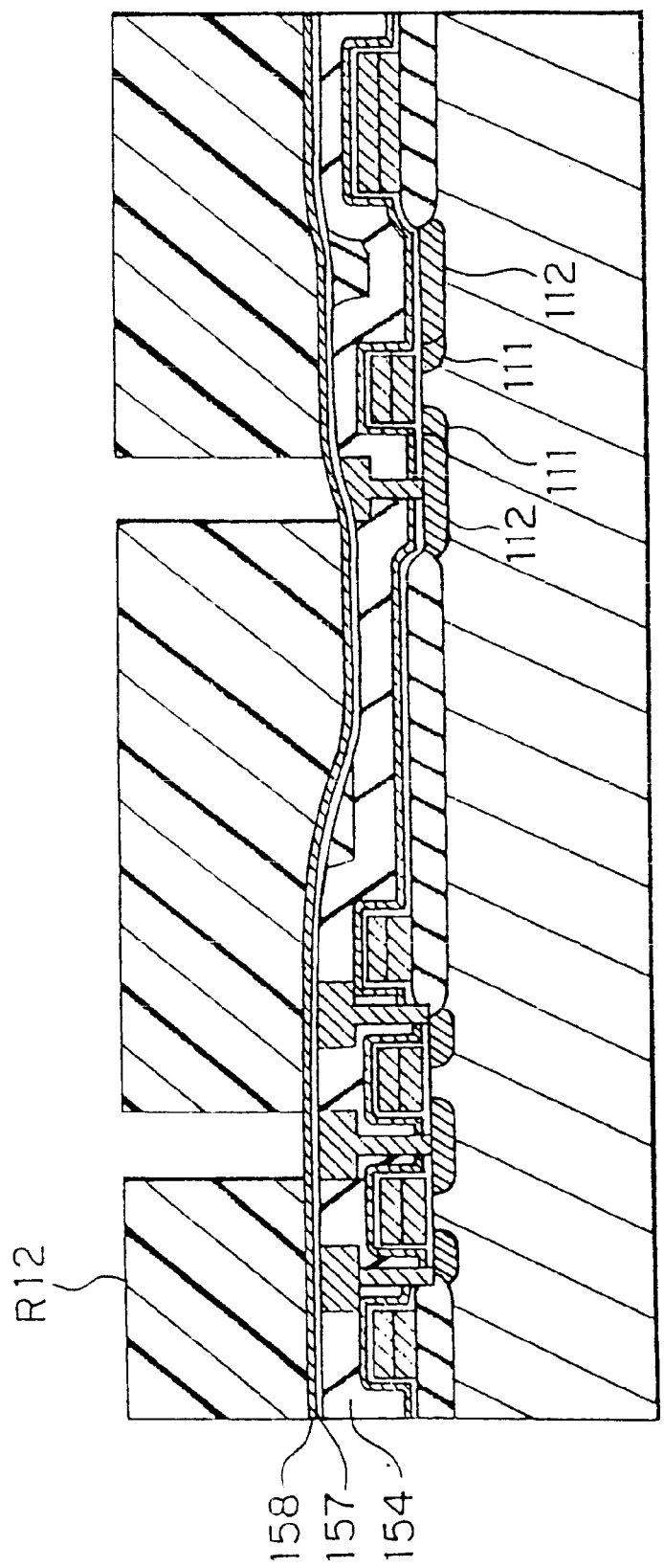
Figure 12:
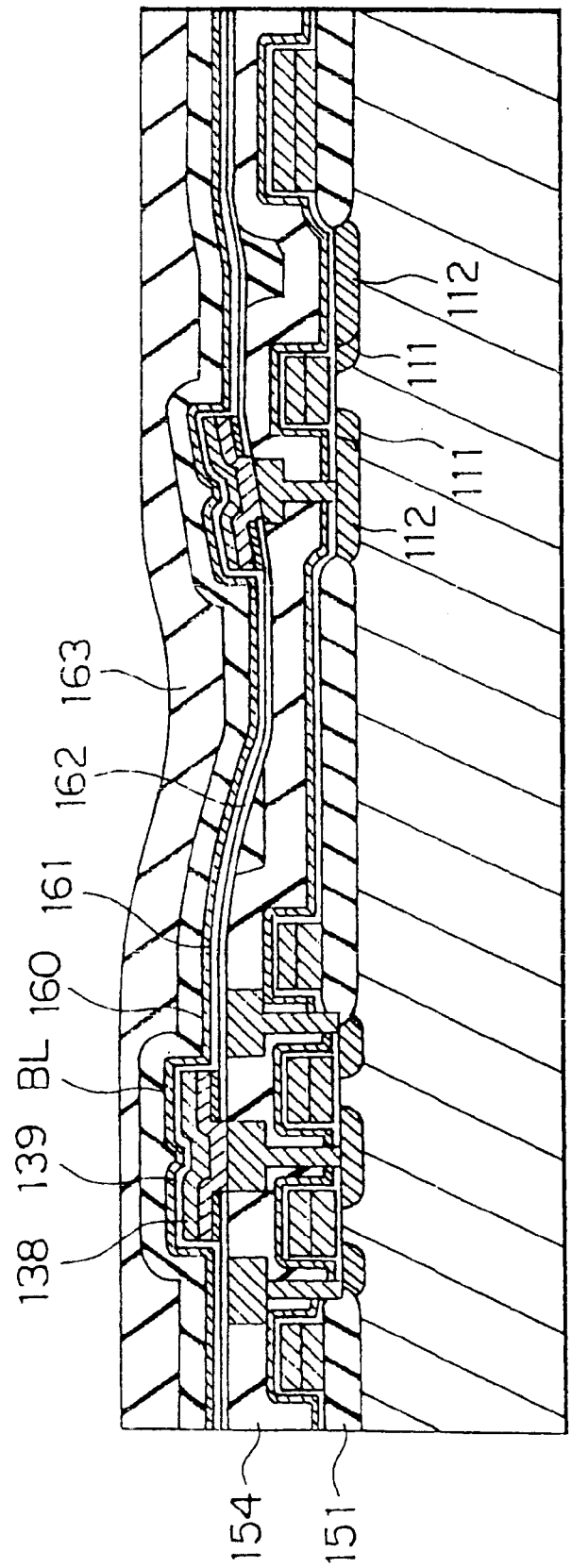
Figure 13:
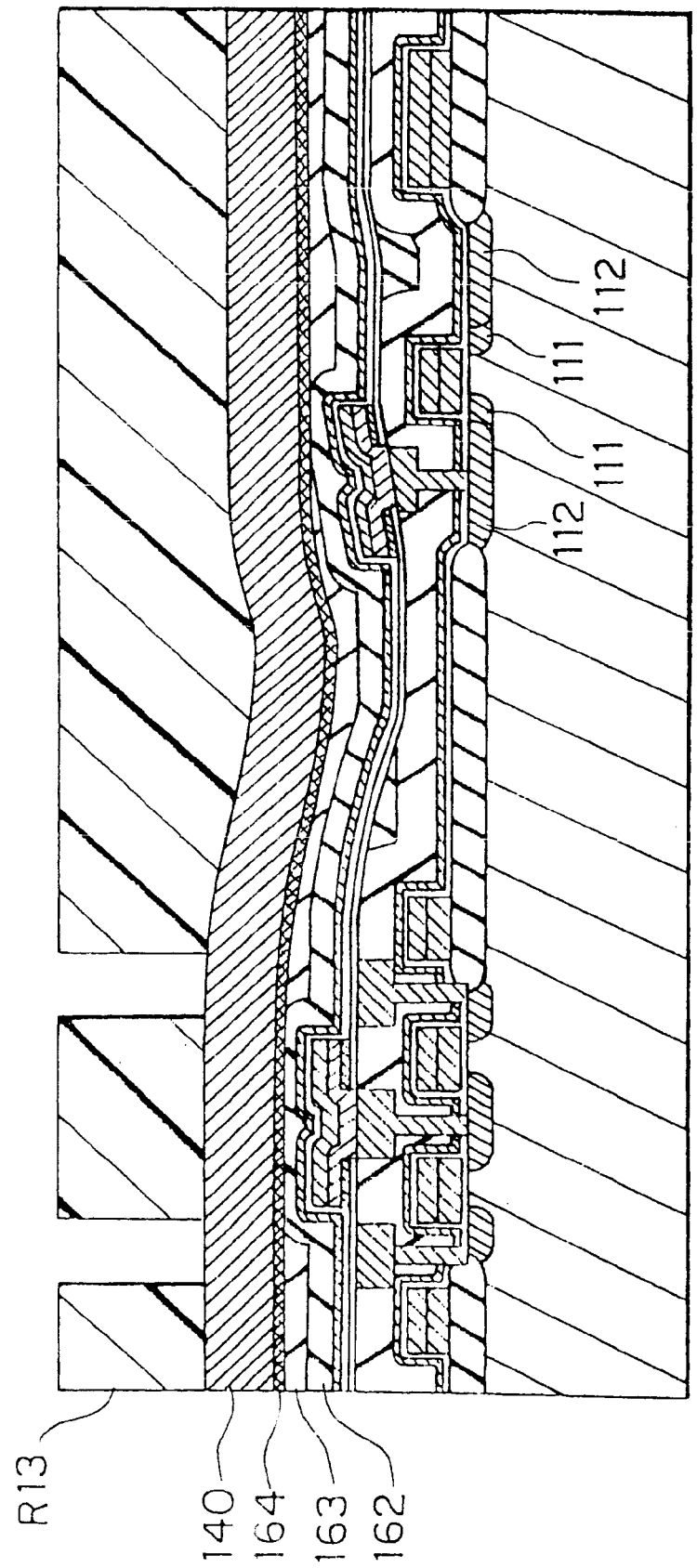
Figure 14:
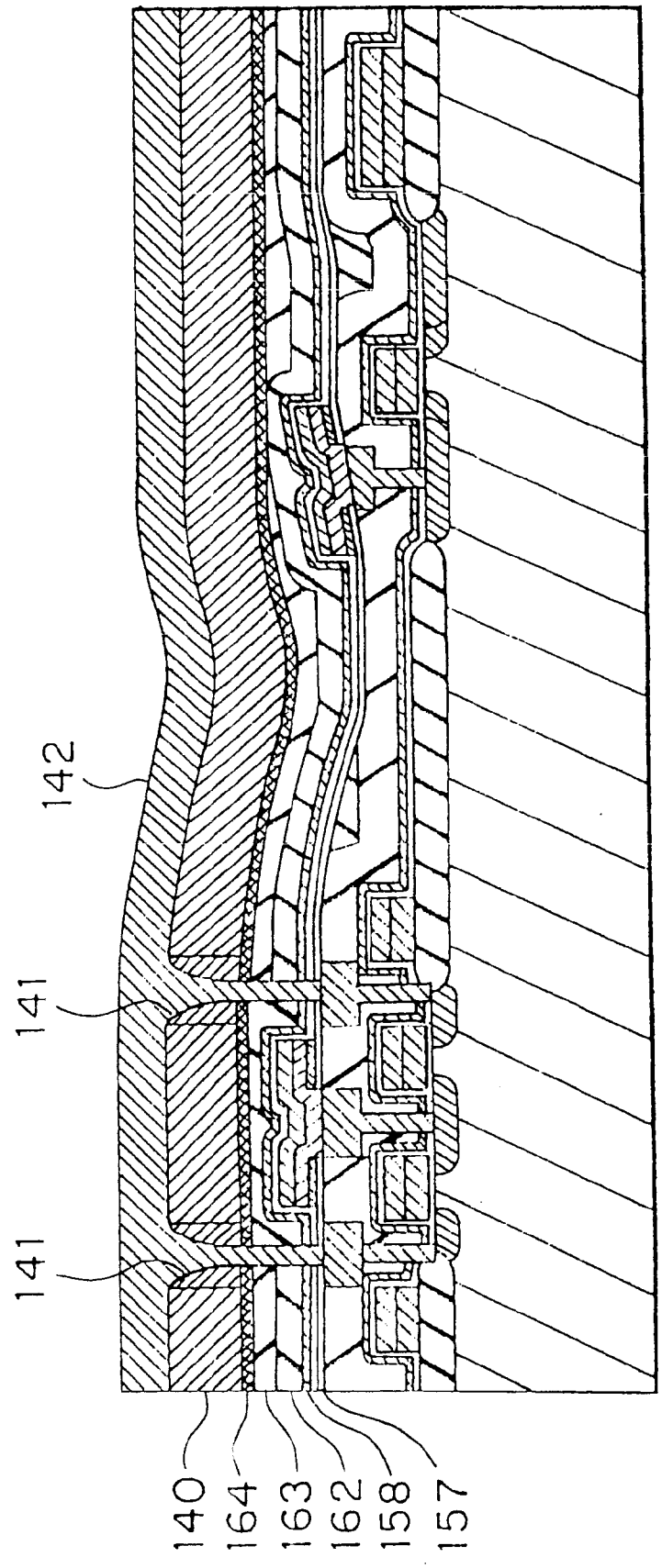
Figure 15:
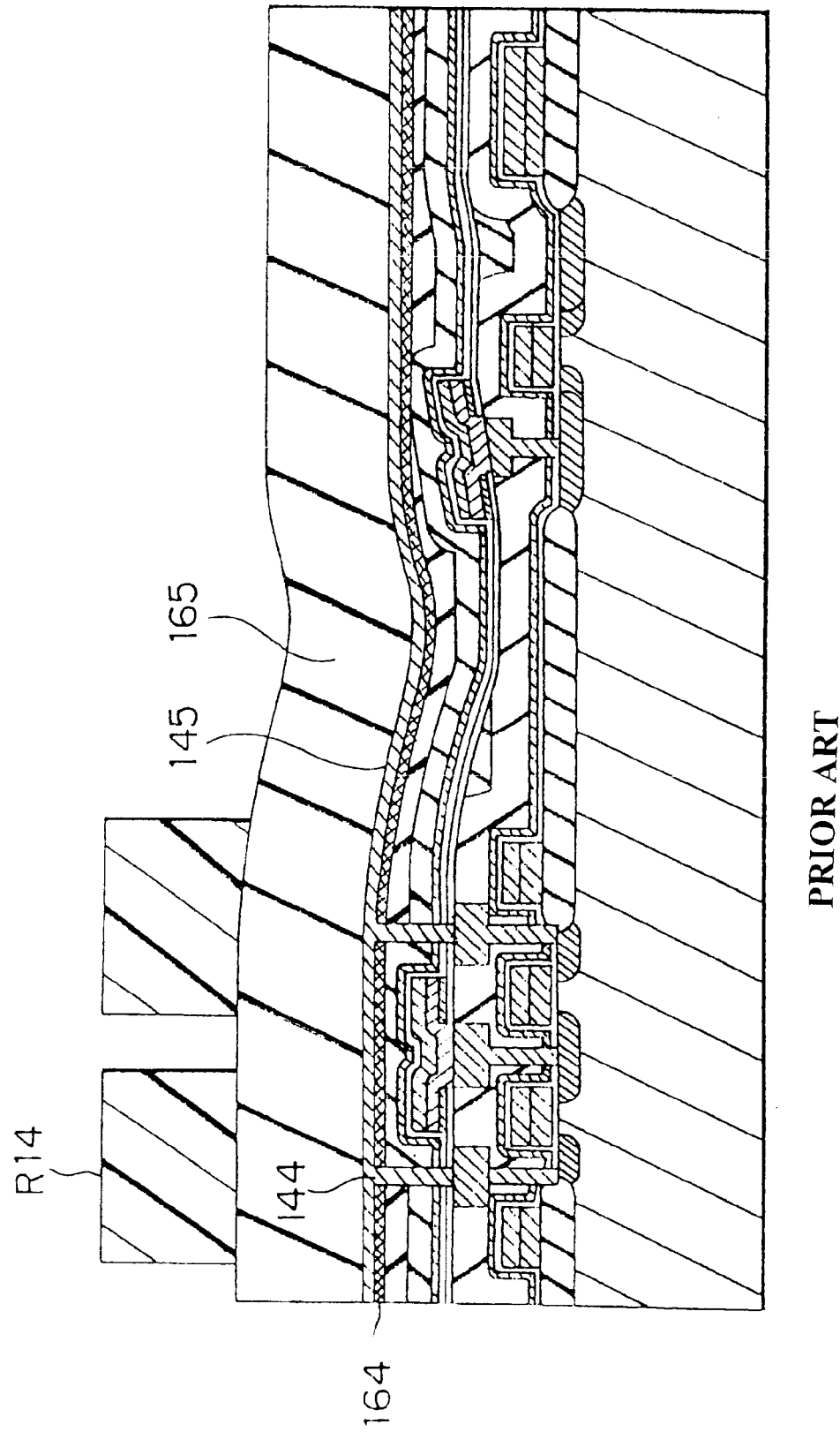
Figure 16:
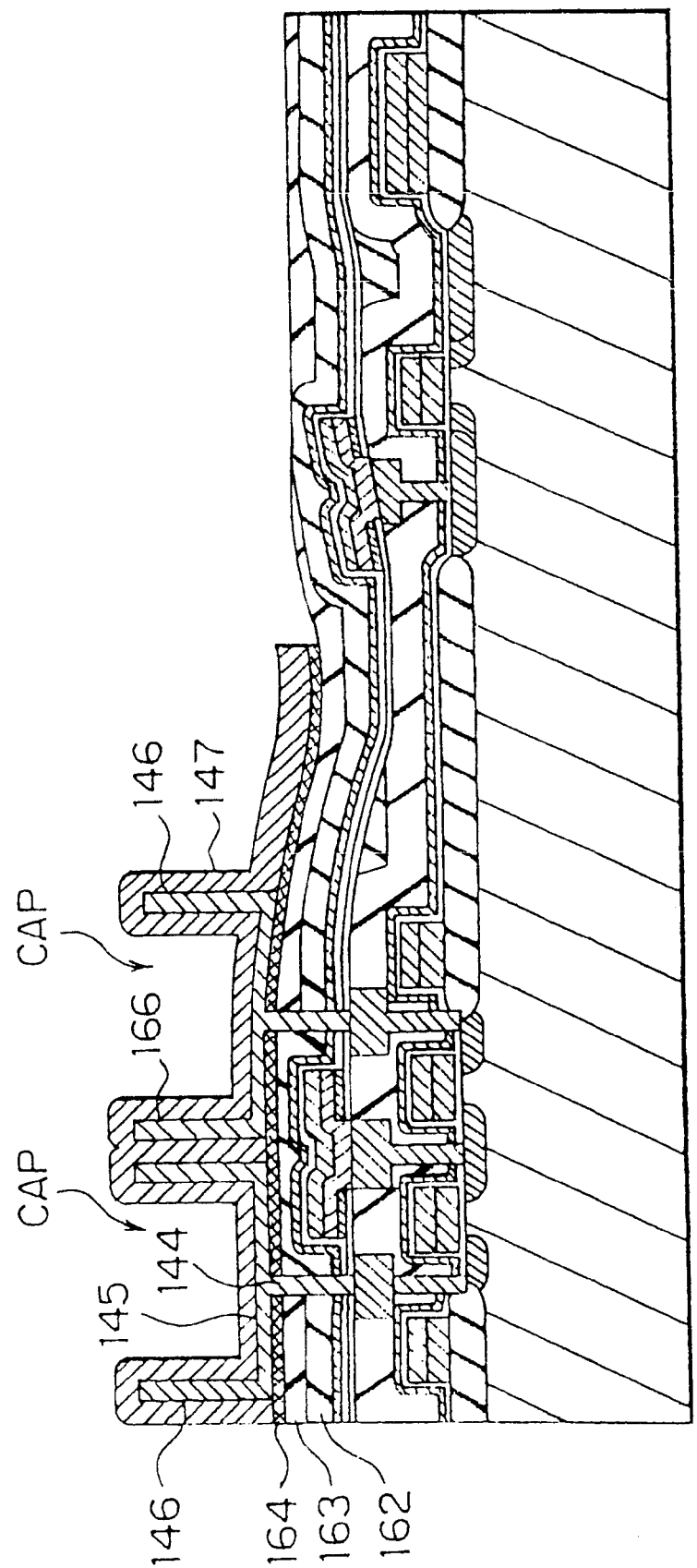
Figure 17:
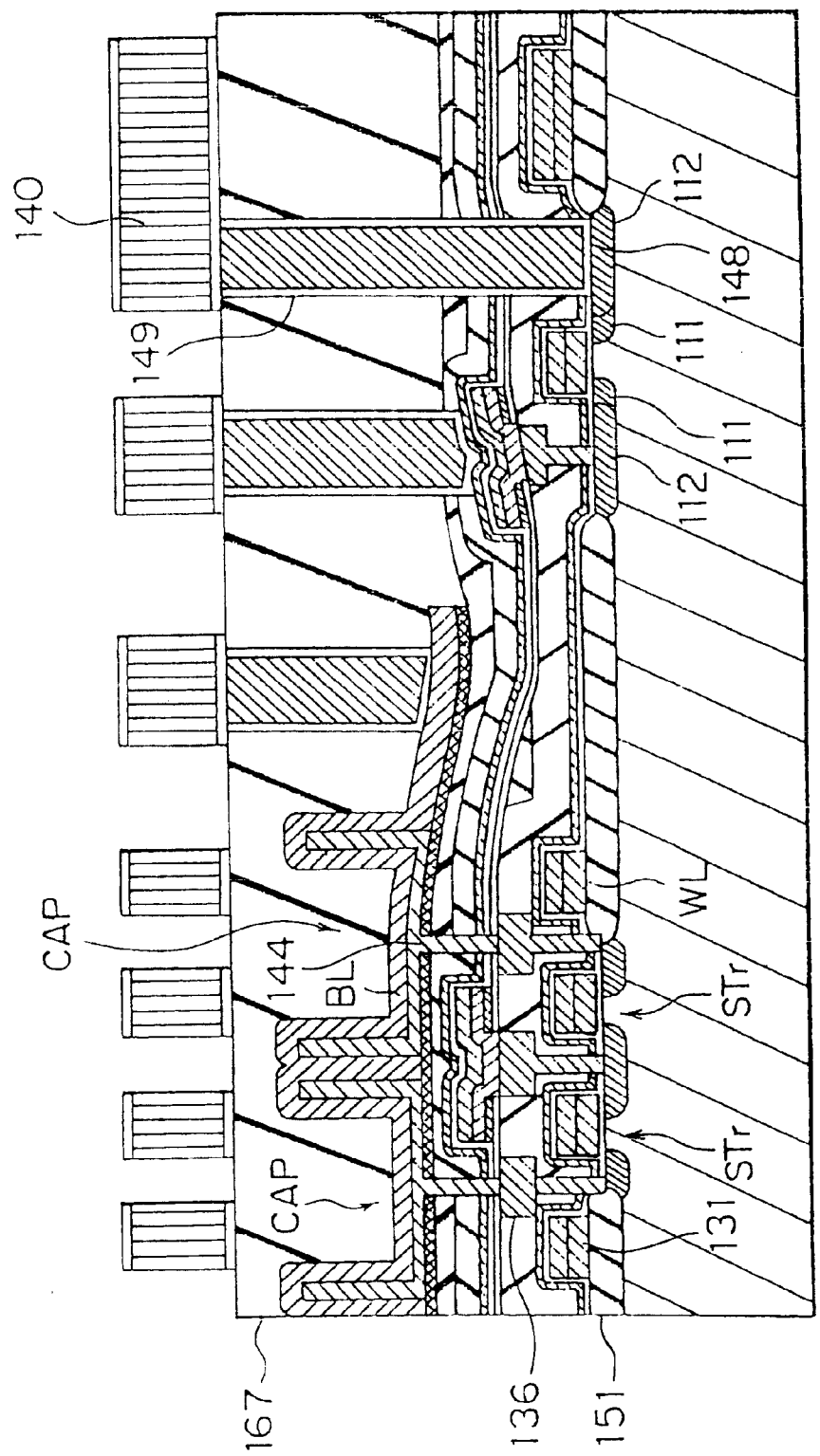

A sectional view of a COB type DRAM according to the present invention taken along a line B–B' of FIG. 2 is given in FIG. 15. Note that this sectional view includes a part of the peripheral circuits. In this DRAM, a selection transistor STr and transistor Tr of the peripheral circuit are formed on the surface of a silicon substrate SUB. The bit line BL is formed in the inter-layer insulating film between the substrate SUB and the capacitor CAP and is connected to the diffusion layer of the selection transistor STr by the bit line contact BC. Further, the capacitor CAP is connected to the diffusion layer of the selection transistor STr by the node contact NC.

The bit line BL is constituted by a conductive material comprised of two layers of for example tungsten silicide and polysilicon filling the bit line use groove BLC dug in the inter-layer insulating film 23 covering the transistor STr. The bit line contact BC is connected to the substrate SUB while penetrating through the bit line BL. Further, the upper surface of the bit line BL is flattened and covered by the insulating film 26 and isolated from the capacitor CAP.

Next, the manufacturing process of a semiconductor device having such a sectional structure will be explained.

Figure 35:
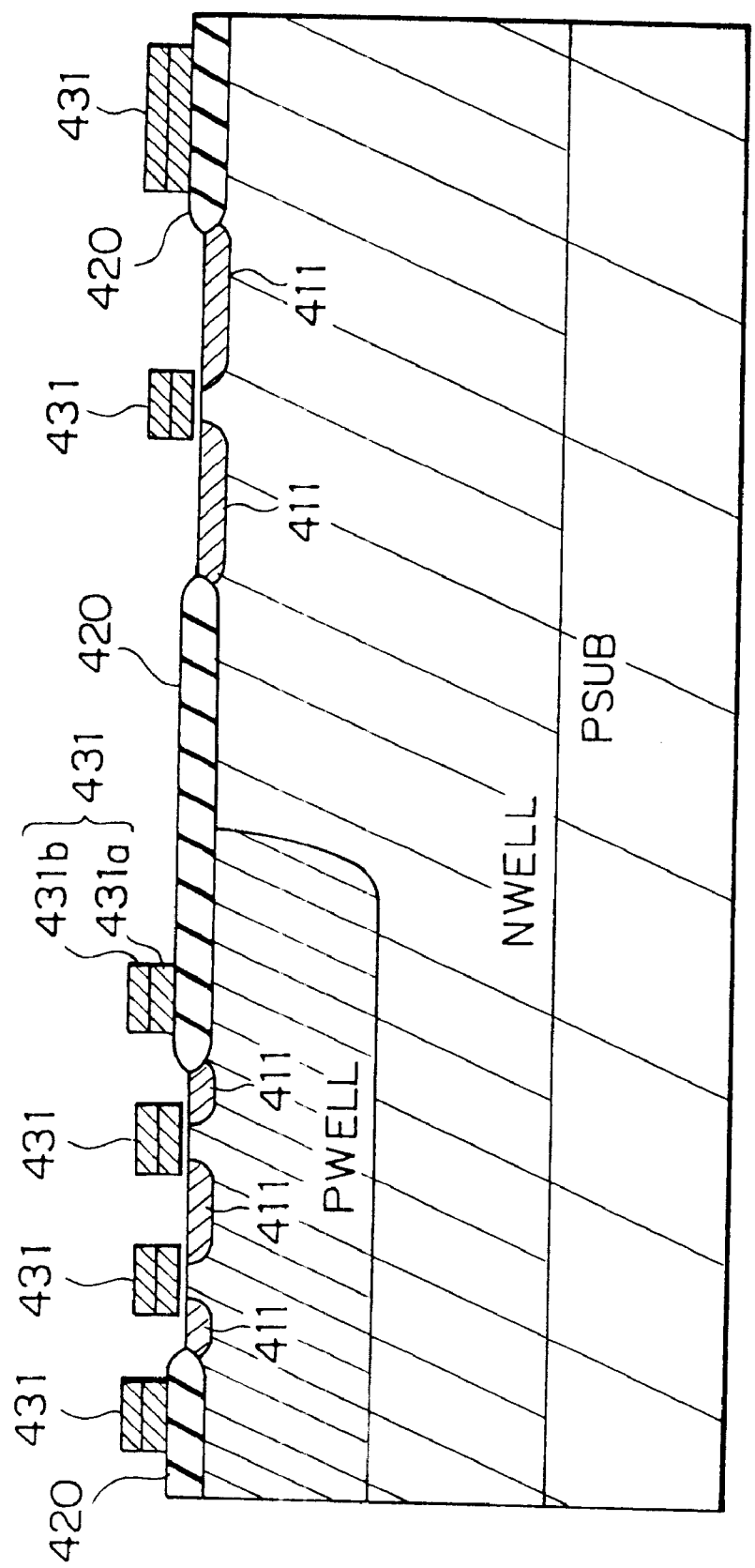
FIG. 35 to FIG. 56 are sectional views explaining a first step for manufacturing a COB type DRAM according to a third embodiment of the present invention.

First, as shown in FIG. 35, as the substrate, for example a silicon substrate in which an N well is formed on a P type substrate and then a P well is formed in the N well is used. After depositing for example the pad oxide film and the silicon nitride film on the silicon substrate, a resist film is formed, the patterning of the opening portion of the element isolation formation region is formed on the resist film by exposure and development, and the silicon nitride film at the opening portion of the resist film is removed by etching. After removing the resist film, the substrate is oxidized, a LOCOS 420 is formed, and the element isolation is carried out. After removing the silicon nitride film and the pad oxide film, the. surface of the silicon substrate is oxidized, and a not illustrated gate oxide film is formed in the active region. Next, by for example the CVD process of the impurity introduction polysilicon film 431a, a tungsten silicide layer WSix 431b is further deposited to a thickness of about several hundreds of nanometers by the CVD process. Next, the resist is patterned to the gate electrode pattern to pattern the tungsten silicide 431b and the polysilicon film 431a and form the gate electrode 431. Next, arsenic or phosphorus is ion-implanted under conditions of, for example, an energy of several tens of keV and dosage of about $1 \times 10^{12}$ to $1 \times 10^{14}$ by using the gate electrode 431 and the LOCOS 420 as a mask to form the LDD 11.

Figure 36:
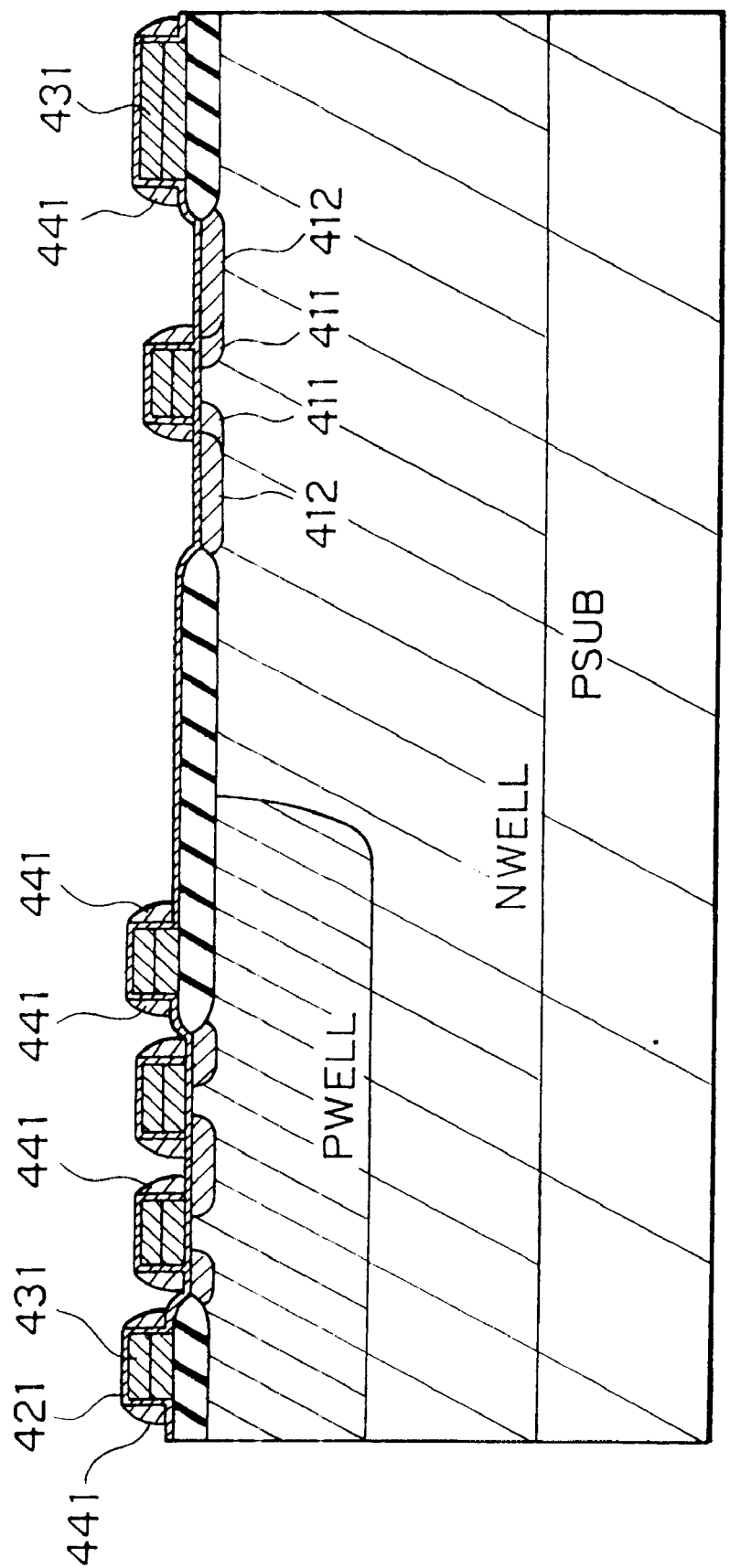

Next, as shown in FIG. 36, a silicon oxide film 421 is formed as an etching mask to a thickness of about several tens of nanometers by the low pressure CVD process or thermal oxidation process so as to cover at least the substrate and the gate electrode 431. Next, a polysilicon film is deposited to a thickness of a hundred odd nanometers by the CVD process, then this is subjected to anisotropic etching to form a side wall 441 on the side wall of the gate electrode 431. Next, the resist is patterned so as to open windows in the N channel region and the P channel region, then arsenic is ion-implanted into the N channel region under conditions of an energy of several tens of keV and dosage of about $1 \times 10^{15}$ to $1 \times 10^{16}$ and $BF_2^+$ is ion-implanted into the P channel region under conditions of an energy of several tens of keV and dosage of about $1 \times 10^{15}$ to $1 \times 10^{16}$ to form the source and drain region 412.

Figure 37:
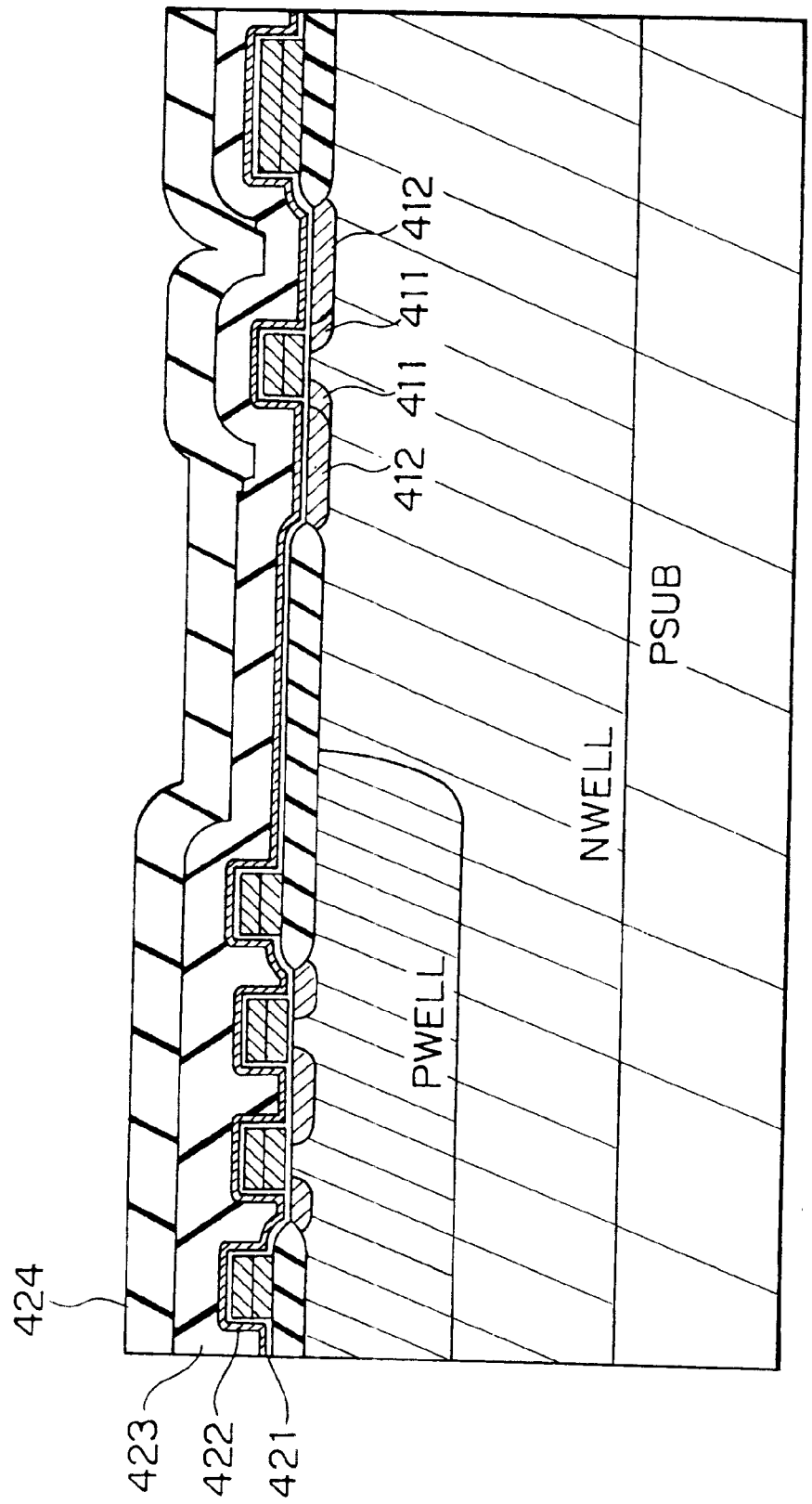

Next, as shown in FIG. 37, the side wall 441 constituted by polysilicon is removed, then a silicon nitride film 422 is deposited to a thickness of for example about several tens of nanometers by the low pressure CVD process, an NSG film 423 is deposited to a thickness of several hundreds of nanometers by the $O_3$-TEOS method CVD, then a BPSG film 424 is deposited to a thickness of several hundreds of nanometers by the $O_3$-TEOS method CVD.

Figure 38:
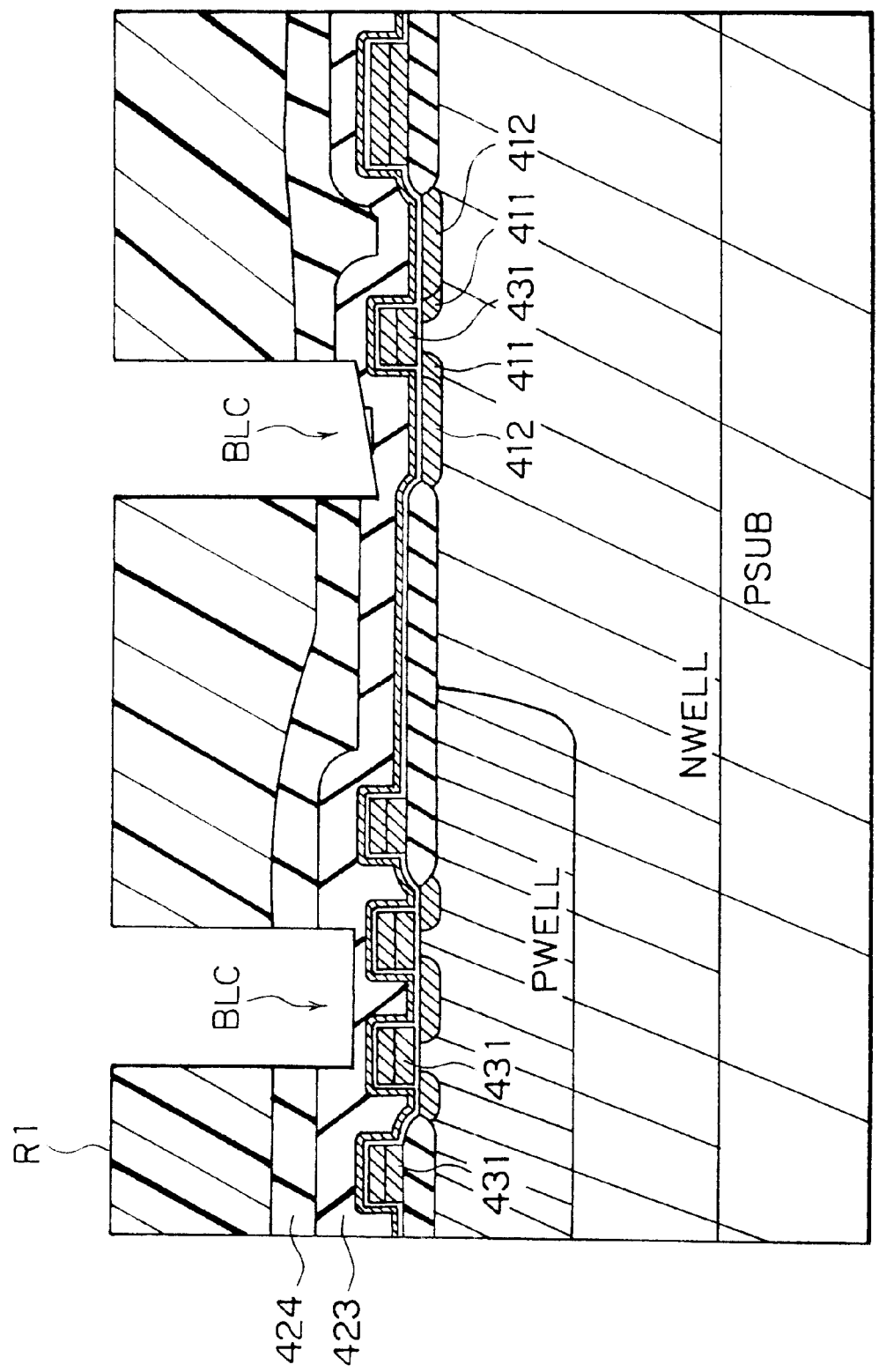

Next, as shown in FIG. 38, after reflowing the BPSG film 424 to flatten the same, the resist RI is formed and patterned with the inverted pattern of the usual bit line pattern, the BPSG film 424 and the NSG film 423 are successively etched by using this as a mask, and the etching is stopped on the gate electrode 431 of the NSG film 423. In this case, the silicon nitride film 422 is formed by covering the gate electrode 431, therefore the gate electrode 431 is not exposed by etching. By this, the bit line use groove BLC is formed in the inter-layer insulating film 423 directly covering the selection transistor STr with the pattern of the bit line.

Figure 39:
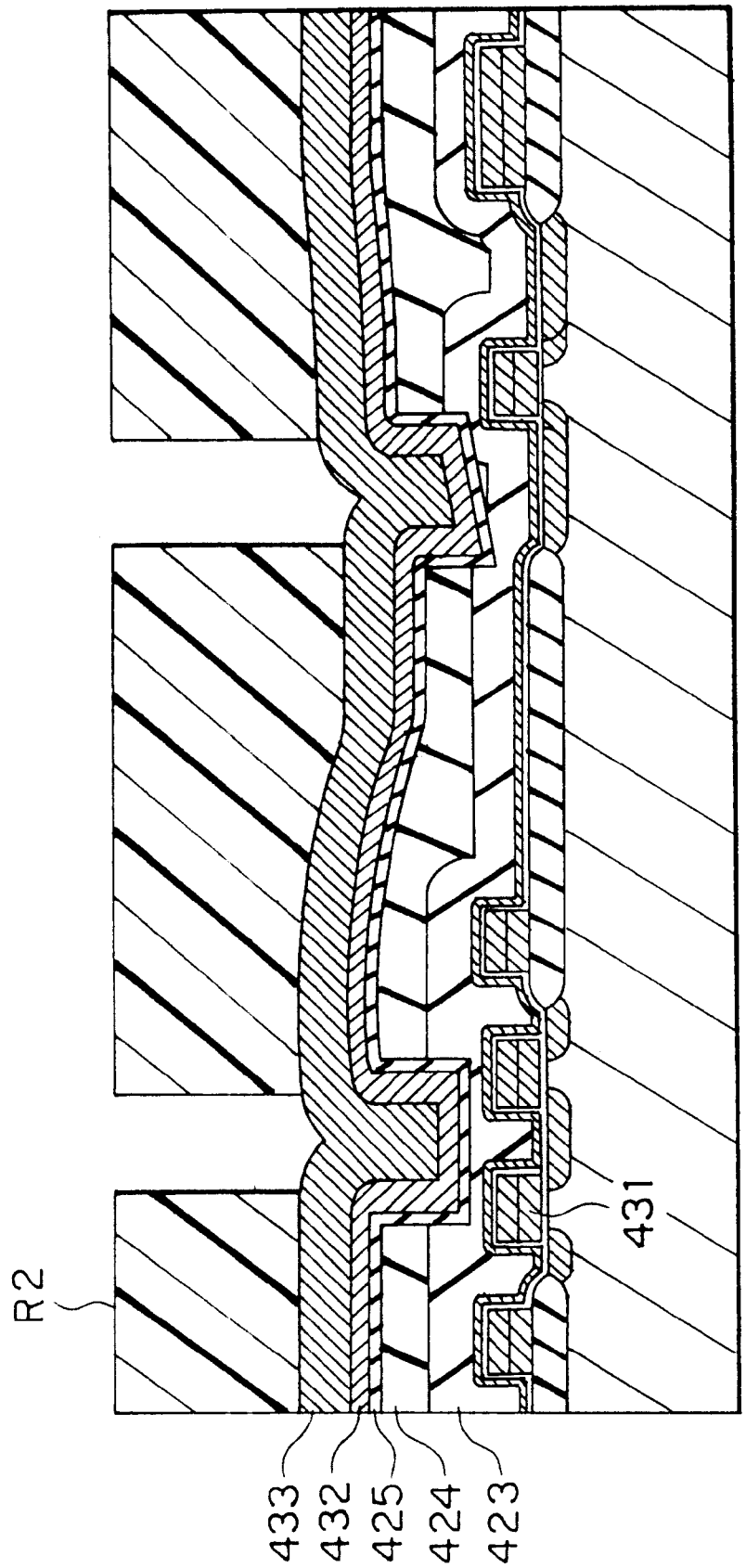

Next, as shown in FIG. 39, the resist film RI is removed, then, for example, a silicon nitride film (may be silicon oxide) 425 is deposited to a thickness of several tens of nanometers by the low pressure CVD process, then a tungsten silicide WSix film 432 is deposited by the CVD process to a thickness of several tens of nanometers under conditions of for example $WF_6/SiH_2/Cl_2=3.6$ sccm/100 scam, a temperature of 595° C., and 133 Pa, then an impurity introduction polysilicon film 433 is deposited by the CVD process to a thickness of about several tens of nanometers to a hundred odd nanometers to fill the bit line use groove BLC. Note that, in order to secure the close adhesion with the silicon oxide of the underlaying layer before the formation of the tungsten silicide film, it is possible to form a thin polysilicon film to a thickness of about several tens of nanometers. Next, the resist R2 is formed and patterned to the pattern for forming the preparatory contact hole in the conductive material in the bit line use groove BLC.

Figure 40:
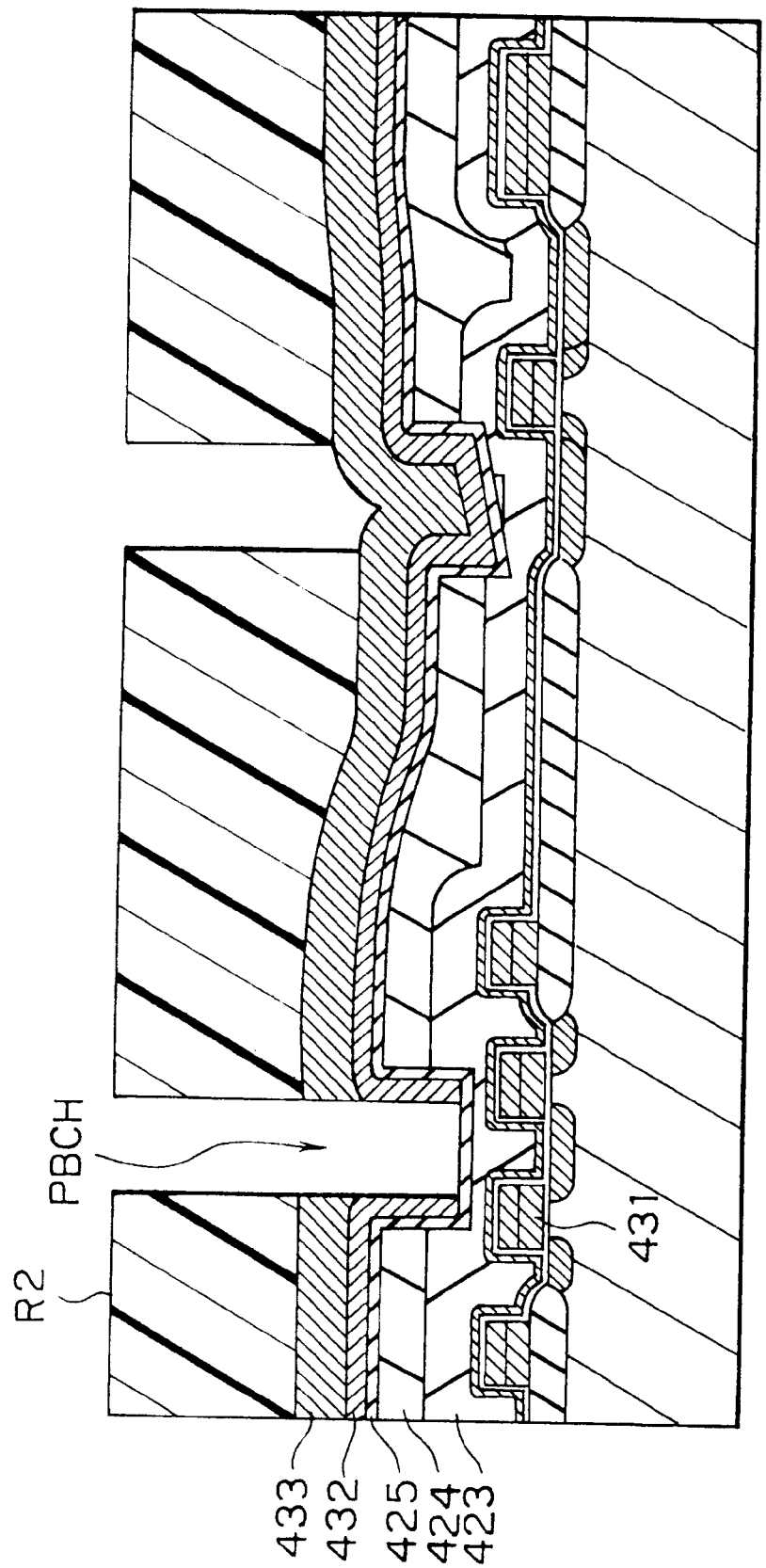

Next, as shown in FIG. 40, by successively performing the anisotropic etching of the polysilicon film 433 and the tungsten silicide film 434 by using the resist R2 as a mask, the preparatory contact hole PBCH is formed in the conductive material in the bit line use groove BLC.

Figure 41:
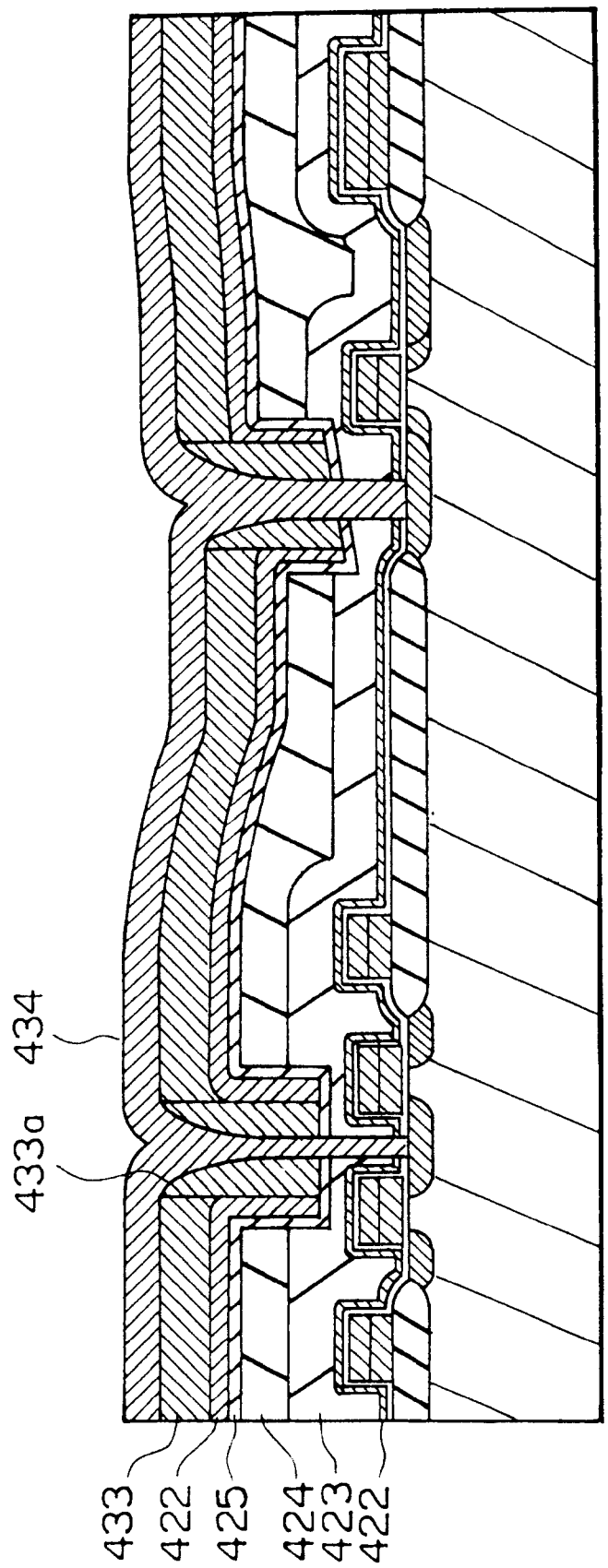

Next, as shown in FIG. 41, the resist R2 is removed, then an impurity introduction polysilicon film is deposited to a thickness of several hundreds of nanometers, then is etched back to form a side wall 433a constituted by polysilicon on the side wall of the preparatory hole PBCH. Next, the silicon nitride film 425, the silicon oxide film 423, and the silicon nitride film 422 are successively etched by using the polysilicon film 433 and the side wall 433a as a mask to form a bit contact hole reaching the substrate. This bit contact hole has been shrunken since the side wall 433a is used as a mask. An impurity introduction polysilicon film 434 is deposited by the CVD process to fill the bit contact hole by the polysilicon 434.

Figure 42:
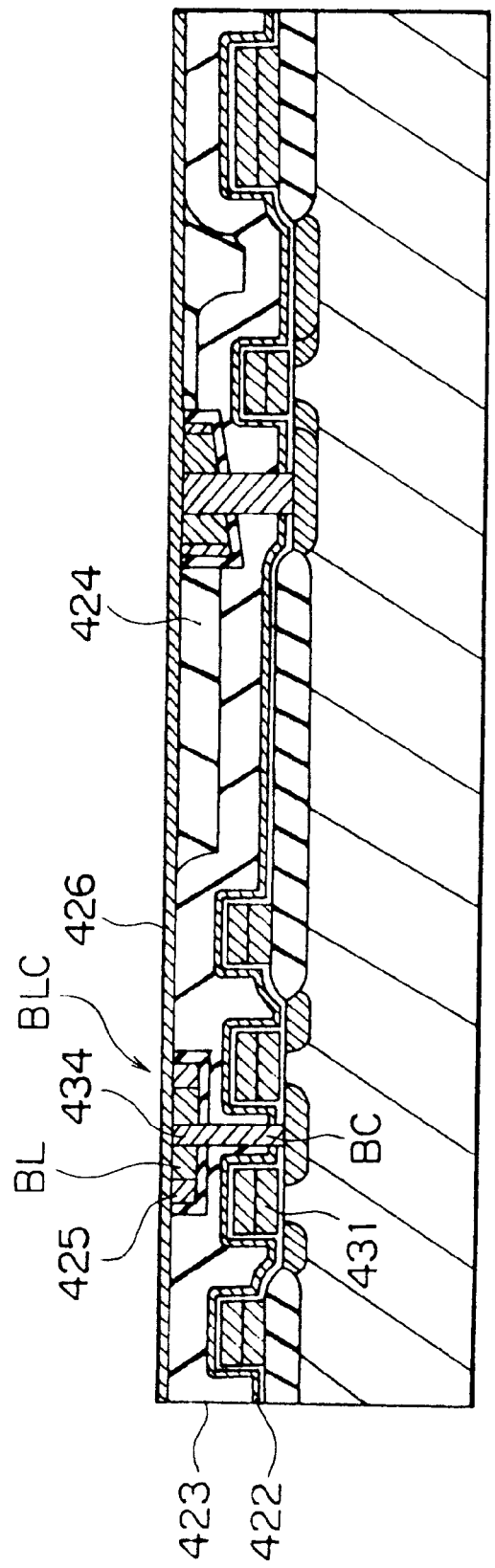

Next, as shown in FIG. 42, the polysilicon films 434 and 433, the side wall 433a, and the tungsten silicide layer 432 are successively removed by etching or polished by the CMP process, then the inter-layer insulating films 425 and 424 are successively polished by the CMP process and flattened. By this, a bit line BL filling the bit line use groove BLC is formed. In this way, in the present embodiment, a process is adopted performing the formation and flattening of the bit line BL together, therefore the process has been shortened from the related art. At this time, simultaneously, a polyplug 434 of the bit line contact BC penetrating through the bit line BL is formed. Next, a silicon nitride film 426 for burying the etching stopper and bit line at the time of formation of the node electrode is deposited by the CVD process to a thickness of several tens of nanometers.

Figure 43:
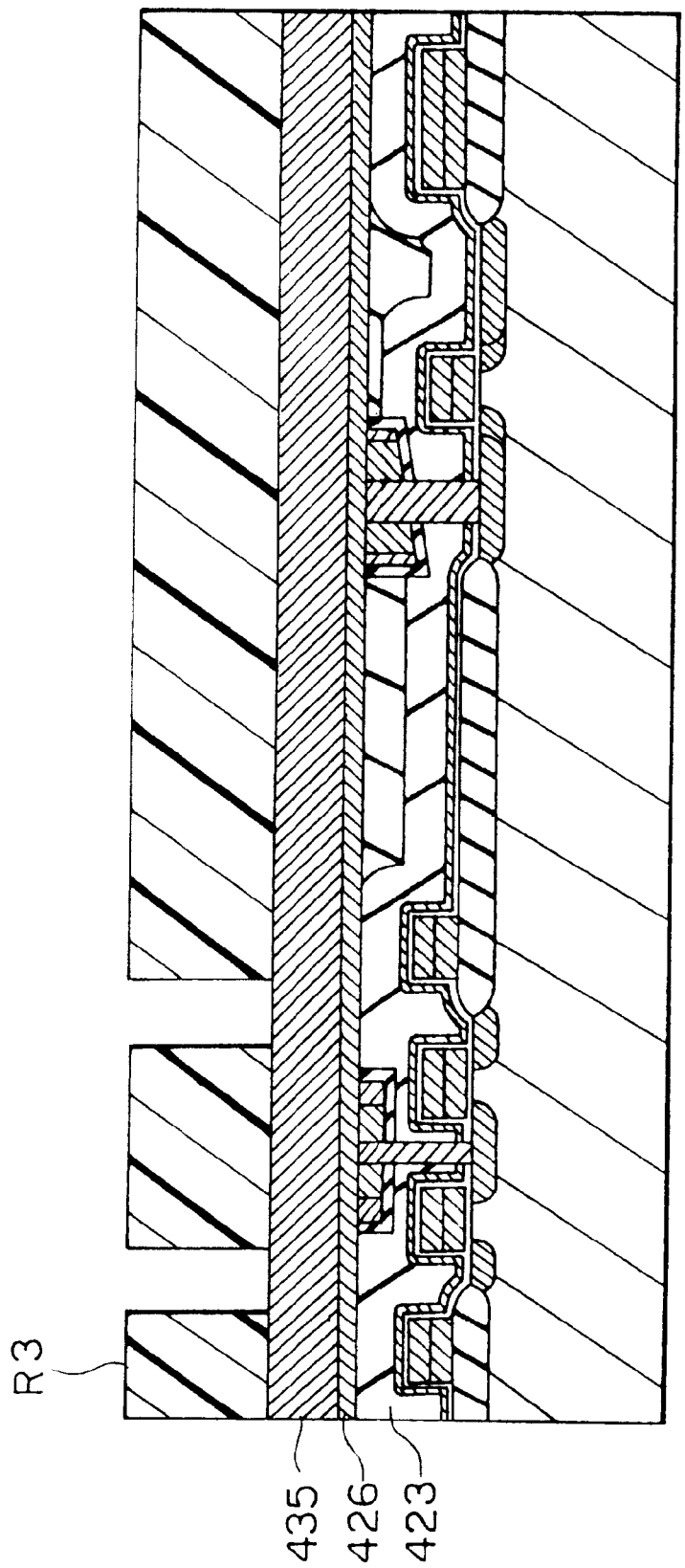

Next, the process of formation of the node contact connecting the capacitor and substrate is entered. As shown in FIG. 43, an impurity introduction polysilicon film is deposited by the CVD process to a thickness of several hundreds of nanometers to pattern the resist R3 for the node contact.

Figure 44:
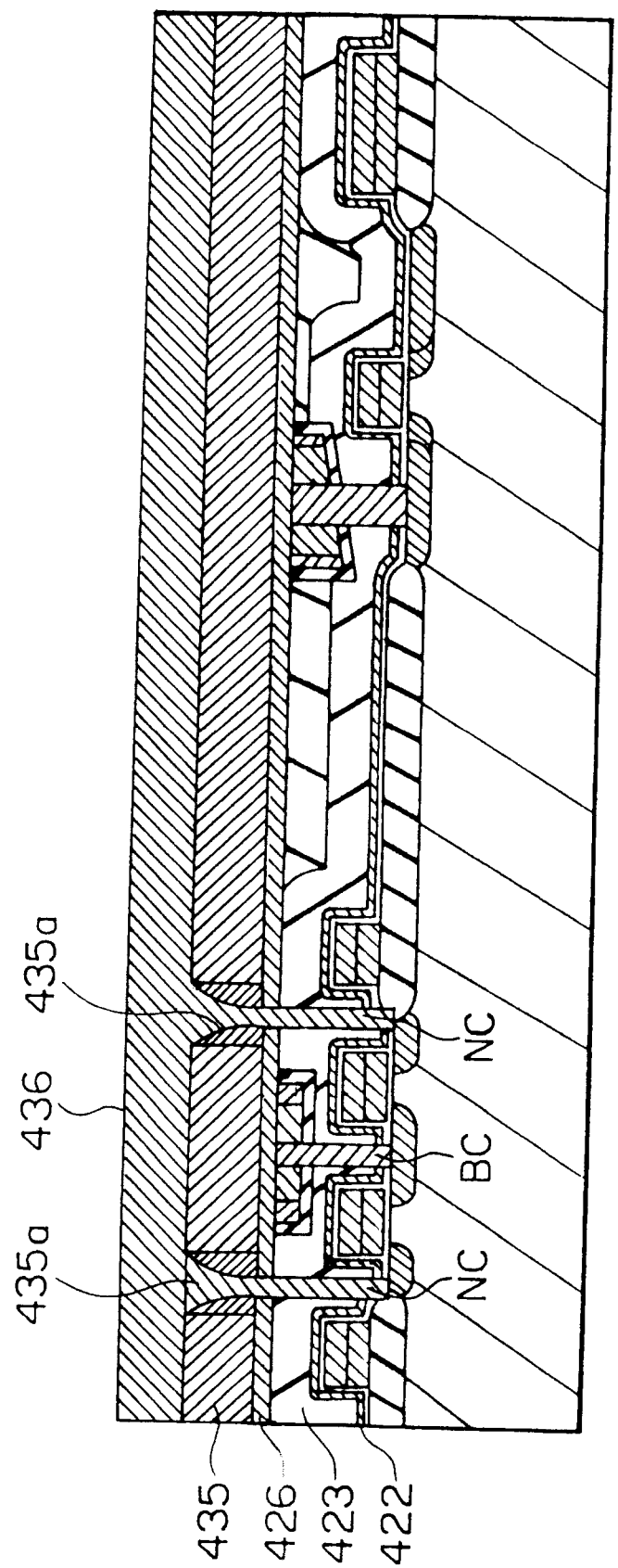

Next, as shown in FIG. 44, a preparatory contact hole is formed in the polysilicon film by anisotropic etching by using the resist R3 as a mask, the resist R3 is removed, then an impurity introduction polysilicon film is formed by the CVD process and is etched back to form a side wall 435a on the side wall of the preparatory contact hole of the polysilicon film 435. Then, the silicon nitride film 426, the NSG film 423, and the silicon nitride film 422 are successively etched by using the side wall 435a and the polysilicon film 435 as a mask to form a shrunken node contact hole reaching the substrate. Next, an impurity introduction polysilicon film 436 is deposited by CVD to fill the node contact hole.

Figure 45:
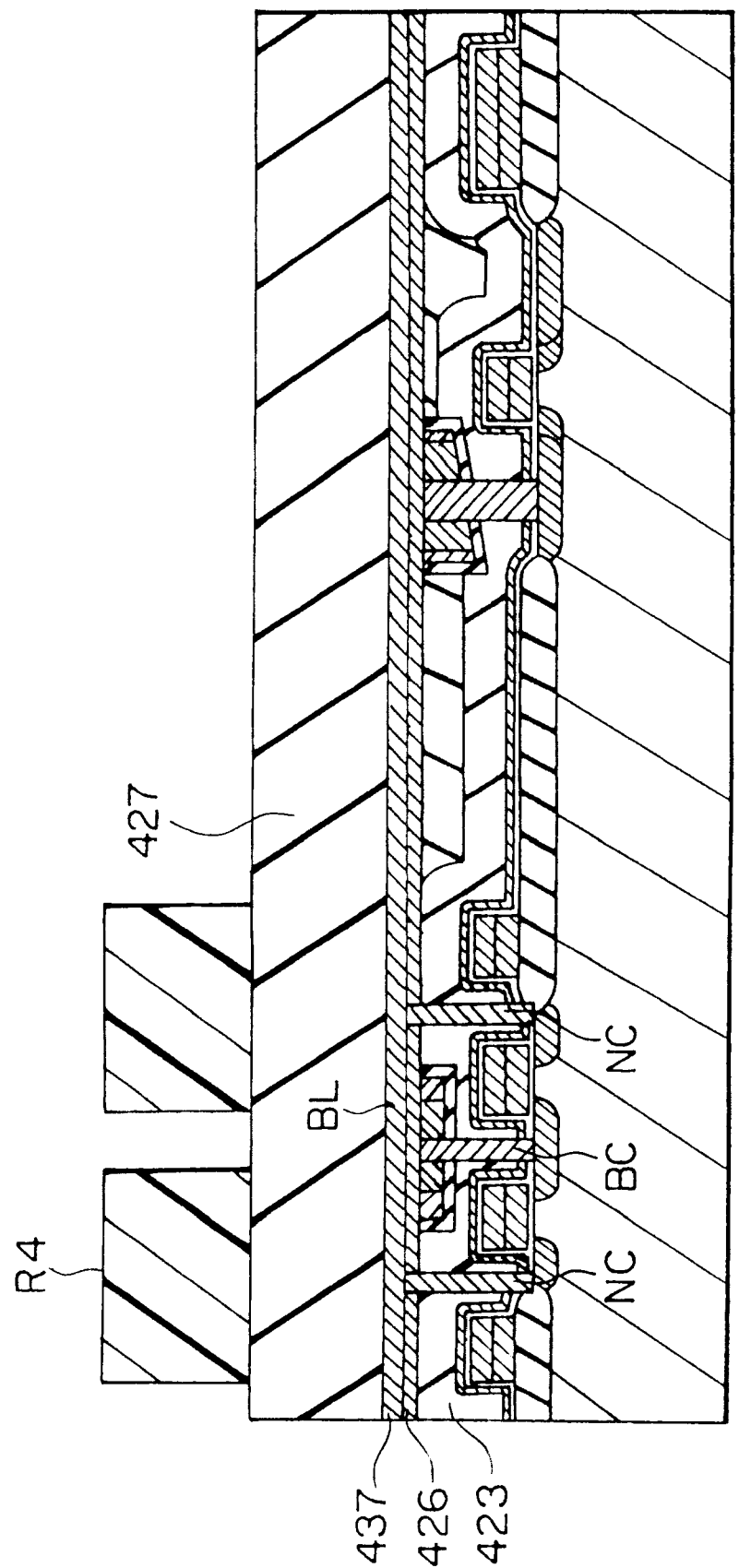

Next, as shown in FIG. 45, the polysilicon films 436 and 435 and the side wall are removed by etching to form the polyplug of the node contact NC. Next, the process for forming the capacitor is entered. An impurity introduction polysilicon film 437 for the node electrode is deposited to a thickness of several hundreds of nanometers by the CVD process. On this, a silicon oxide film 427 for forming a cylinder type capacitor is deposited thickly by the CVD process and the resist R4 is formed and patterned to the pattern for the bottom wall electrode of the capacitor.

Figure 46:
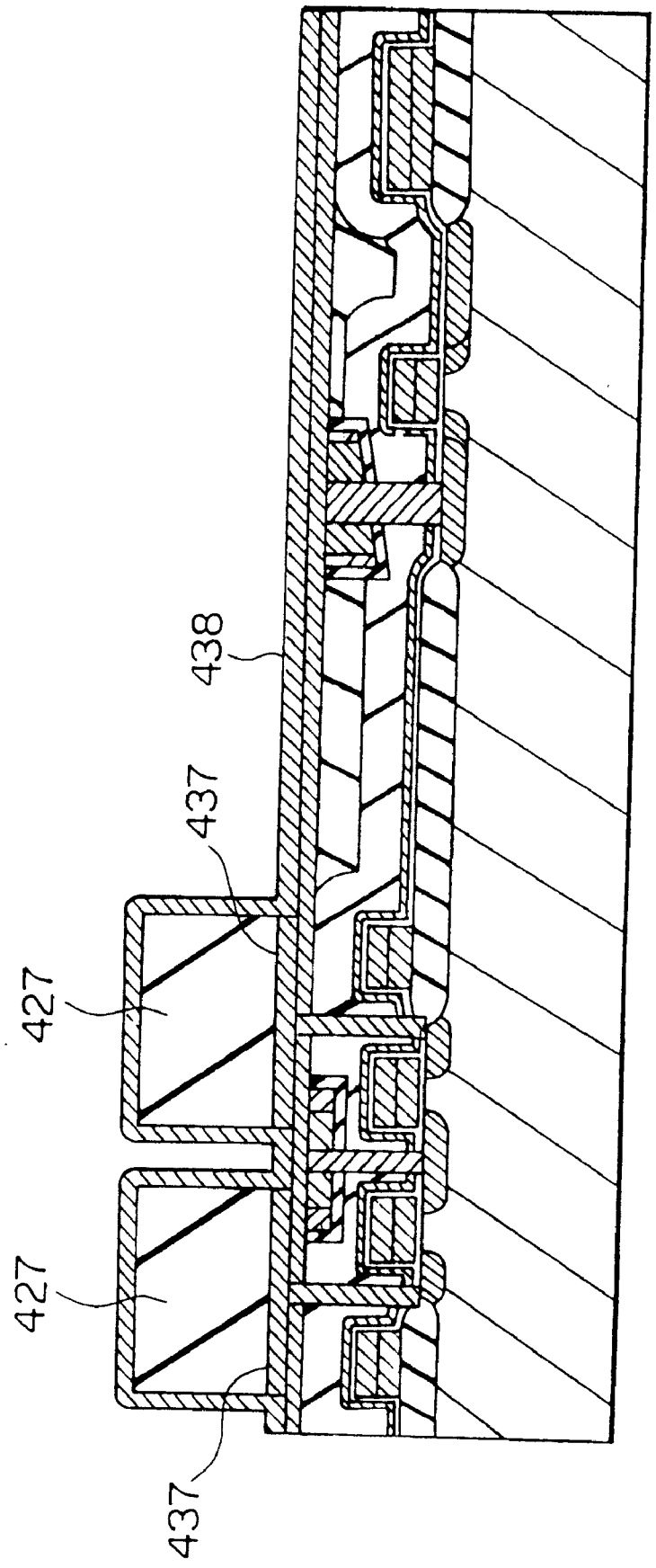

Next, as shown in FIG. 46, anisotropic etching is carried out by using the resist film R4 as a mask to pattern the silicon oxide film 427 and the polysilicon film 437, then the resist film R4 is removed. Next, a polysilicon film 438 is deposited.

Figure 47:
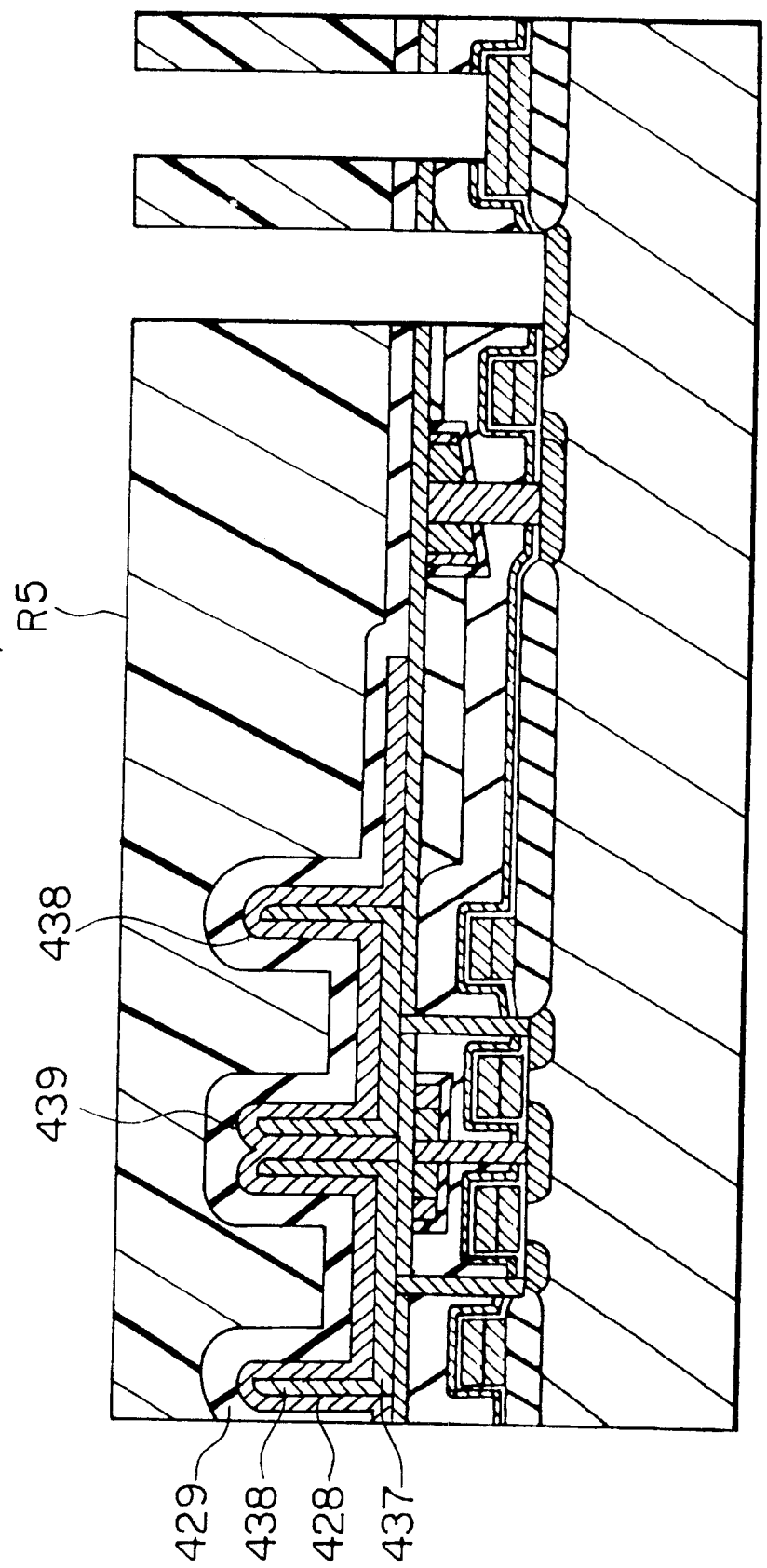

Next, as shown in FIG. 47, the polysilicon film 438 is etched back to form a side wall 438 constituted by polysilicon at the side portion of the silicon oxide film 427 to form a side wall on which a cylinder type storage node is provided. The silicon oxide film 427 is removed by wet etching to form the cylinder type node electrode. Next, rapid thermal annealing (RTA) is performed on the surface of the storage nodes 437 and 438 in an ammonia atmosphere, a silicon nitride film is formed by CVD, then the silicon nitride film is for example thermally oxidized to form a dielectric film (ONO film) 428. The dielectric film 428 covers the storage nodes 437 and 438. Next, a polysilicon film 439 serving as a plate electrode is deposited by the CVD process to a thickness of about several hundreds of nanometers, then it is subjected to resist patterning to the pattern of the plate electrode, anisotropic etching is carried out by using the resist as a mask, and a plate electrode 439 is formed. Next, a silicon oxide film 429 is deposited for protection of the plate electrode by the CVD process. Next, the resist R5 is formed and patterned by the contact opening pattern (sometimes in the form of a groove) of the peripheral circuit portion and anisotropic etching is carried out by using this as a mask to open the contact hole.

Figure 48:
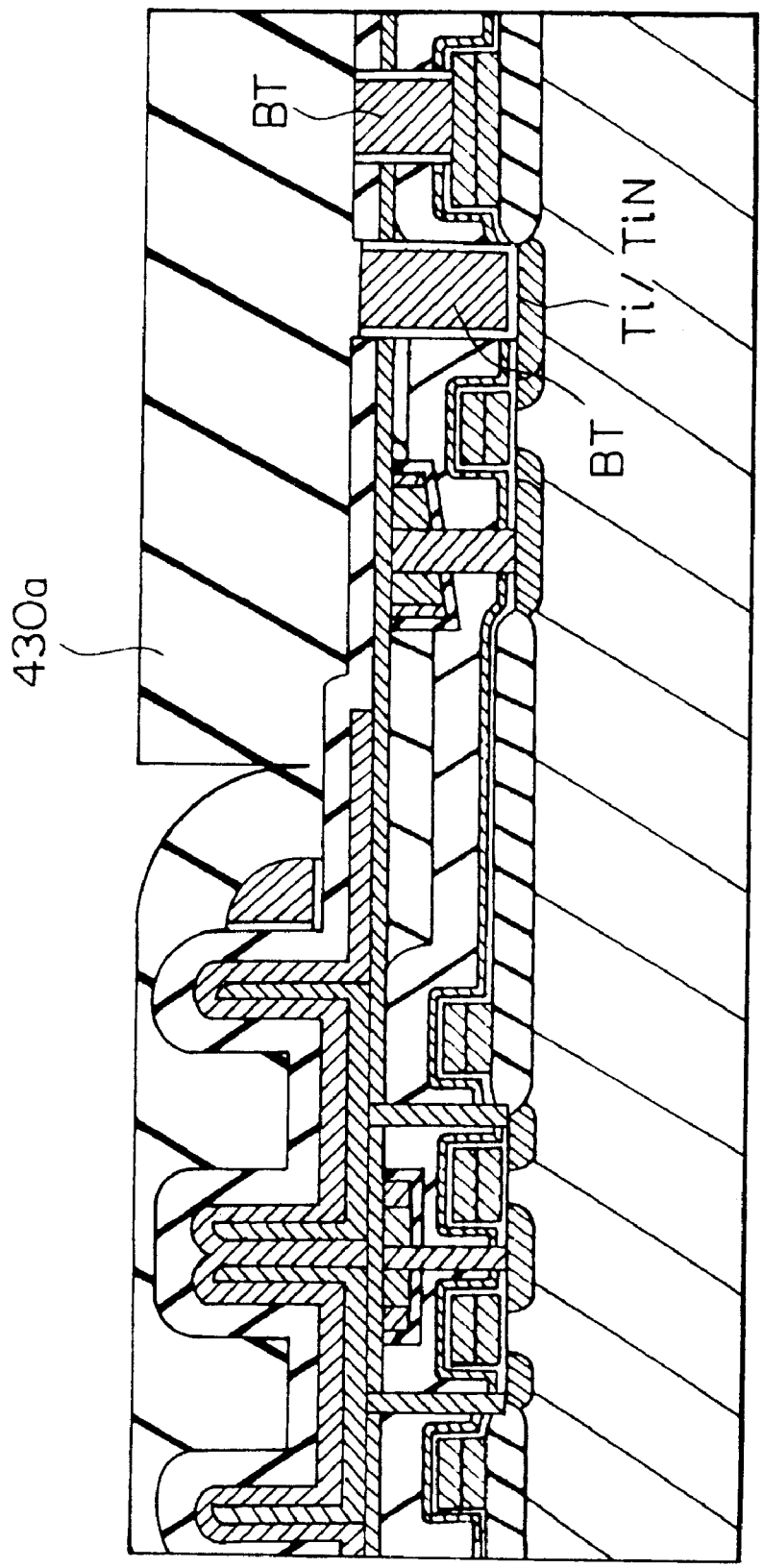

Next, as shown in FIG. 48, the resist is removed, then a Ti/TiN film serving as a close adhesion layer is formed by covering the inner wall of the contact hole. Next, tungsten is deposited to a thickness of several hundreds of nanometers and then etched back to form blanket tungsten BT and form a tungsten plug for the middle takeout. Next, a silicon oxide film 430a is deposited to a thickness of about several hundreds of nanometers.

Figure 49:
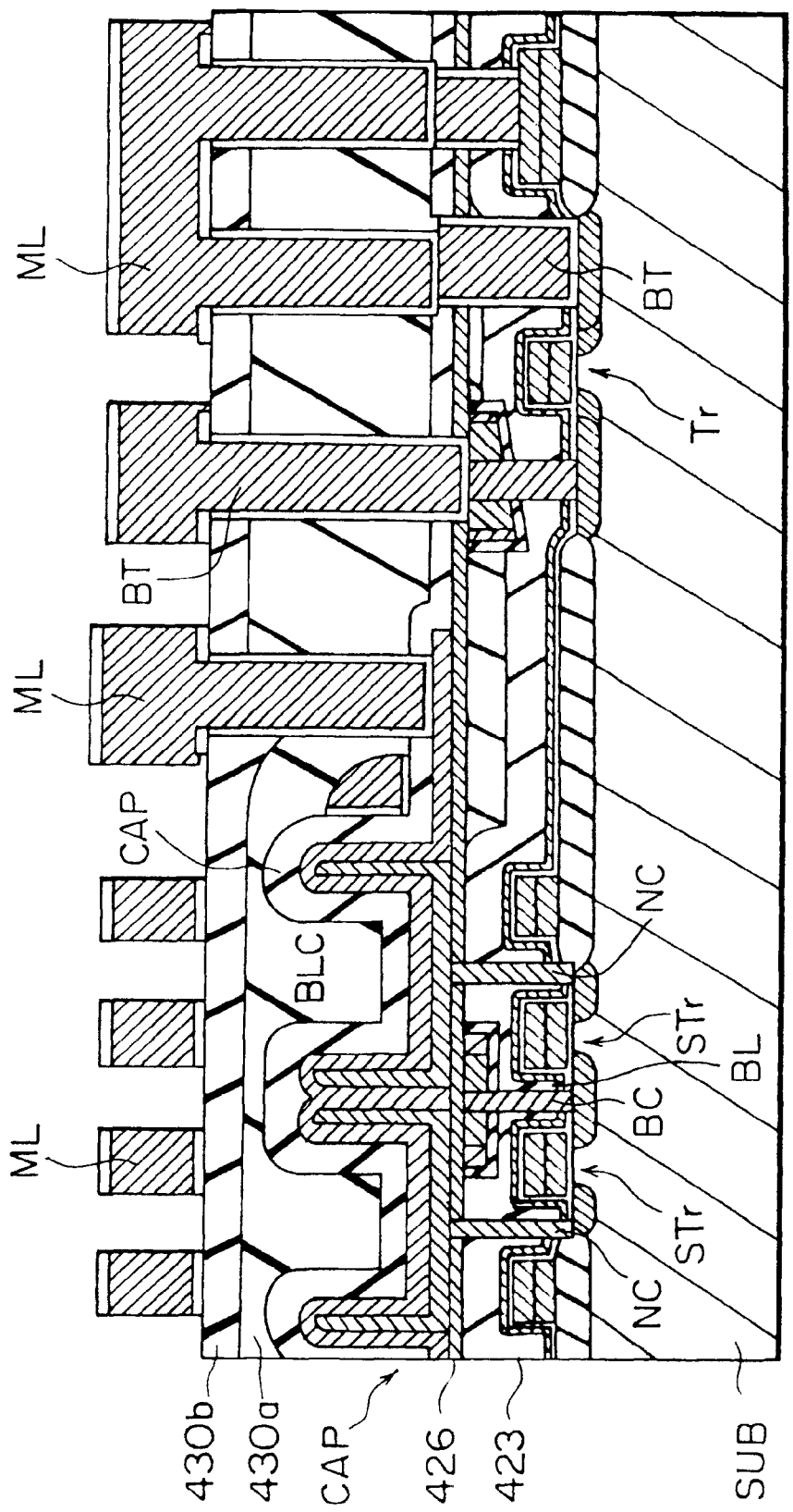

Next, as shown in FIG. 49, a BPSG film 430b is deposited by the CVD process and then flattened. Next, a resist is formed and patterned to a pattern for opening the contact of the peripheral circuit portion, the plate electrode takeout contact, etc., anisotropic etching is performed using the resist as a mask to open contact holes in the inter-layer insulating films 430a and 430b, then the resist film is removed. The tungsten is deposited to a thickness of about several hundreds of nanometers by the CVD process to fill the contact hole, then is etched back to form a tungsten plug BT. Next, a metal such as aluminum is formed into a film by sputtering etc., a resist is formed and patterned by the wiring pattern, and anisotropic etching is carried out by using the resist as a mask to form a metal wiring layer ML and thus complete the COB type DRAM.

The COB type DRAM cell obtained by the above steps is structured with the bit line BL filling the bottom portion of a groove dug in the inter-layer insulating film 423 unlike the structure of the related art in which the bit line is placed on the inter-layer insulating film. For this reason, the height of the inter-layer insulating film on the substrate surface is reduced from that of the COB type DRAM of the related art by an amount of the thickness of the bit line and thickness of inter-layer insulating film for burying the bit line. Specifically, in a COB type DRAM having a cylinder type capacitor, the height up to the upper end of the capacitor is about 1 $\mu$m (1000 nm), but according to the present embodiment, it is possible to reduce the height by about 300 to 400 nm, so it is possible to reduce the height of the DRAM by about 30 to 40 percent. As a result, the thickness of the inter-layer insulating film in the peripheral circuit portion is reduced by an amount of about 300 to 400 nm. By this, the aspect ratio at the time of formation of the contact hole of the peripheral circuit portion is lowered, a reduction of the contact diameter is possible, and it is possible to improve the degree of integration.

Further, since the process for flattening the bit lines and the process for forming the bit lines are performed together, it is possible to shorten the process and lower the cost.

Next, an explanation will be made of a fourth embodiment of the present invention.

In the third embodiment, the bit line use groove was filled by a tungsten silicide film and polysilicon film and the bit line was constituted by two layers, but in the fourth embodiment, the tungsten silicide is formed by reacting polysilicon and tungsten. In the following figures, the same symbols are given to the same members as those of the third embodiment.

Figure 50:
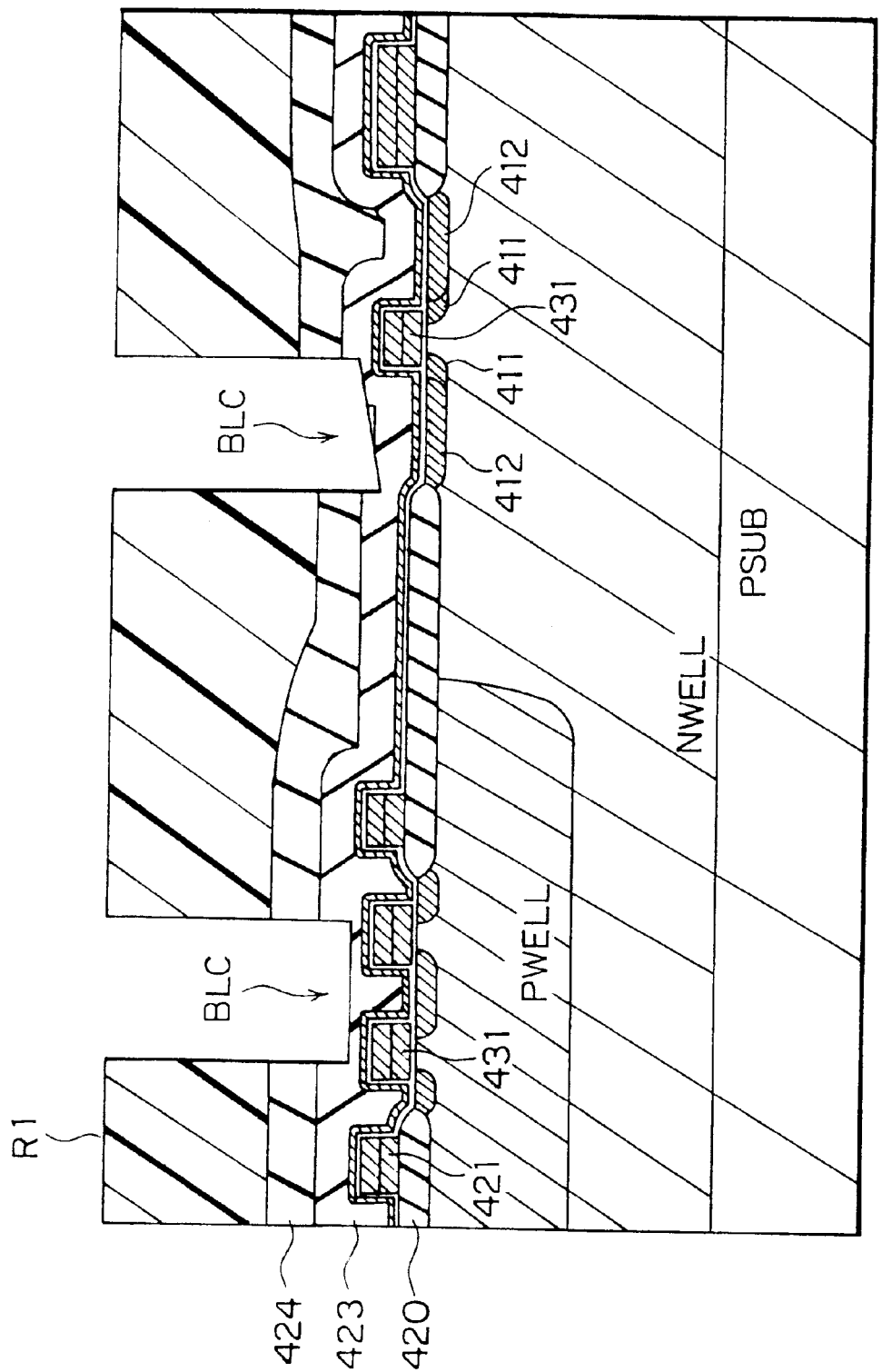

FIG. 50 is the same as FIG. 38 of the embodiment and may be the same up to the step of forming the bit line use groove BLC.

Figure 51:
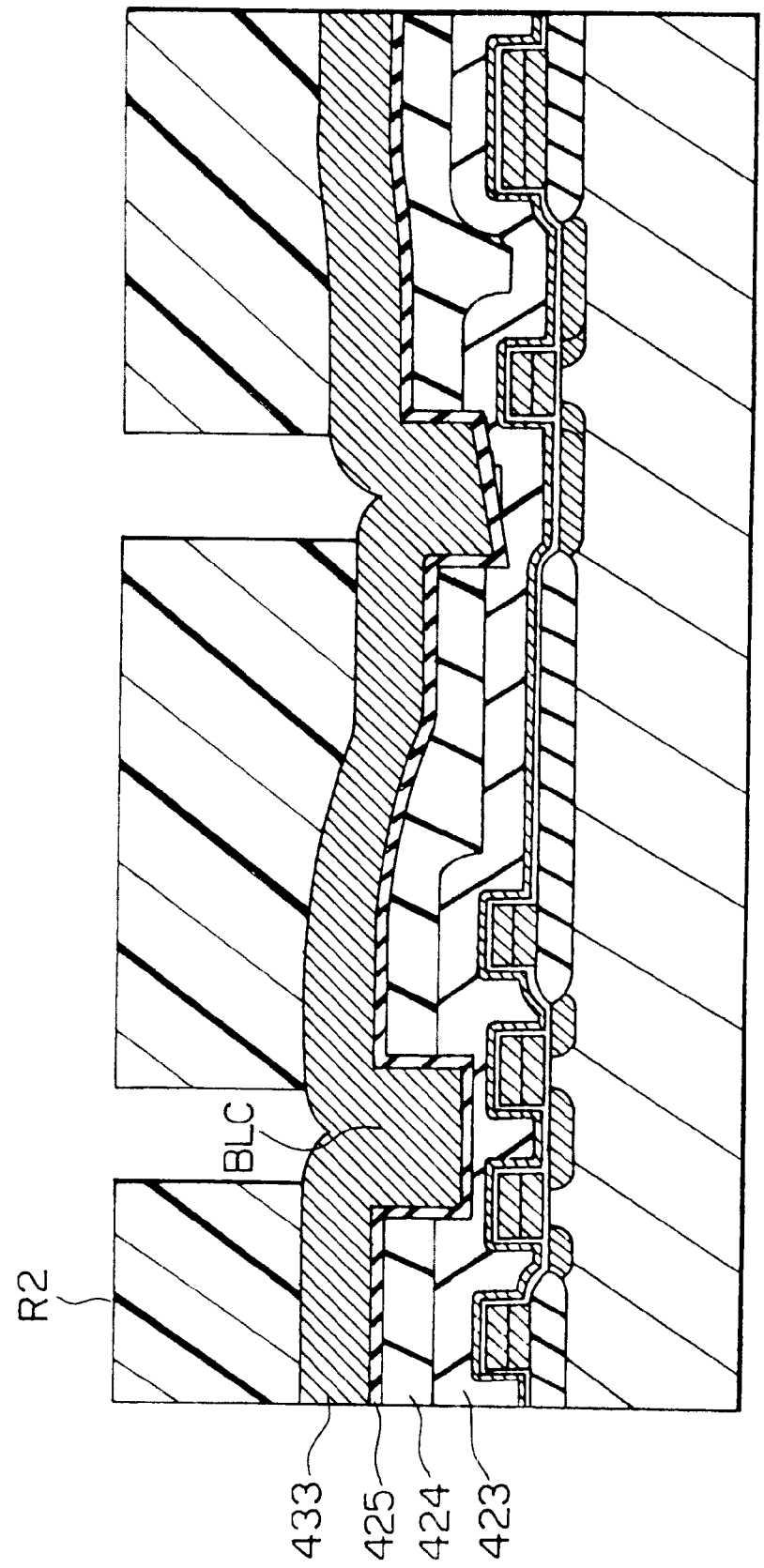

Next, as shown in FIG. 51, the resist film RI is removed, then for example a silicon nitride film (may be silicon oxide) 425 is deposited to a thickness of several tens of nanometers by the CVD process, then an impurity introduction polysilicon film 433 is deposited to a thickness of about several hundreds of nanometers by the CVD process to fill the bit line use groove BLC. Note that, before the formation of the polysilicon film 433, in order to secure the close adhesion with the silicon oxide as the underlaying layer, it is also possible to form a thin polysilicon film to a thickness of about several tens of nanometers. Next, a resist R2 is formed and patterned to a pattern for forming the preparatory contact hole in the polysilicon 433 in the bit line use groove BLC.

Figure 52:
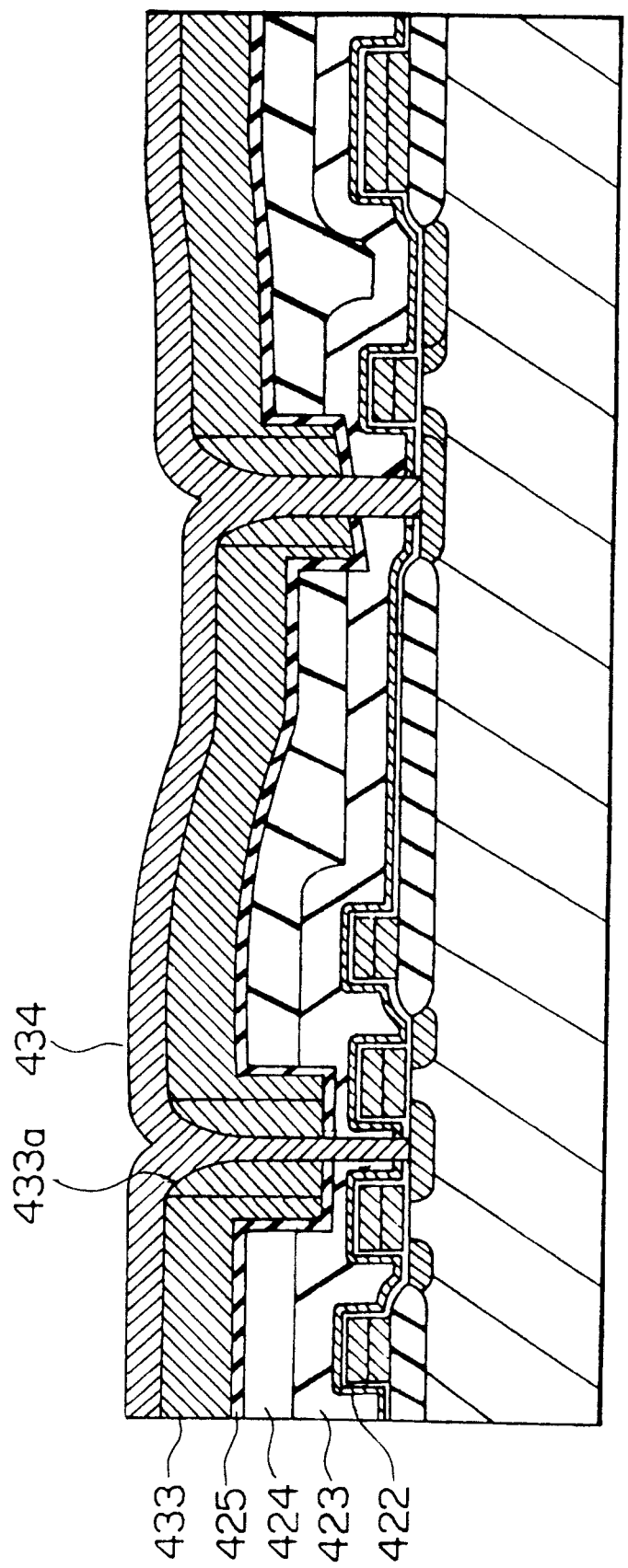

Next, as shown in FIG. 52, the preparatory contact hole is opened in the polysilicon film 433 by using the resist R2 as a mask, then the resist R2 is removed. Next, a polysilicon film is deposited thickly and then etched back to form a side wall 433a constituted by polysilicon on the side wall of the preparatory contact hole. Next, the silicon nitride film 425, the silicon oxide film 423, and the silicon nitride film 422 are successively etched by using the polysilicon film 433 and the side wall 433a as a mask to form the bit contact hole reaching the substrate. This bit contact hole is shrunken since the side wall 433a is used as a mask. The impurity introduction polysilicon film 434 is deposited by the CVD process to fill the bit contact hole by the polysilicon 434.

Figure 53:
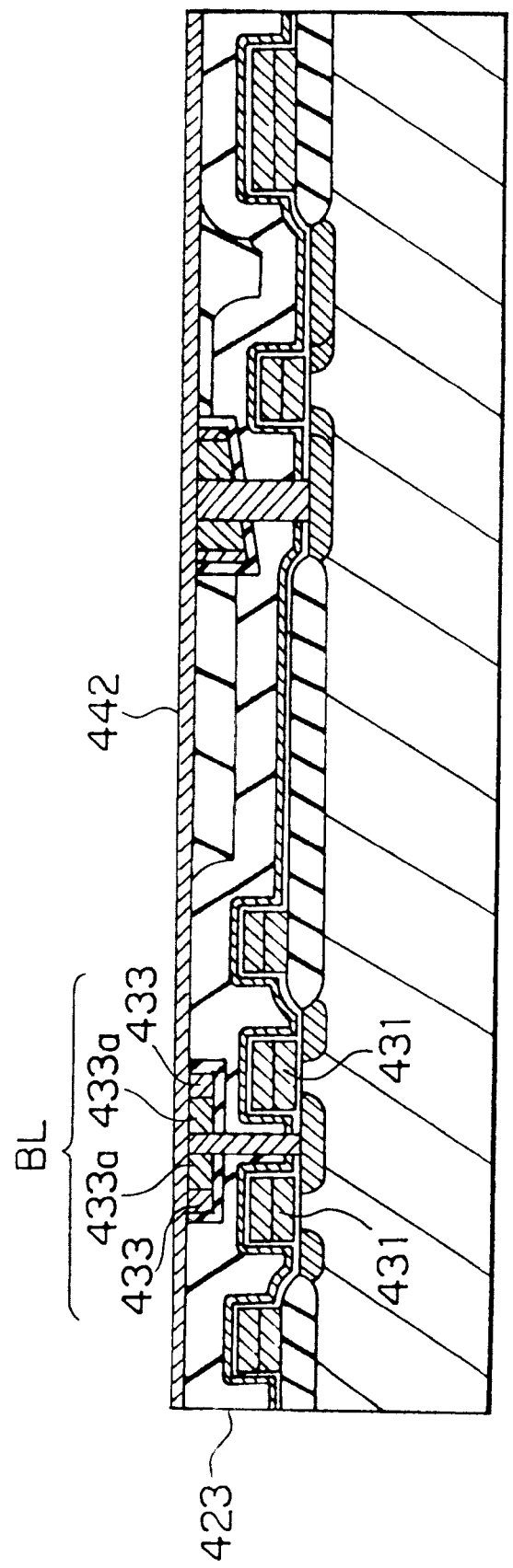

Next, as shown in FIG. 53, the polysilicon films 434 and 433, the side wall 433a, and the tungsten silicide layer 432 are successively removed by etching or polished by the CMP process, then the inter-layer insulating films 425 and 424 are successively polished by the CMP process and flattened. By this, a bit line BL constituted by the polysilicon filling the bit line use groove BLC is formed. Simultaneously, a polyplug of the bit line contact BC penetrating through the bit line BL is formed. Next, a high melting point metal 442, for example, Ti and Co, is deposited to a thickness of several tens of nanometers by sputtering.

Figure 54:
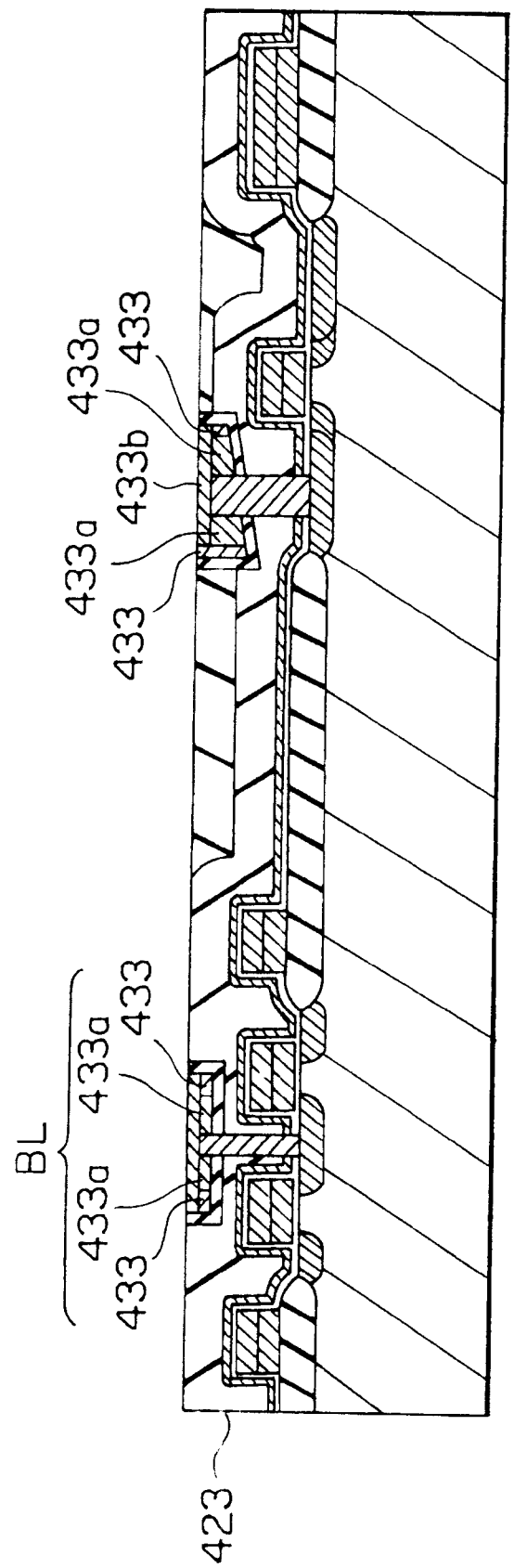

Then, as shown in FIG. 54, heat treatment of 650° C. to 700° C. is applied by the lamp annealing method, for example, to cause the high melting point metal 442 and the polysilicons 433 reacts with 433a to form a high melting point metal silicide film. Next, the unreacted high melting point metal film is etched off by a sulfuric acid-hydrogen peroxide mixture (SPM) leaving the high melting point metal silicide film 433b on the surface of the bit line BL.

Figure 55:
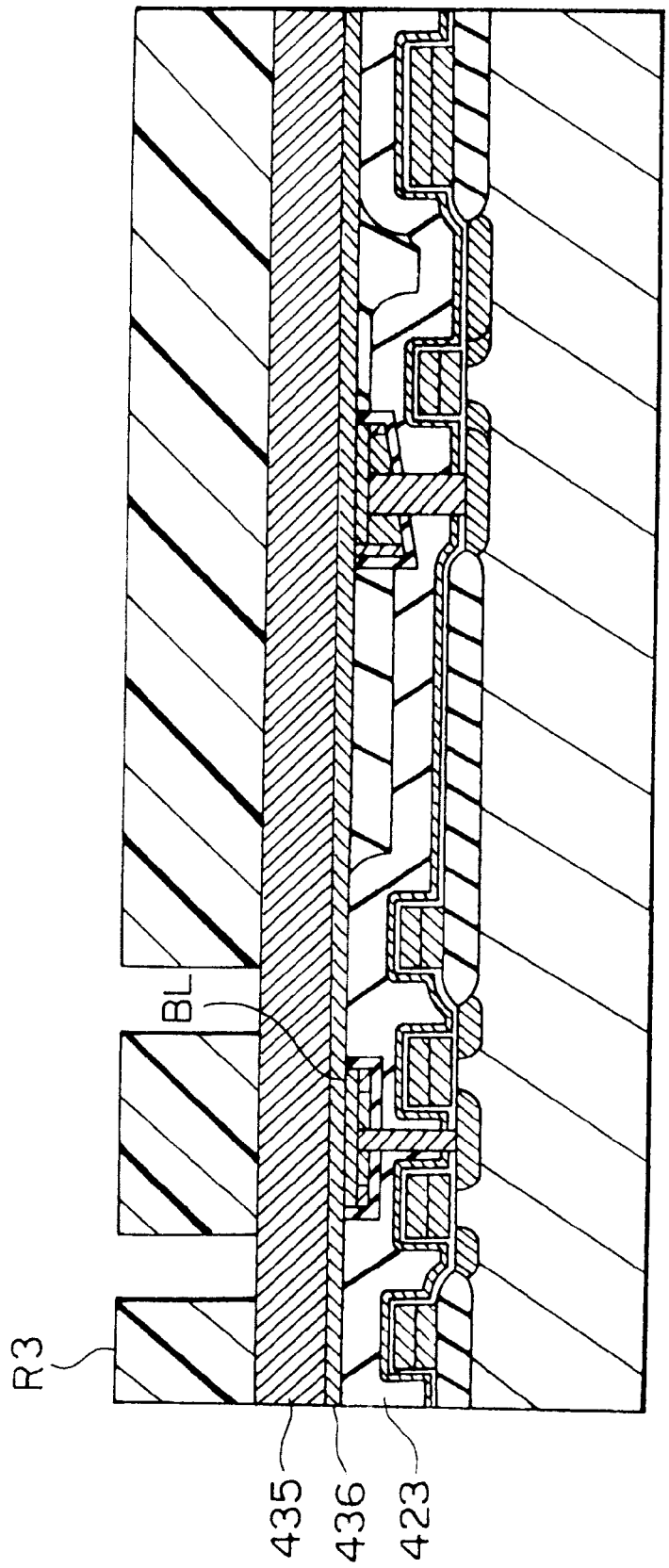
Figure 56:
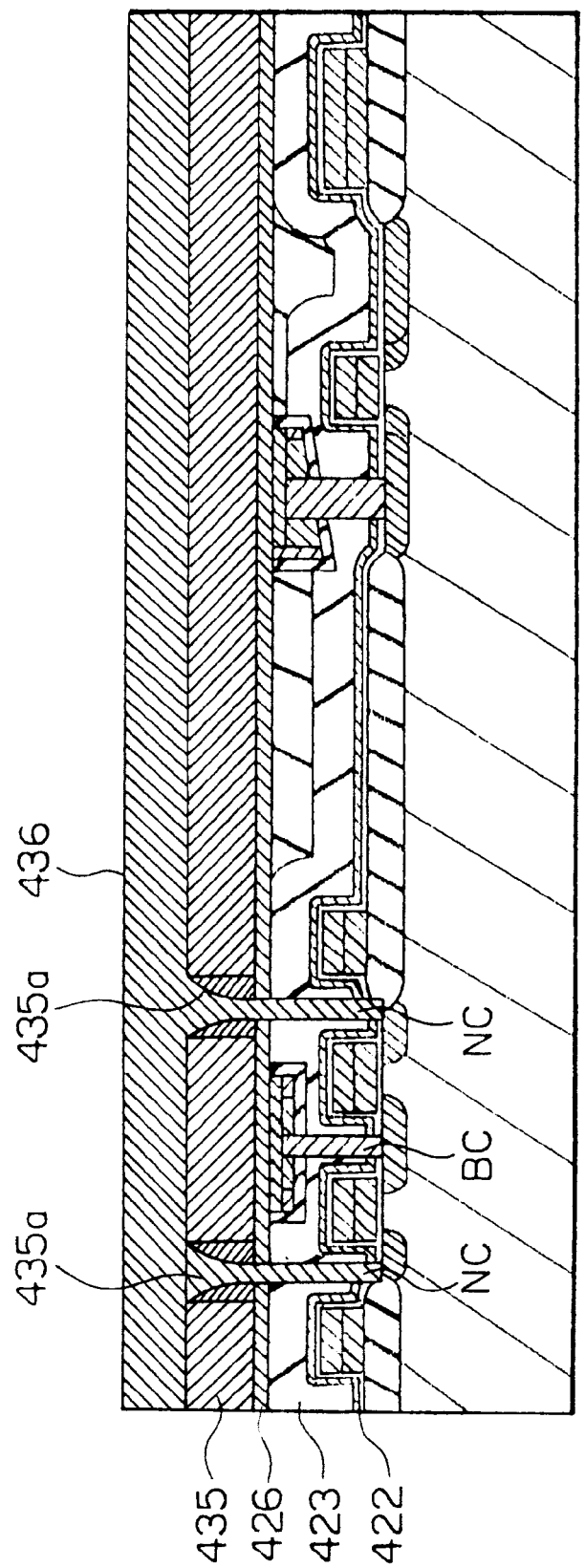

Next, as shown in FIG. 55 and FIG. 56, after forming the node contact and forming capacitor by processes similar to that of the embodiment, a COB type DRAM can be manufactured.

In the above embodiment, the case of application of the present invention to a COB type DRAM was explained, but the present invention can also be applied to for example an SRAM and is not limited to a DRAM. Further, an example in which the burying wiring layer was connected to the substrate was shown, but connection with the intermediate wiring layer is also possible. Further, both of the node contact and the bit line contact are buried by the polysilicon to form polyplugs, but these can also be constituted by a high melting point metal so far as it is durable to the heat at the time of formation of the ONO film of the capacitor. Other than this, for example, the capacitor may be any form. In addition, the device can be modified in a variety of ways within a range not out of the gist of the present invention.

By the semiconductor device of the present invention, the thickness of the inter-layer insulating film is reduced and the aspect ratio of the contact hole can be made smaller.

Further, according to the method of manufacture of the semiconductor device of the present invention, a semiconductor device in which the opening diameter of the contact hole is made smaller and the degree of integration is improved can be obtained.

What is claimed is:

1. A semiconductor device, comprising:

a burying wiring layer for filling a wiring use groove dug in an inter-layer insulating film;

a conductive plug which penetrates through the inter-layer insulating film and connects the burying wiring layer and a connection region beneath the same;

an inter-layer insulating film covering the wiring layer; wherein said conductive plug penetrates through the burying wiring layer.

2. A semiconductor device according to claim 1, wherein said burying wiring layer constitutes a bit line of a dynamic random access memory.

3. A semiconductor device according to claim 2, wherein said burying wiring layer is formed on said inter-layer insulating film directly burying the transistor.

* * * * *